US012218205B2

(12) United States Patent
Sathaiya et al.

(10) Patent No.: US 12,218,205 B2
(45) Date of Patent: *Feb. 4, 2025

(54) 2D-CHANNEL TRANSISTOR STRUCTURE WITH SOURCE-DRAIN ENGINEERING

(71) Applicant: Taiwan Semiconductor Manufacturing Co., Ltd., Hsin-Chu (TW)

(72) Inventors: Dhanyakumar Mahaveer Sathaiya, Hsinchu (TW); Khaderbad Mrunal Abhijith, Hsinchu (TW); Tzer-Min Shen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/354,820

(22) Filed: Jul. 19, 2023

(65) Prior Publication Data

US 2023/0361180 A1 Nov. 9, 2023

Related U.S. Application Data

(63) Continuation of application No. 17/218,212, filed on Mar. 31, 2021, now Pat. No. 11,728,391.
(Continued)

(51) Int. Cl.
*H01L 29/24* (2006.01)
*H01L 29/16* (2006.01)
(Continued)

(52) U.S. Cl.
CPC .......... *H01L 29/24* (2013.01); *H01L 29/1606* (2013.01); *H01L 29/267* (2013.01);
(Continued)

(58) Field of Classification Search
CPC ....... H01L 21/02603; H01L 21/823431; H01L 21/823821; H01L 21/845; H01L 27/0886;
(Continued)

(56) References Cited

U.S. PATENT DOCUMENTS 8,836,016 B2 9/2014 Wu et al.
8,841,701 B2 9/2014 Lin et al.
(Continued)

FOREIGN PATENT DOCUMENTS

CN 106257687 A 12/2016
CN 108933174 A 12/2018
(Continued)

OTHER PUBLICATIONS

Lee, Y.J. [u.a.]: Ge GAA FETs and TMD FinFETs for the Applications Beyond Si—A Review. In: Journal of the Electron Devices Society, vol. 4, Sep. 2016, No. 5, 286-293. Sep. 4, 2016.

*Primary Examiner* — David C Spalla
(74) *Attorney, Agent, or Firm* — HAYNES AND BOONE, LLP

(57) ABSTRACT

Semiconductor devices and methods of forming the same are provided. A method includes providing a workpiece having a semiconductor structure; depositing a two-dimensional (2D) material layer over the semiconductor structure; forming a source feature and a drain feature electrically connected to the semiconductor structure and the 2D material layer, wherein the source feature and drain feature include a semiconductor material; and forming a gate structure over the two-dimensional material layer and interposed between the source feature and the drain feature. The gate structure, the source feature, the drain feature, the semiconductor structure and the 2D material layer are configured to form a field-effect transistor. The semiconductor structure and the 2D material layer function, respectively, as a first
(Continued)

channel and a second channel between the source feature and the drain feature.

20 Claims, 35 Drawing Sheets

Related U.S. Application Data

(60) Provisional application No. 63/062,840, filed on Aug. 7, 2020.

(51) Int. Cl.
*H01L 29/267* (2006.01)
*H01L 29/66* (2006.01)
*H01L 29/78* (2006.01)

(52) U.S. Cl.
CPC .. *H01L 29/66545* (2013.01); *H01L 29/66636* (2013.01); *H01L 29/66795* (2013.01); *H01L 29/7851* (2013.01)

(58) Field of Classification Search
CPC ............ H01L 27/0924; H01L 27/1211; H01L 29/0665; H01L 29/0669; H01L 29/0673; H01L 29/1606; H01L 29/24; H01L 29/267; H01L 29/41791; H01L 29/66439; H01L 29/66545; H01L 29/66636; H01L 29/66795; H01L 29/775; H01L 29/7848; H01L 29/785; H01L 29/7851; H01L 29/7853; H01L 29/7855; H01L 2029/7858
See application file for complete search history.

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 9,653,289 B1* | 5/2017 | Balakrishnan | H01L 21/84 |
| 11,728,391 B2* | 8/2023 | Sathaiya | H01L 29/66545 |
| | | | 257/29 |
| 2015/0303299 A1 | 10/2015 | Chang et al. | |
| 2015/0364592 A1* | 12/2015 | van Dal | H10B 12/36 |
| | | | 257/29 |
| 2016/0372553 A1* | 12/2016 | Xiao | H01L 29/24 |
| 2017/0003248 A1* | 1/2017 | Yang | H01L 29/24 |
| 2017/0005197 A1 | 1/2017 | Xiao | |
| 2018/0175213 A1 | 6/2018 | Colinge et al. | |
| 2018/0301448 A1 | 10/2018 | Rosenblatt et al. | |
| 2019/0019882 A1 | 1/2019 | Lin et al. | |
| 2019/0074381 A1* | 3/2019 | Park | H01L 29/7788 |
| 2019/0378834 A1 | 12/2019 | Penumatcha et al. | |
| 2020/0075593 A1 | 3/2020 | Xiao | |
| 2020/0098643 A1 | 3/2020 | Cheng et al. | |
| 2020/0168728 A1 | 5/2020 | Tsai et al. | |
| 2020/0235098 A1* | 7/2020 | Li | H01L 27/092 |
| 2021/0305372 A1 | 9/2021 | Khaderbad et al. | |
| 2021/0408288 A1* | 12/2021 | O'Brien | H01L 29/778 |

FOREIGN PATENT DOCUMENTS

| | | |
|---|---|---|
| DE | 102017113496 A1 | 6/2018 |
| KR | 20160102972 A | 8/2016 |
| KR | 20190023527 A | 3/2019 |
| KR | 20190101343 A | 8/2019 |
| TW | 201926718 A | 7/2019 |

* cited by examiner

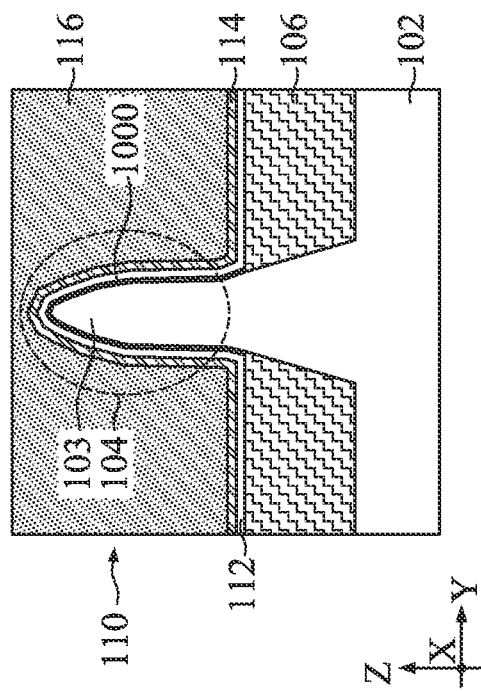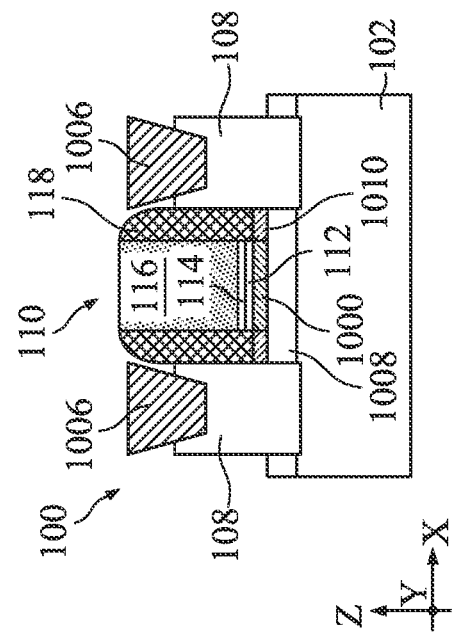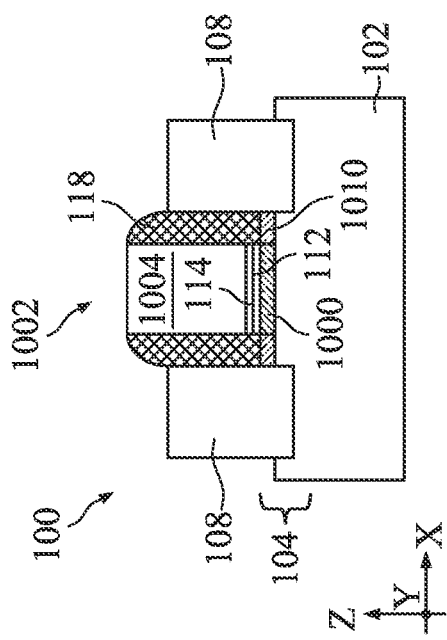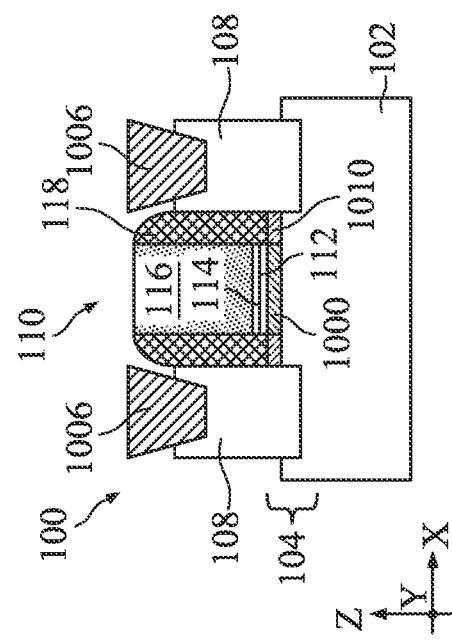
Fig. 3E
Fig. 3F
Fig. 3G
Fig. 3H

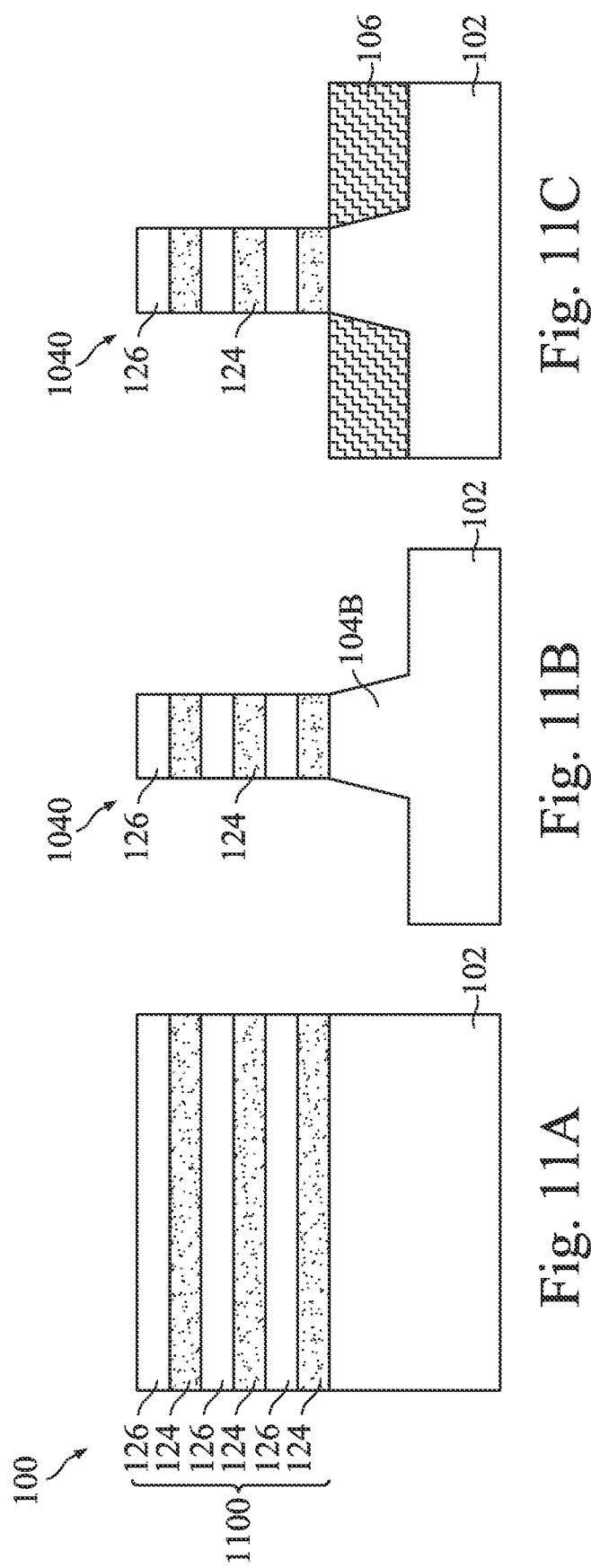

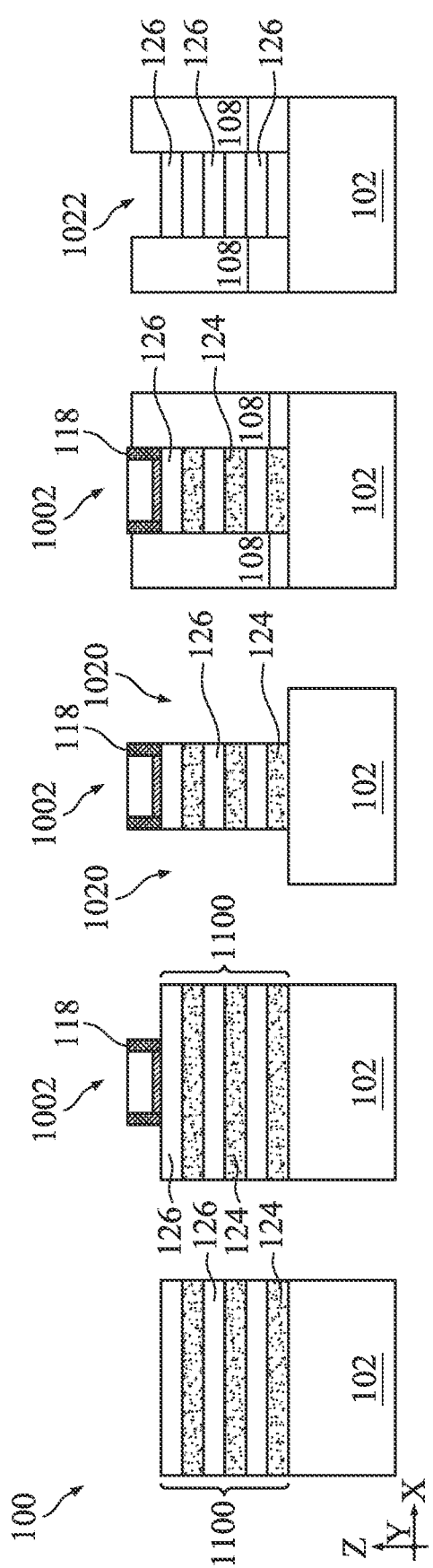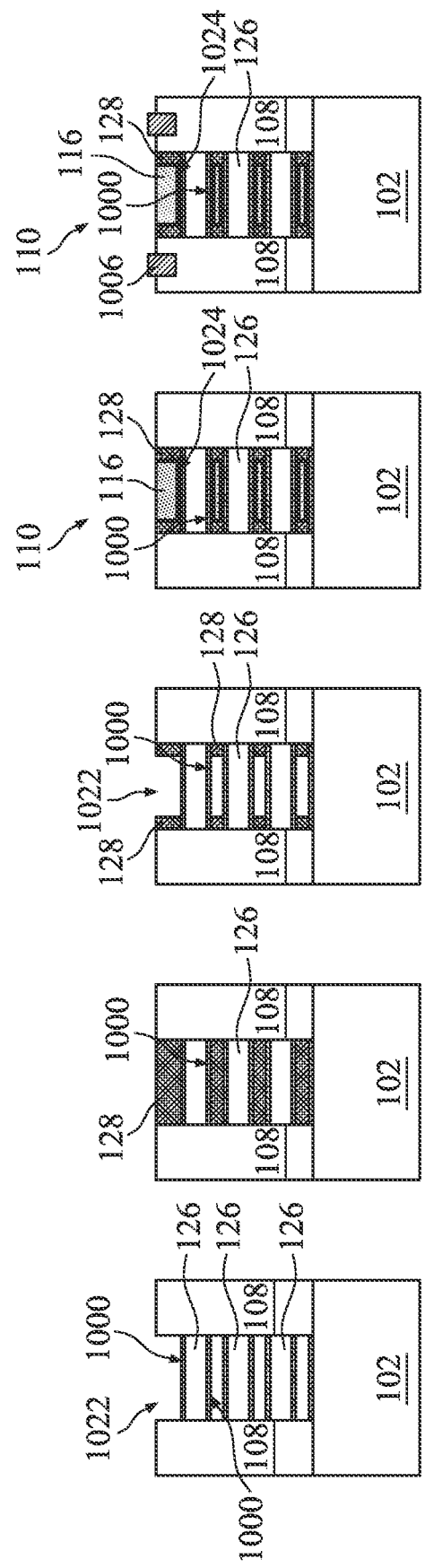

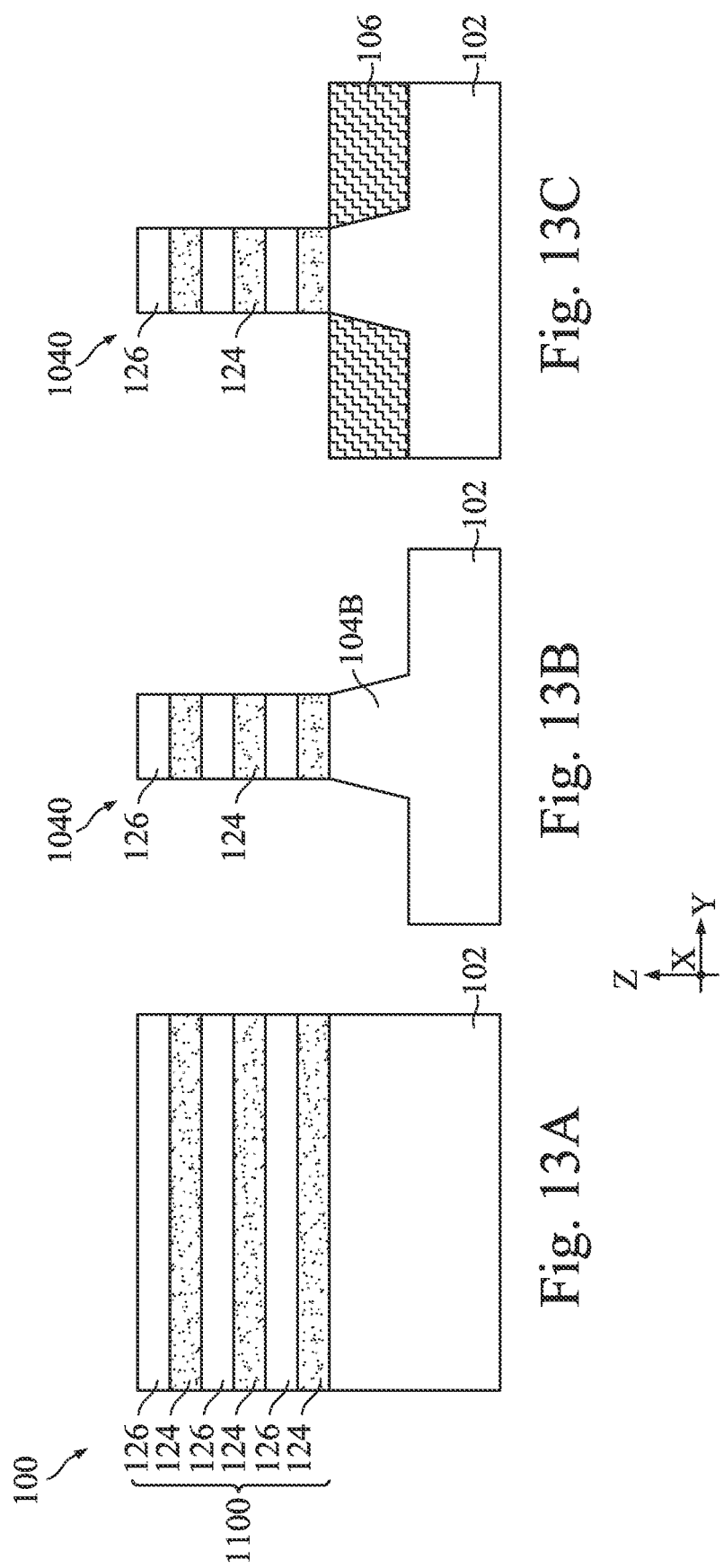

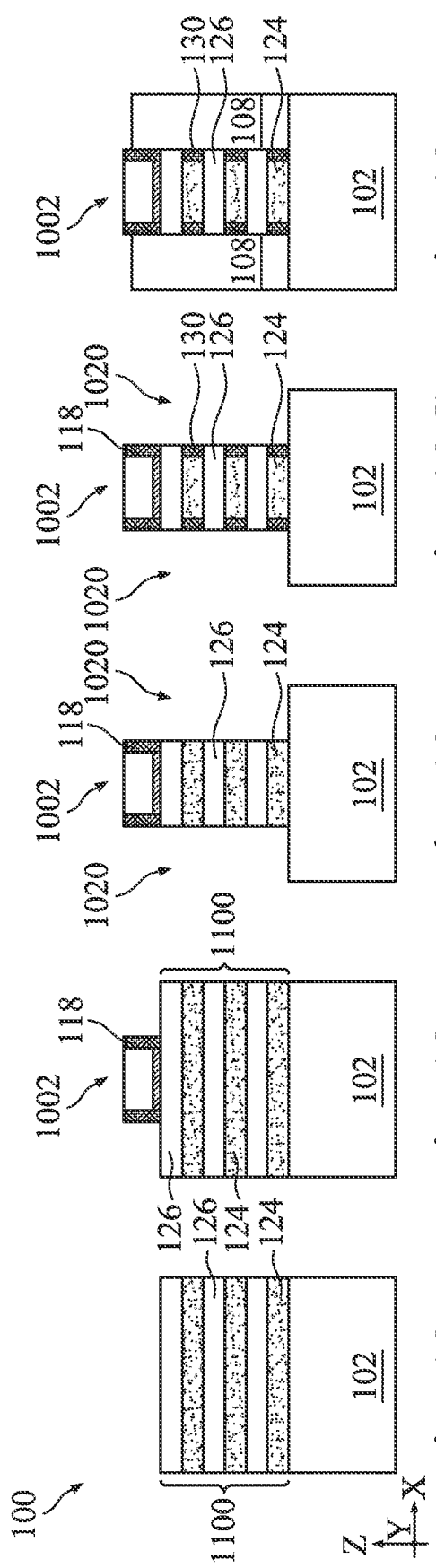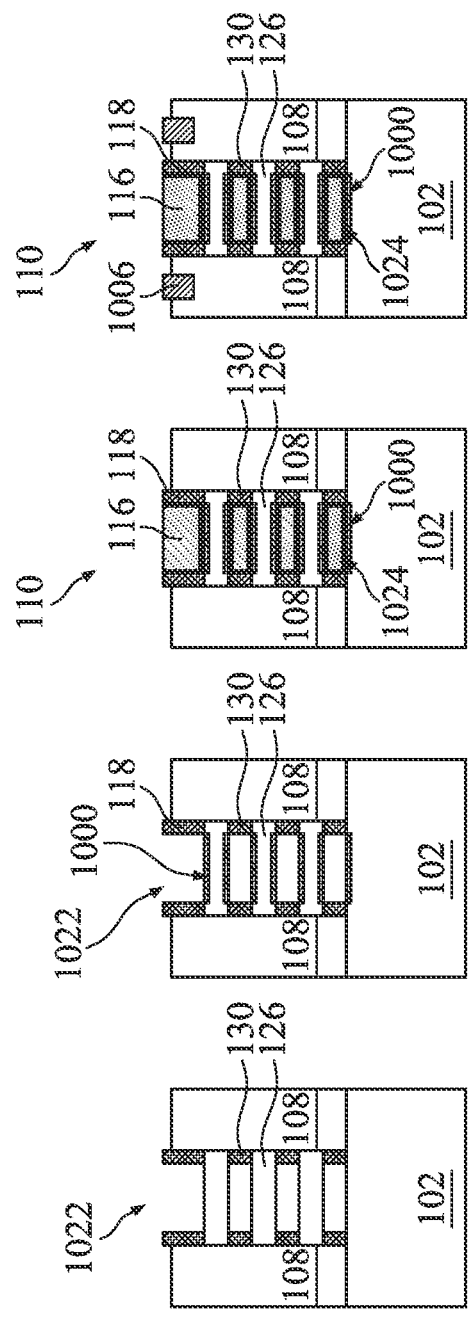

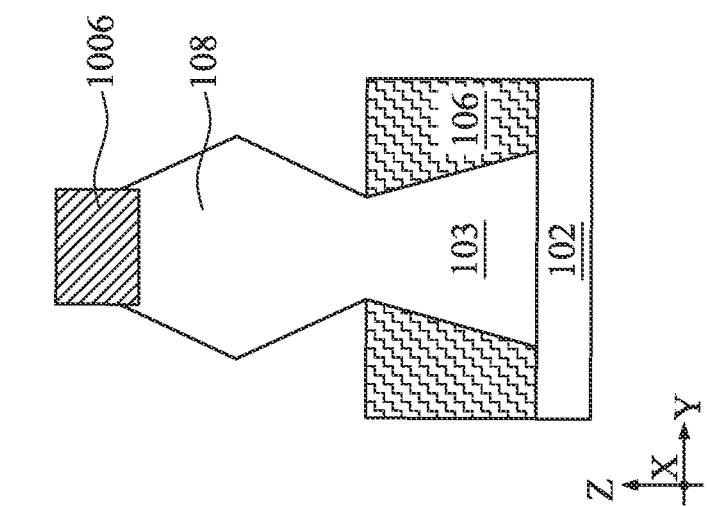
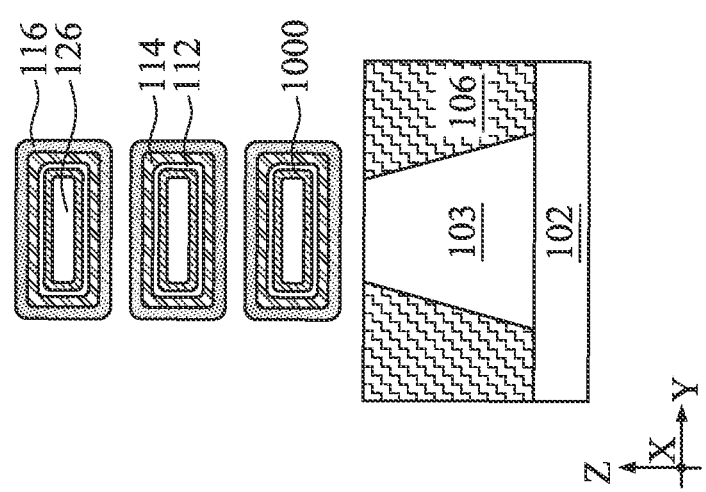
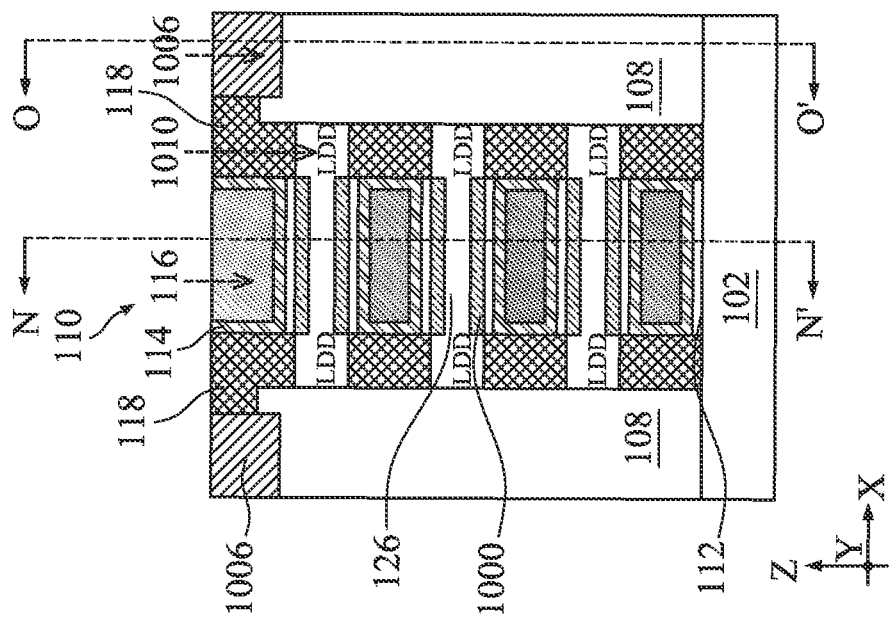
Fig. 13O
Fig. 13N
Fig. 13M

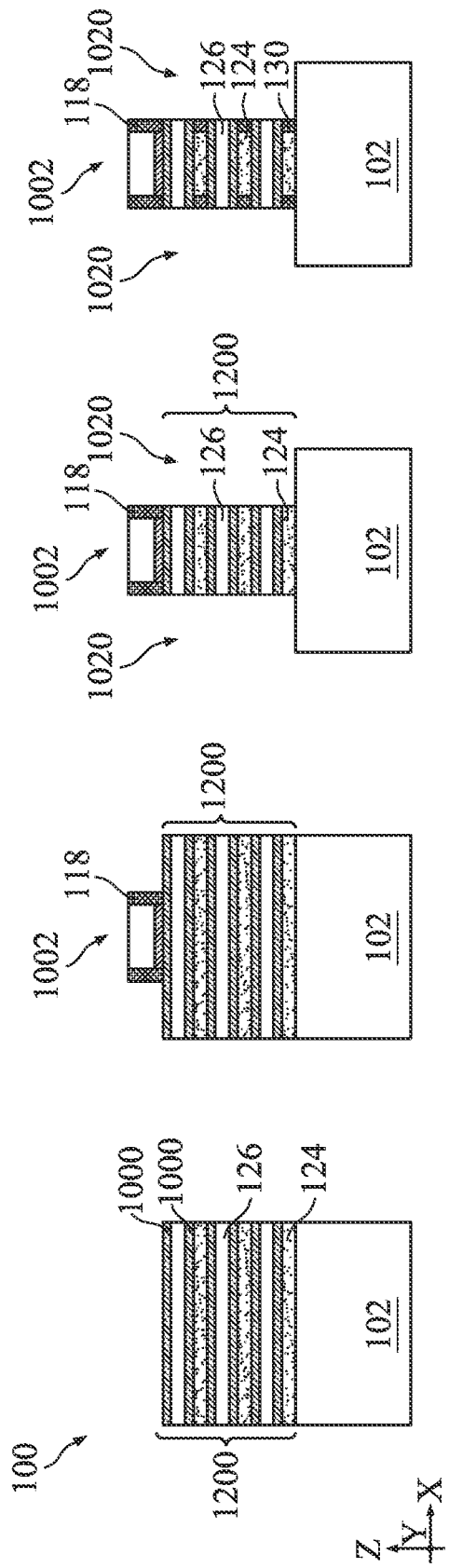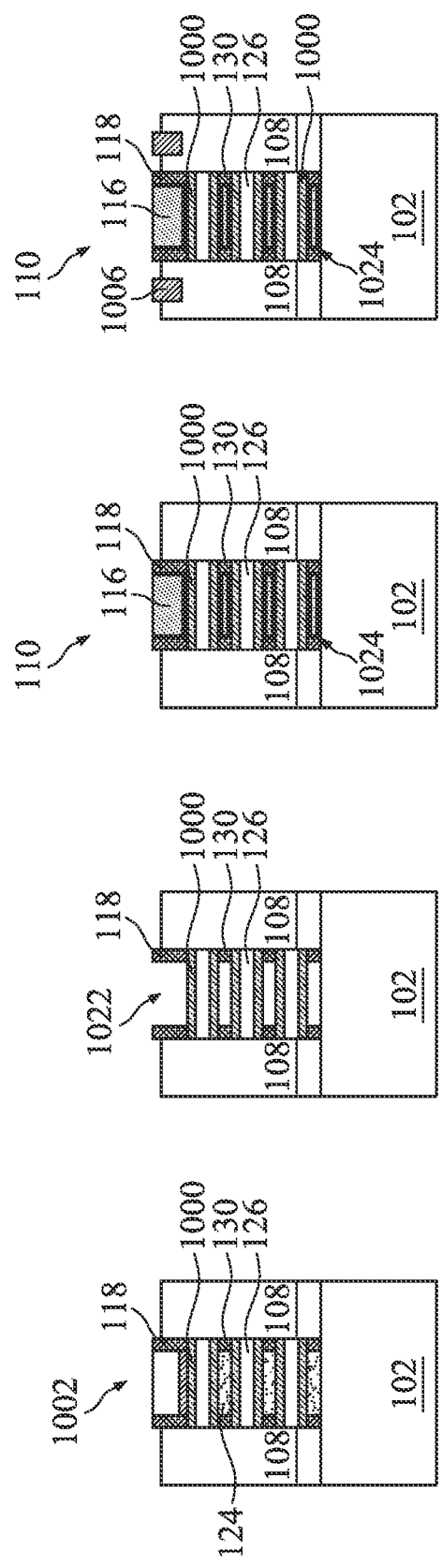

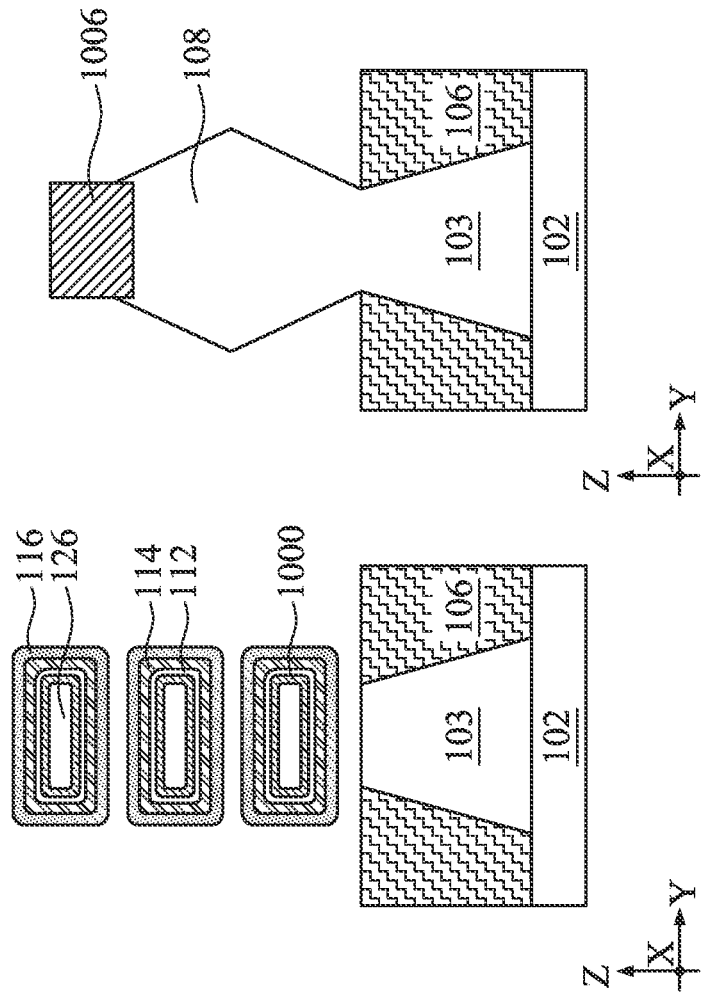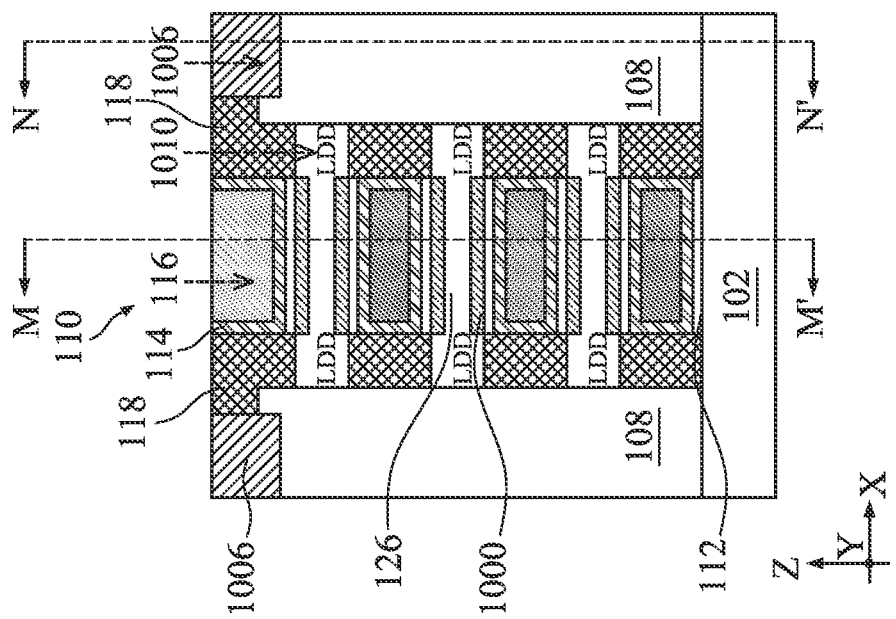
Fig. 15N
Fig. 15M
Fig. 15L

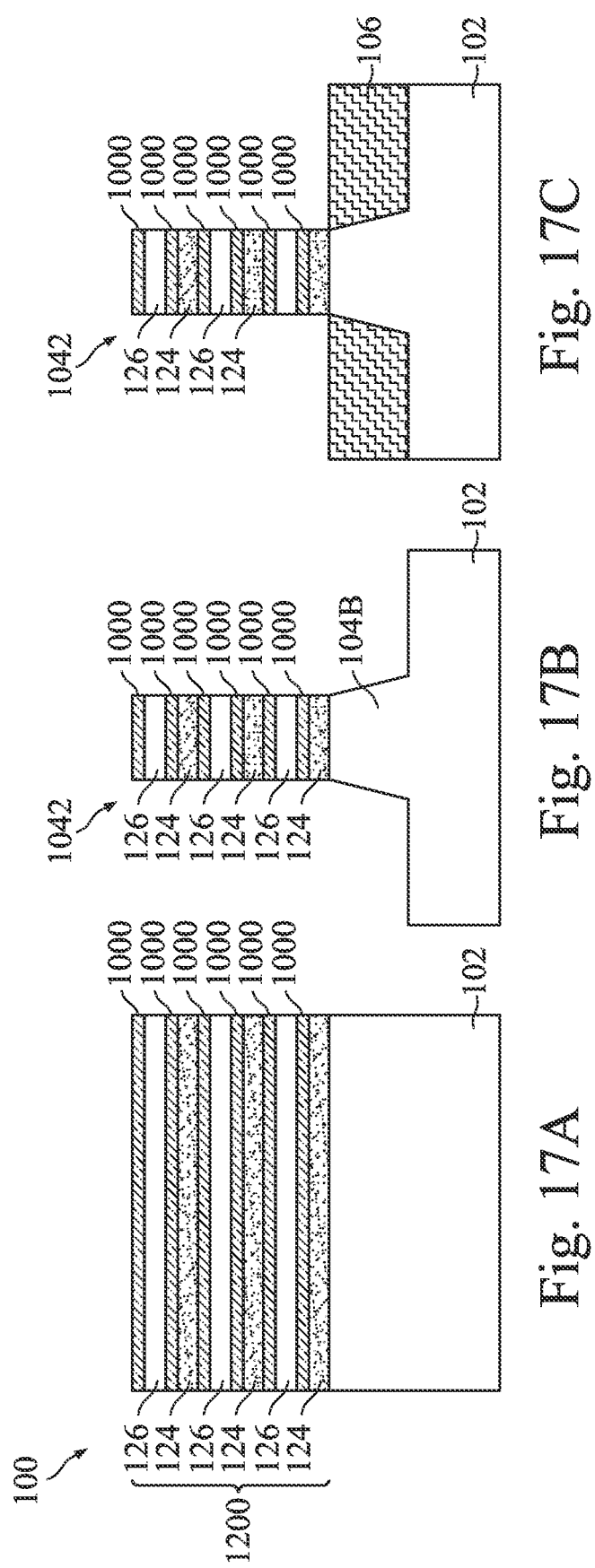

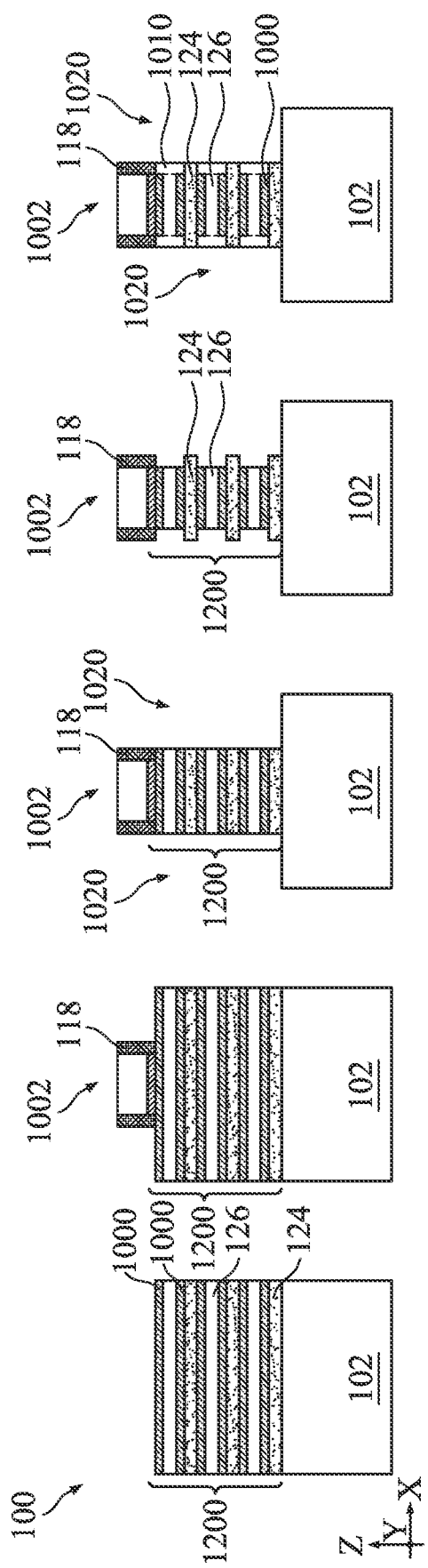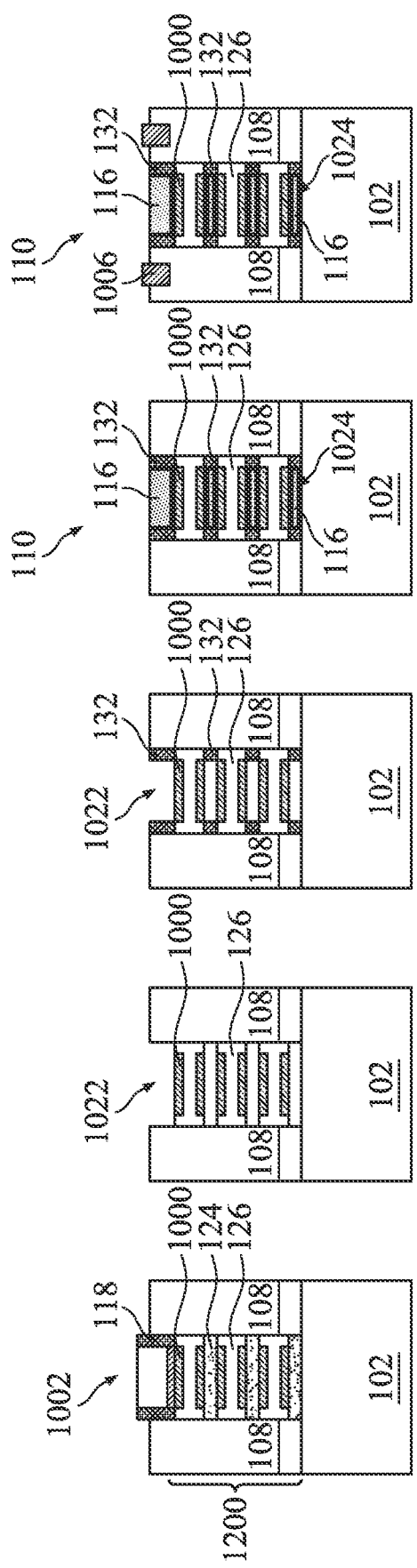

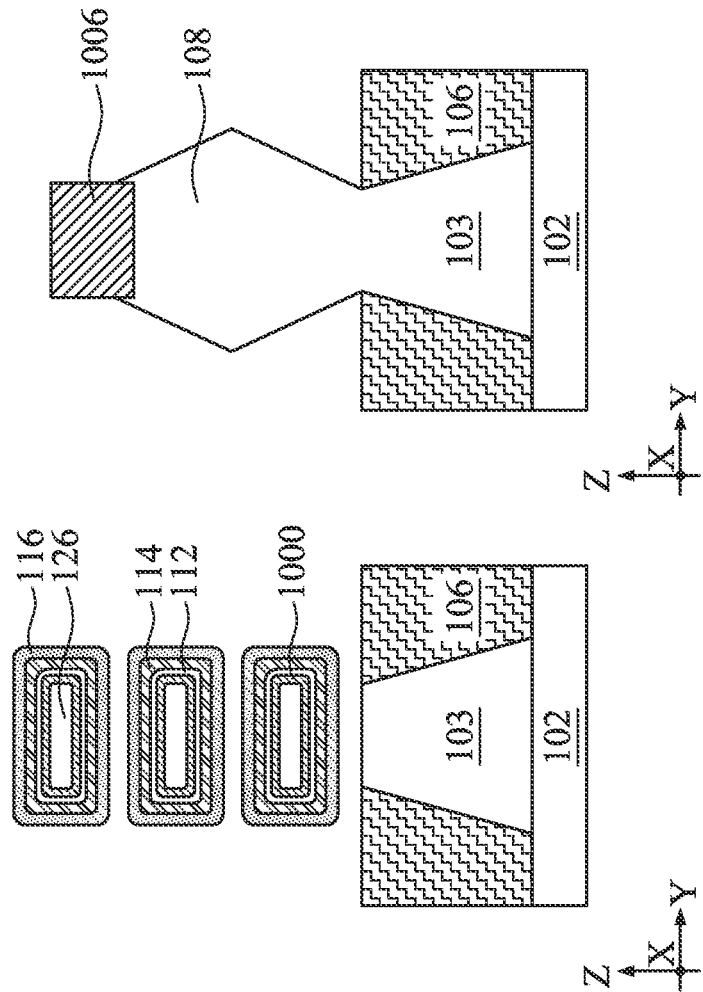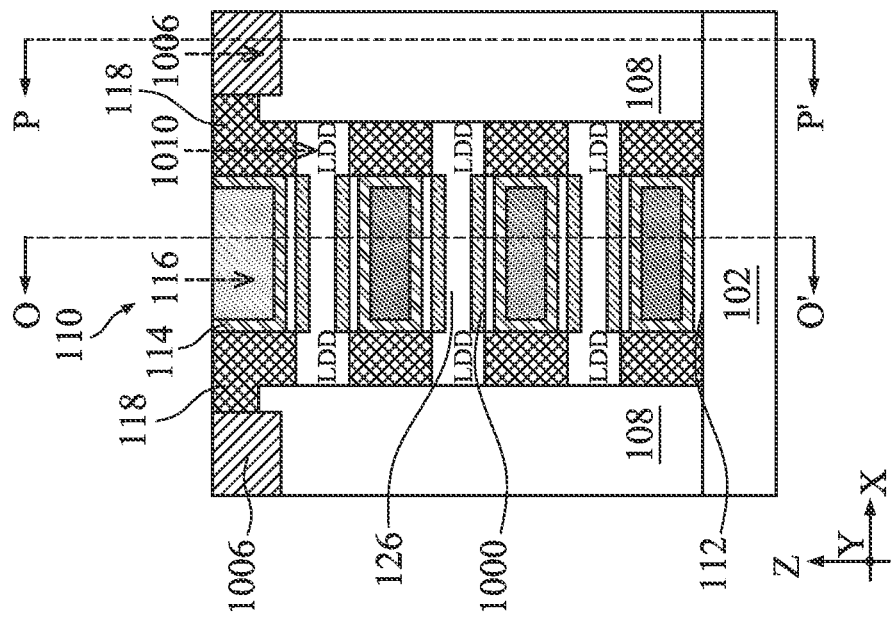
Fig. 17P
Fig. 17O
Fig. 17N

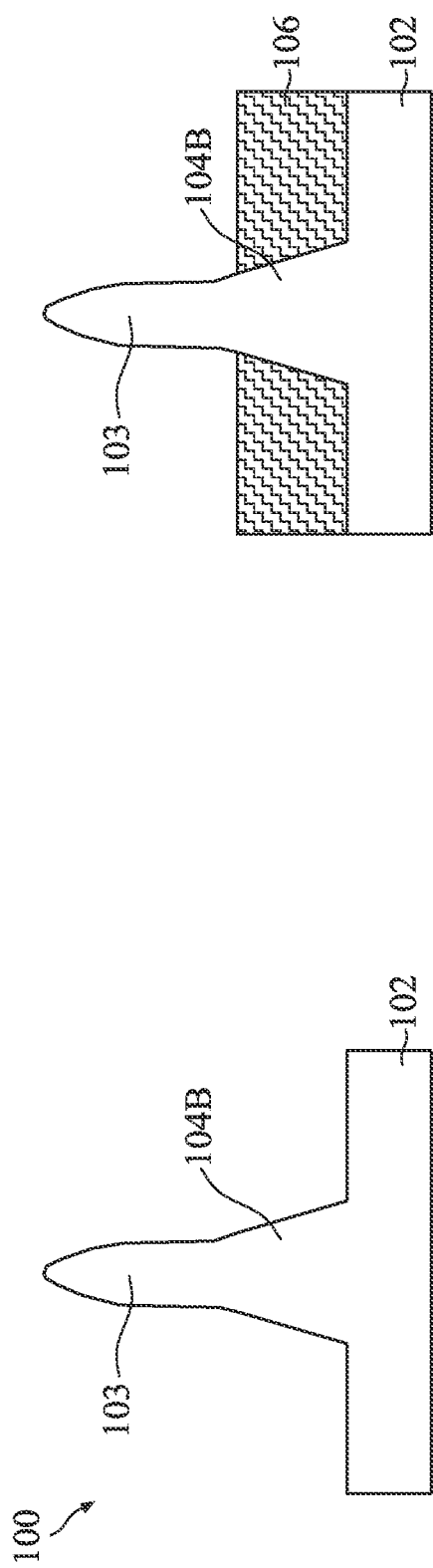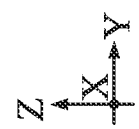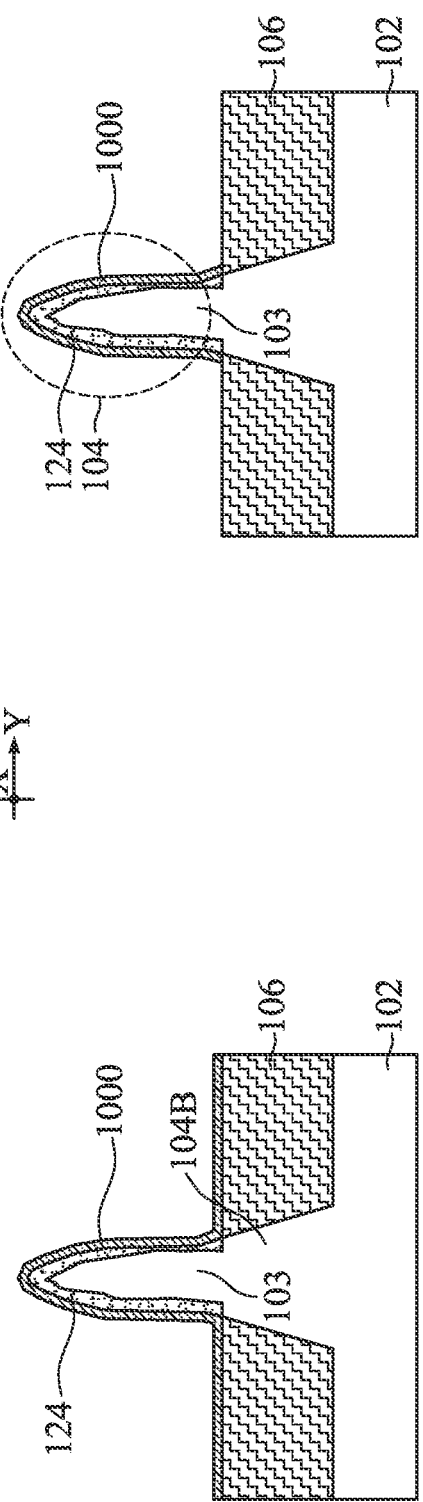

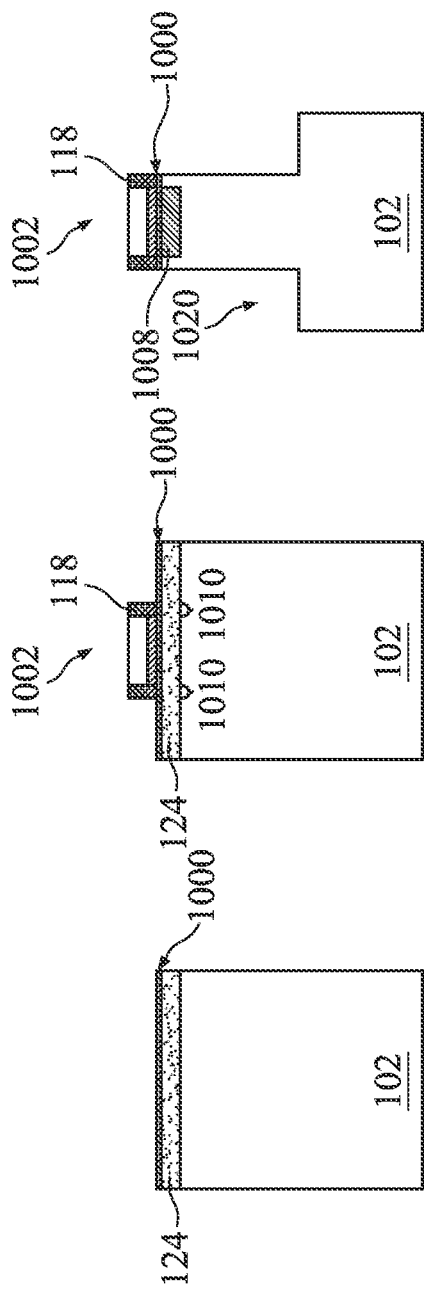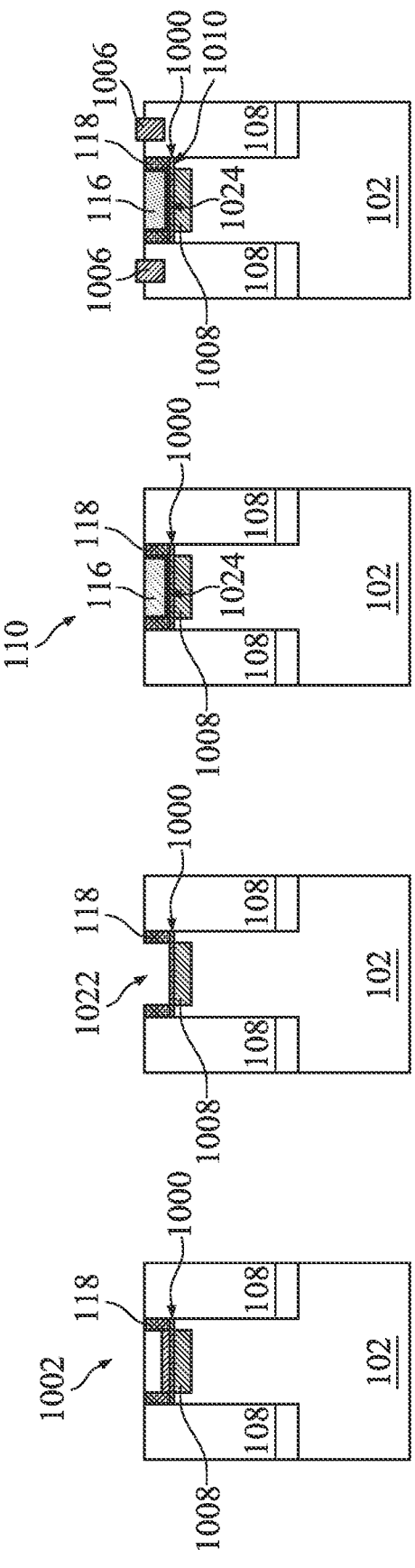

2D-CHANNEL TRANSISTOR STRUCTURE WITH SOURCE-DRAIN ENGINEERING

PRIORITY DATA

This application is a Continuation of U.S. patent application Ser. No. 17/218,212, filed Mar. 31, 2021, which further claims priority to U.S. Provisional Patent Application No. 63/062,840 filed on Aug. 7, 2020, entitled "2D-CHANNEL FIELD-EFFECT TRANSISTOR WITH SOURCE DRAIN ENGINEERING", the entire disclosure of which is hereby incorporated herein by reference. This application is related to U.S. patent application Ser. No. 16/937,277 filed on Jul. 23, 2020, entitled "DUAL CHANNEL STRUCTURE", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative name such as a nanosheet transistor or a nanowire transistor. As the scaling down continues, MBC transistors may not provide satisfactory drive current. Therefore, while conventional multi-gate structures may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-3H illustrate fragmentary cross-sectional views of a workpiece at various fabrication stages of the first method in FIG. 2, according to one or more aspects of the present disclosure.

FIGS. 13A-13O illustrate fragmentary cross-sectional views of a workpiece at various fabrication stages of the sixth method in FIG. 12, according to one or more aspects of the present disclosure.

FIGS. 15A-15N illustrate fragmentary cross-sectional views of a workpiece at various fabrication stages of the seventh method in FIG. 14, according to one or more aspects of the present disclosure.

FIGS. 17A-17P illustrate fragmentary cross-sectional views of a workpiece at various fabrication stages of the eighth method in FIG. 16, according to one or more aspects of the present disclosure.

FIGS. 19A-19L illustrate fragmentary cross-sectional views of a workpiece at various fabrication stages of the ninth method in FIG. 18, according to one or more aspects of the present disclosure.

DETAILED DESCRIPTION

Figure 1:
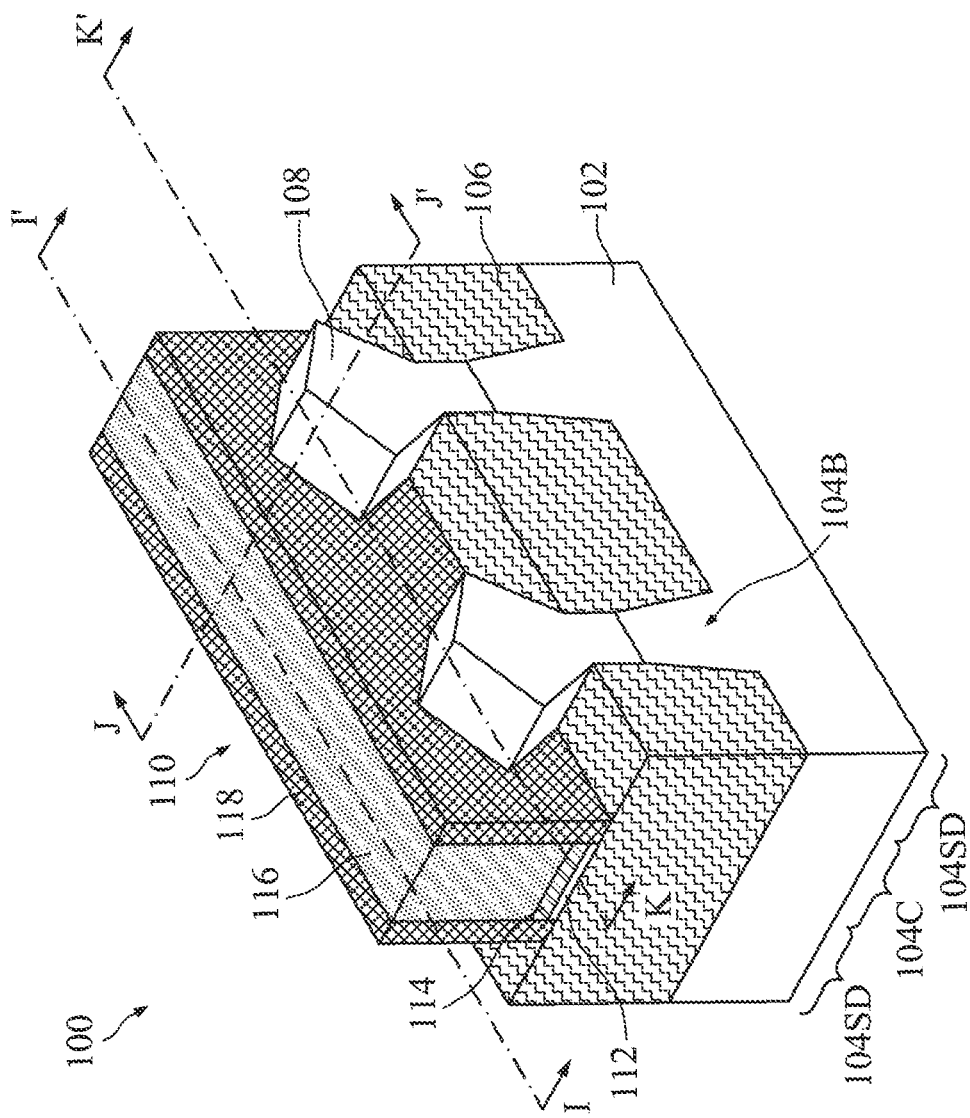
FIG. 1 illustrates a perspective view of a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to multi-gate transistors and fabrication methods, and more particularly to multi-gate transistors having a channel member that includes a second channel layer formed of a two-dimensional material in addition to a first channel layer.

Multi-gate devices include transistors whose gate structures are formed on at least two-sides of a channel region. Examples of multi-gate devices include fin-like field effect transistors (FinFETs) having fin-like structures and MBC transistors having a plurality of a channel members. As described above, MBC transistors may also be referred to as SGTs, GAA transistors, nanosheet transistors, or nanowire transistors. These multi-gate devices may be either n-type or p-type. An MBC transistor includes any device that has its gate structure, or portion thereof, formed on 4-sides of a channel region (e.g., surrounding a portion of a channel region). MBC devices according to the present disclosure may have channel regions disposed in nanowire channel members, bar-shaped channel members, nanosheet channel members, nanostructure channel members, bridge-shaped channel members, and/or other suitable channel configurations. As the scaling down continues, the dimensions of channel members in an MBC transistor may not support a satisfactory level of drive current.

The present disclosure provides embodiments of a semiconductor device whose channel member includes a first channel layer formed of silicon, germanium, a III-V semiconductor, or a II-VI semiconductor and a second channel layer formed of a two-dimensional (2D) material. The second channel layer is configured to have a band gap similar to that of the first channel layer. As such, the first channel layer and the second channel layer may be turned on at the same time. The second channel layer functions as a drive current booster to increase the overall drive current of the semiconductor device. Due to the implementation of the first channel layer and the second channel layer, semiconductor devices of the present disclosure may be referred to as dual-channel transistors (DCTs), dual-channel field effect transistors (DCFETs), or dual-modality field effect transistor (DMFETs). A DCFET may be a planar device, a FinFET, or an MBC transistor. Embodiments in FinFETs and MBC transistors are illustrated and described herein.

The various aspects of the present disclosure will now be described in more detail with reference to various figures. FIG. 1 illustrates a perspective view of a semiconductor device 100, which may be a FinFET or an MBC transistor. As the semiconductor device 100 is formed from a workpiece, it may be referred to as a workpiece 100 as the context requires. As shown in FIG. 1, the semiconductor device 100 includes a substrate 102. In one embodiment, the substrate 102 may be a silicon substrate. In some other embodiments, the substrate 102 may include other semiconductors such as germanium (Ge), silicon germanium (SiGe), a III-V semiconductor material, or a II-VI semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). Example II-VI semiconductor materials may include cadmium selenide (CdSe), cadmium sulfide (CdS), cadmium telluride (CdTe), zinc selenide (ZnSe), zinc sulfide (ZnS), and zinc telluride (ZnTe).

The semiconductor device 100 in FIG. 1 includes one or more channel members (104, not shown in FIG. 1, but are shown in FIGS. 3G, 3H, 5G, 5H, 7M, 9M, 11N, 13M, 15L, 17N, 19L and 20) that are disposed over base portions 104B extending from the substrate 102. It is noted that only base portions 104B are illustrated in FIG. 1. The channel members are not visible in FIG. 1 due to presence of other structures. The one or more channel members and base portions 104B extends lengthwise along the X direction. The semiconductor device 100 also includes an isolation feature 106 that isolate neighboring base portions 104B. Each of base portions 104B includes a channel region 104C spanned between two source and drain (or source/drain) regions 104SD. The channel members are disposed over the channel region 104C and source and drain (or source/drain) features 108 are disposed over the source/drain regions 104SD. A gate structure that extends along the Y direction (which is perpendicular to the X direction) is disposed over the channel members over the channel regions 104C. The gate structure includes a gate stack 110 and a gate spacer layer 118. The gate stack 110 may include an interfacial layer 112, a high-k dielectric layer 114 over the interfacial layer 112, and a gate electrode 116 over the high-k dielectric layer 114. In some embodiments, the gate stack 110 may be spaced apart from the source/drain features 108 by the gate spacer layer 118.

The isolation feature 106 may also be referred to as a shallow trench isolation (STI) feature 106. The isolation feature 106 may include silicon oxide, silicon nitride, silicon oxynitride, fluorine-doped silicate glass (FSG), a low-k dielectric, combinations thereof, and/or other suitable materials. The source/drain features 108 may include a semiconductor material doped with an n-type dopant, such as phosphorus (P) or arsenide (As), or a p-type dopant, such as boron (B). The semiconductor material for the source/drain features 108 may include silicon or silicon germanium. In one embodiment when the semiconductor device 100 is n-type, the source/drain features 108 may include silicon and may be doped with phosphorus (P). In another embodiment when the semiconductor device 100 is p-type, the source/drain features 108 may include silicon germanium doped with boron (B).

The interfacial layer 112 of the gate stack 110 may include a dielectric material such as silicon oxide, hafnium silicate, or silicon oxynitride. In some embodiments, in order to better interface the 2D materials, the interfacial layer 112 may include hexagonal boron nitride. The high-k dielectric layer 114 of the gate stack 110 may include a high-k dielectric material that has a dielectric material with a dielectric constant greater than that of silicon dioxide, which is about 3.9. In some instances, the high-k dielectric layer 114 may include metal oxide or metal nitride, such as hafnium oxide, zirconium oxide, zirconium aluminum oxide, hafnium aluminum oxide, hafnium silicon oxide, aluminum oxide, titanium oxide, tantalum oxide, lanthanum oxide, yttrium oxide, tantalum carbonitride, zirconium nitride, combinations thereof, or other suitable material. In some instances, the high-k dielectric layer 114 may have a thickness between about 5 nm and about 30 nm. The gate electrode 116 of the gate stack 110 may include a single layer or alternatively a multi-layer structure, such as various combinations of a metal layer with a selected work function to enhance the device performance (such as reduce threshold voltage), a liner layer, a wetting layer, an adhesion layer, a metal alloy or a metal silicide. By way of example, the gate electrode 116 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. The gate spacer layer 118 is a dielectric layer and may be a single layer or a multi-layer. In some instances, the gate spacer layer 118 may include silicon oxide, silicon oxycarbide, silicon carbonitride, silicon nitride, zirconium oxide, aluminum oxide, a suitable low-k dielectric material, or a suitable dielectric material.

Depending on whether the semiconductor device 100 is a FinFET or an MBC transistor, the channel members may be formed from the substrate 102 alone or from a stack of epitaxial layers on the substrate 102. When the semiconductor device 100 is a FinFET, the channel member 104 may resemble a fin, as representatively shown in FIGS. 3G, 3H, 5G, 5H, 7M, 9M, 19L and 20. When the semiconductor device 100 is an MBC transistor, the channel member 104 may resemble a sheet or a wire, as representatively shown in FIGS. 11N, 13M, 15L, and 17N. Referring back to FIG. 1, regardless of the shape of the channel member 104, the channel member 104 (shown in 3G, 3H, 5G, 5H, 7M, 9M, 11N, 13M, 15L, 17N, 19L and 20) extend between two source/drain features 108 on opposing sides of the gate stack 110.

According to the present disclosure, a channel member 104 of the semiconductor device 100 includes one or more layers formed of a two-dimensional (2D) material. Here, a 2D material refers to a semiconductor material that is thin (i.e., having a thickness between about 1 Å and about 30 Å) and is conductive only along a two-dimensional plane. A 2D material is conductive only along a two-dimensional plane because charge carriers, such as electrons, are only free to move along the two-dimensional plane. In some instances, a 2D material may also be referred to as a single-layer material. The present disclosure provides several embodiments, including FinFET embodiments shown in FIGS. 3G, 3H, 5G, 5H, 7M, 9M, 19L and 20 and MBC transistor embodiments shown in FIGS. 11N, 13M, 15L, and 17N. In addition, the present disclosure provides several methods for fabricating each of these embodiments. For example, the present disclosure provides a first method 200 shown in FIG. 2, a second method 300 shown in FIG. 4, a third method 400 shown in FIG. 6, a fourth method 500 shown in FIG. 8, a fifth method 600 shown in FIG. 10, a sixth method 700 shown in FIG. 12, a seventh method 800 shown in FIG. 14, an eighth method 900 shown in FIG. 14, and a ninth method 930 shown in FIG. 18. These methods are merely examples and are not intended to limit the present disclosure to what is explicitly illustrated therein. Additional steps can be provided before, during and after these methods, and some steps described can be replaced, eliminated, or moved around for additional embodiments of the methods. Not all steps are described herein in detail for reasons of simplicity. Each of these methods is described below in conjunction with fragmentary cross-sectional views along the section I-I', J-J' or K-K' shown in FIG. 1. In this regard, the first method 200 is described below in conjunction with FIGS. 3A-3H. The second method 300 is described below in conjunction with FIGS. 5A-5H. The third method 400 is described below in conjunction with FIGS. 7A-7O. The fourth method 500 is described below in conjunction with FIGS. 9A-9N. The fifth method 600 is described below in conjunction with FIGS. 11A-11P. The sixth method 700 is described below in conjunction with FIGS. 13A-13O. The seventh method 800 is described below in conjunction with FIGS. 15A-15N. The eighth method 900 is described below in conjunction with FIGS. 17A-17P. The ninth method 930 is described below in conjunction with FIGS. 19A-19L.

Figure 2:
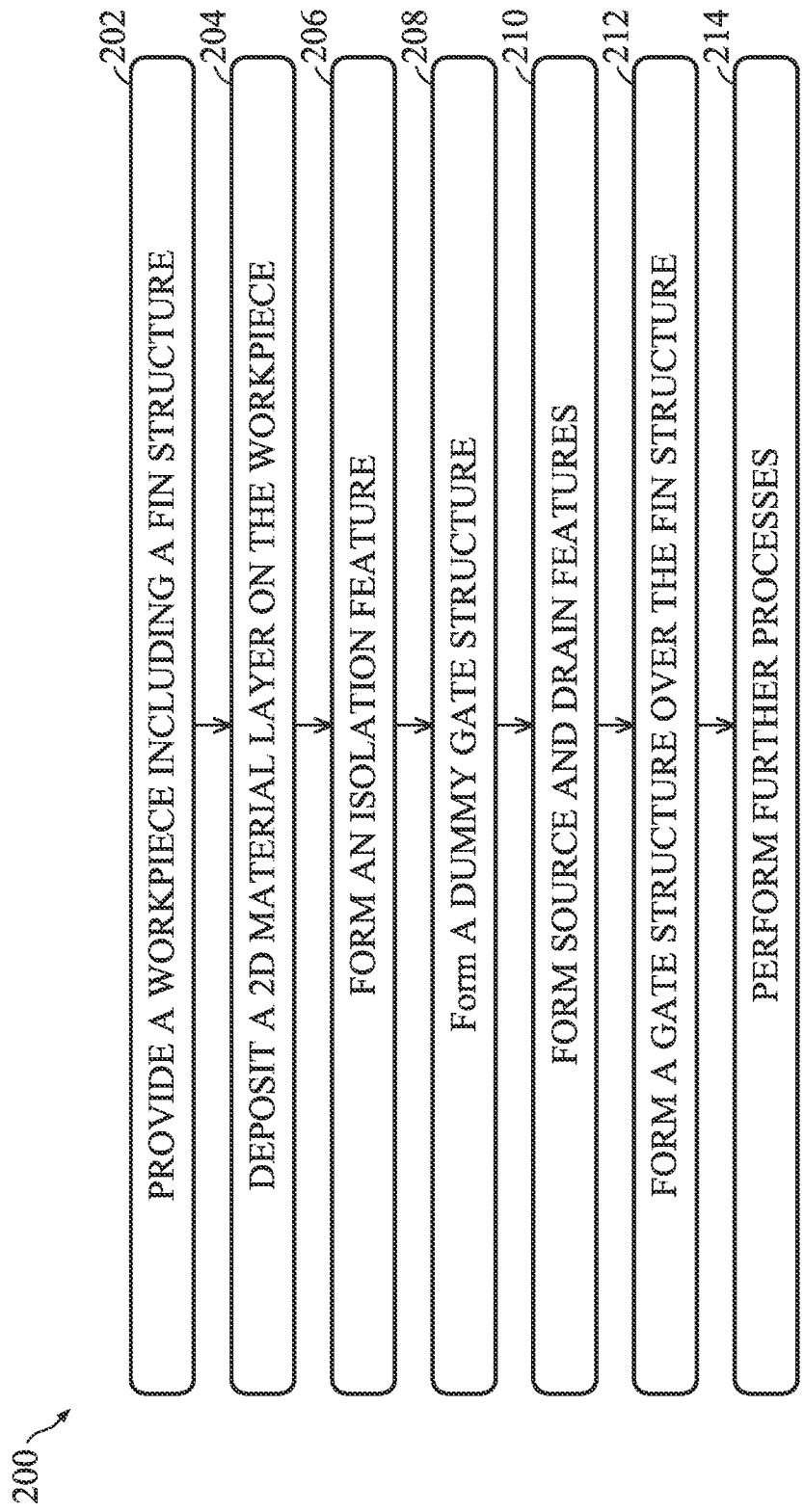
FIG. 2 illustrates a flowchart of a first method of fabricating a semiconductor device, according to one or more aspects of the present disclosure.
Figure 3A:
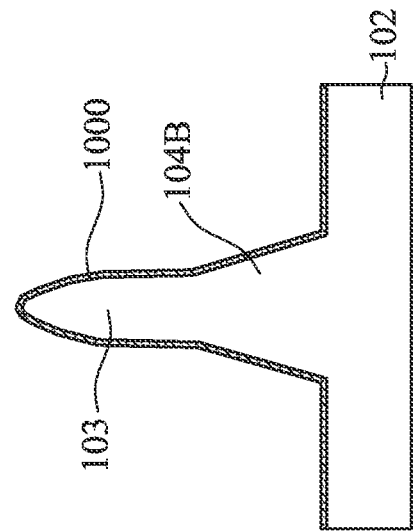

FIG. 2 illustrates a flowchart of a first method 200 for fabricating a FinFET. Referring to FIGS. 2 and 3A, the first method 200 includes a block 202 where a workpiece 100 is provided. As shown in FIG. 3A, the workpiece 100 includes a fin structure 103. The fin structure 103 in FIG. 3A may be formed from the substrate 102 and extend continuously from the substrate 102. As described above with respect to FIG. 1, the fin structure 103 extends lengthwise along the X direction. In some embodiments, the fin structure 103 may include silicon (Si), germanium (Ge), silicon germanium (SiGe), a III-V semiconductor material, or a II-VI semiconductor material. In some embodiments, the fin structure 103 may be doped with a dopant, such as phosphorus (P), arsenide (As), or boron (B). The fin structure 103 may have different thickness along the Y direction.

Figure 3B:
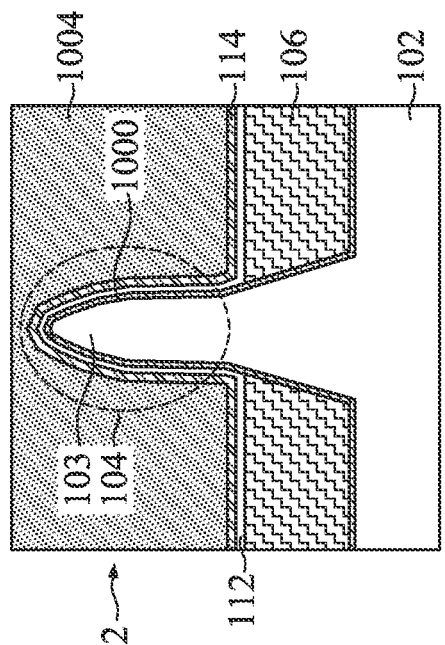

Referring to FIGS. 2 and 3B, the first method 200 includes a block 204 where a 2D material layer 1000 is deposited on the workpiece 100. As shown in FIG. 3B, at block 204, the 2D material layer 1000 is deposited over the fin structure 103. In the depicted embodiment, the 2D material layer is a single-layer material, such as crystalline materials consisting of a single layer of atom. In some embodiments, the 2D material layer 1000 may include graphene, tungsten sulfide ($WS_2$), tungsten telluride ($WTe_2$), tungsten selenide ($WSe_2$), molybdenum sulfide ($MoS_2$), molybdenum telluride ($MoTe_2$), molybdenum selenide ($MoSe_2$), black phosphorus, or a suitable 2D material that has substantial band alignment with the semiconductor material of the fin structure 103. Here, substantial band alignment refers to an overlap of the bandgap of the fin structure 103 and that of the 2D material. A bandgap of a material refers to a difference between a valence band (Ev) of the material and a conduction band (Ec) of the material. For example, silicon has a valance band at −5.17 eV, a conduction band at −4.05 eV, a bandgap of 1.12 eV between −5.17 eV and −4.05 eV. Tungsten telluride ($WTe_2$) has a valence band at about −4.5 eV, a conduction band at about −3.7 eV, and a bandgap of 0.8 eV between −4.5 eV and about −3.7 eV. In this example, as the bandgap of tungsten telluride overlaps with the bandgap of silicon, tungsten telluride and silicon have substantial band alignment. Like the fin structure 103, the 2D material layer may be doped with a dopant, such as sulfur (S), selenium (Se), tellurium (Te), zirconium (Zr), hafnium (Hf), tungsten (W), molybdenum (Mo), boron (B), oxygen (O), nitrogen (N), carbon (C), silicon (Si), or tin (Sn). With respect to both the fin structure 103 and the 2D material layer 1000, electronic confinement due to film thickness and doping may affect the bandgaps and therefore the band alignment. The present disclosure envisions tuning of bandgaps using electronic confinement and doping to achieve band alignment between the fin structure 103 and the 2D material layer 1000. The bandgap alignment between the fin structure 103 and that of the 2D material may be achieved by doping the 2D materials with the foregoing dopants and/or by doping the fin structure 103 using n-type dopants, such as phosphorus (P), or p-type dopants, such as boron (B).

In some embodiments, the 2D material layer 1000 may be deposited over the workpiece 100 by epitaxial growth, chemical vapor deposition (CVD), atomic layer deposition (ALD), or a combination thereof. As shown in FIG. 3B, because the fin structure 103 and the substrate 102 are formed of the same material, the 2D material layer 1000 is deposited not only on the top surface and sidewall of the fin structure 103 but also on the top surface of the substrate 102. In some instances, the 2D material layer 1000 may have a thickness between about 1 Å and about 30 Å, such as between about 2 Å and about 10 Å. Compared to silicon, germanium, silicon germanium, a III-V semiconductor, or a II-VI semiconductor, 2D material of the 2D material layer 1000 has a higher density of states (DoS) due to its higher inversion charge density (Qinv).

Figure 3C:
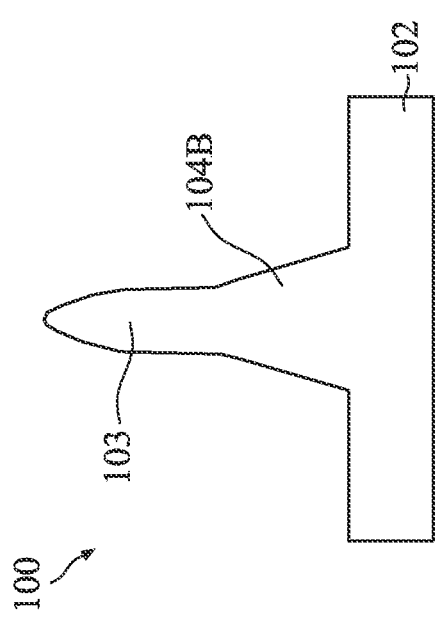

Referring to FIGS. 2 and 3C, the first method 200 includes a block 206 where an isolation feature 106 is formed. In some embodiments, the isolation feature 106 may include a dielectric material such as silicon oxide, silicon nitride, silicon oxynitride, fluorine-doped silicate glass (FSG), a low-k dielectric, combinations thereof, and/or other suitable materials. In an example process, the dielectric material of the isolation feature 106 is first blanketly deposited over the workpiece 100 by spin-on coating or CVD. Thereafter, the blanketly deposited dielectric material is planarized in a planarization process, such as a chemical mechanical polishing (CMP) process. The planarized dielectric material is then selectively recessed or etched back such that the fin structure 103 rises above the isolation feature 106, as shown in FIG. 3C. At block 206, because the isolation feature 106 is formed after the deposition of the 2D material layer 1000, the isolation feature 106 is not in direct contact with sidewalls of base portion 104B and the top surface of the substrate 102. Put differently, the isolation feature 106 is spaced apart from the base portion 104B and the substrate 102 by the 2D material layer 1000. In FIG. 3C, the 2D material layer 1000 and the fin structure 103 that are not covered by the isolation feature 106 may be collectively referred to as a channel member 104.

Figure 3D:
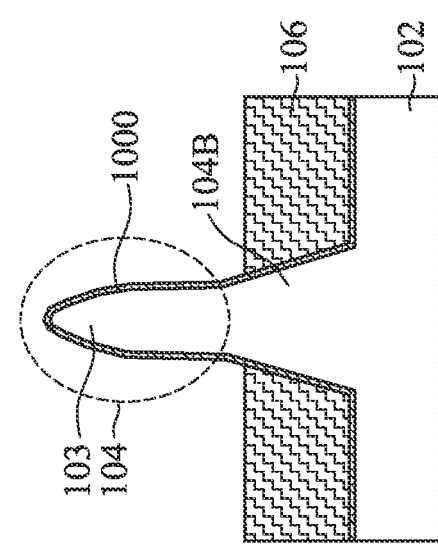

Referring to FIGS. 2 and 3D, the first method 200 includes a block 208 to form a dummy gate structure. Although not explicitly shown, the formation of the dummy gate structure may be performed between the formation of the isolation feature 106 at block 206 and the formation of the source and drain features 108 at block 210 (to be described below). In some embodiments, the dummy gate structure includes a dummy gate stack 1002 and a gate spacer layer 118. The formation of the dummy gate structure includes forming a dummy gate stack 1002 over the channel member 104, which further include deposition of dummy gate materials, and patterning the dummy gate material to form one or more dummy gate stack. The block 208 may further include forming a gate spacer layer 118 on the sidewalls of the dummy gate stack 1002 by depositing the gate spacer layer 118 and etching back of the gate spacer layer 118 by an anisotropic etching, such as plasma etching. In some embodiments where a gate-last process is adopted, the dummy gate stack 1002 may include the interfacial layer 112, a high-k dielectric layer 114, and a dummy gate electrode 1004, such as a polysilicon layer, as illustrated in FIG. 3D. In some embodiments where a high-k-last process is adopted, the dummy gate stack 1002 may include a dielectric layer, such as silicon oxide, and a dummy gate electrode 1004, such as a polysilicon layer.

Referring to FIGS. 2 and 3E, the first method 200 includes a block 210 to form the source/drain features 108. The formation of the source/drain features 108 may include recessing of the source/drain region 104SD, and epitaxial growth of the source/drain features 108. Especially, the source/drain features 108 include one or more semiconductor materials to provide better integration with channel member 104 (particularly, the 2D material layer 1000) with reduced contact resistance to the channel member 104. This is because the 2D material layer 1000 has a limited thickness and reduced contact area with the source/drain feature. In some embodiments, the source/drain features 108 include silicon doped with phosphorous or arsenic for n-type FETs or silicon germanium doped with boron for p-type FETs. The formation of the source/drain features 108 will be further described later according to various embodiments. In some embodiments, the portions of the 2D material layer 1000 underlying the gate spacer layer 118 may are doped to form light doped source/drain (LDD) features 1010, which can be formed by an ion implantation process implemented between the formation of the dummy gate electrode 1004 and the formation of the gate spacer layer 118. The LDD features 1010 are doped with a same type dopant of the source/drain features 108 but with less dopant concentration than that of the source/drain features 108.

Referring to FIGS. 2 and 3F, the first method 200 includes a block 212 where the gate stack 110 is formed over the channel member 104. As described above, the gate stack 110 may include an interfacial layer 112, a high-k dielectric layer 114 over the interfacial layer 112, and a gate electrode 116 over the high-k dielectric layer 114. The interfacial layer 112 of the gate stack 110 may include a dielectric material such as silicon oxide, hafnium silicate, or silicon oxynitride. In some embodiments, in order to better interface the 2D materials, the interfacial layer 112 may include hexagonal boron nitride. The high-k dielectric layer 114 of the gate stack 110 may include a high-k dielectric material that has a dielectric material with a dielectric constant greater than that of silicon dioxide, which is about 3.9. In some instances, the high-k dielectric layer 114 may include hafnium oxide, zirconium oxide, zirconium aluminum oxide, hafnium aluminum oxide, hafnium silicon oxide, aluminum oxide, titanium oxide, tantalum oxide, lanthanum oxide, yttrium oxide, tantalum carbonitride, zirconium nitride, combinations thereof, or other suitable material. In some instances, the high-k dielectric layer 114 may have a thickness between about 5 nm and about 30 nm. The gate electrode 116 of the gate stack 110 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode 116 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In some embodiments, the interfacial layer 112 may be formed by thermal oxidation or deposited using CVD or ALD. The high-k dielectric layer 114 may be deposited using CVD or ALD. The gate electrode 116 may be deposited using physical vapor deposition (PVD), CVD, ALD, or electroless plating. It is noted that both the interfacial layer 112 and the high-k dielectric layer 114 are collectively functioning as a gate dielectric to control the channel member by the gate electrode 116.

As shown in FIG. 3F, the gate stack 110 is disposed over the channel member 104 that includes the fin structure 103 and the 2D material layer 1000. Due to the substantial band alignment between the 2D material layer 1000 and the fin structure 103, a single threshold voltage at the gate stack 110 may activate a channel in the fin structure 103 as well as a channel in the 2D material layer 1000. In this sense, the fin structure 103 above the isolation feature 106 functions as a first channel layer and the 2D material layer 1000 functions as a second channel layer. The channel formed in the fin structure 103 does not interact with the channel formed in the 2D material layer 1000. This is due to the 2D character of the 2D material layer 1000. Because 2D crystalline layers of the 2D material layer 1000 are held together by van der Waals force, not valence bonds, the band gap along a direction normal to the 2D crystalline plane may be orders of magnitude greater than that along a direction in the 2D crystalline plane. As the fin structure 103 is not in the 2D crystalline plane, the large band gap shields the 2D material layer 1000 from the fin structure 103 and vice versa. As a result, despite the fact that the 2D material layer 1000 is formed directly on the fin structure 103, fin structure 103 and the 2D material layer 1000 provide two independent channels that may be simultaneously activated by the same gate stack 110. Hence, the semiconductor device 100 may be referred to as a dual-channel transistors (DCTs), dual-channel field effect transistors (DCFETs), or dual-modality field effect transistor (DMFETs). Because current is allowed to flow in the channel formed in the fin structure 103 and the channel formed in the 2D material layer 1000 and the 2D material layer 1000 extends along the sidewalls of the fin structure 103, the effective channel width may be increased by a factor between about 1.8 and 2 and the On-state current may also be increased by a factor between about 1.8 and 2, compared to a similar semiconductor device that does not have the 2D material layer 1000 in the channel region.

The formation of the gate stack 110 may include a gate replacement, in which a dummy gate stack is removed and is replaced by the gate stack 110. In some embodiments, the formation of the gate stack 110 may further include other intermediate processes, such as deposition of a contact etch stop layer (CESL) over the workpiece 100, deposition of an interlayer dielectric (ILD) layer over the workpiece 100, planarization of the ILD layer, and removal of the dummy gate stack. The removal of the dummy gate stack leaves behind a gate trench defined by the gate spacer layer 118. The gate stack 110 to be formed at block 210 is disposed in the gate trench. The formation of the gate stack 110 may further include a CMP process after the deposition to fill gate materials into the gate trench. The CMP process removes excessive gate materials deposited on the ILD layer and planarize the top surface of the workpiece.

Referring now to FIGS. 2 and 3G, the first method 200 includes a block 214 where further processes are performed. In some embodiments, such further processes may include formation of source/drain contacts (or source/drain metal features) 1006 as illustrated in FIG. 3G, formation of gate contacts, formation of a further ILD layer, formation of source/drain contact vias, and formation of further interconnect structures. The source/drain metal features 1006 may be formed by metal deposition and patterning that includes lithography process and etching. Alternatively, the source/drain metal features 1006 may be formed by forming an interlayer dielectric (ILD) layer; patterning the ILD layer to form an opening; depositing one or metal into the opening of the ILD layer; and performing a CMP process.

Alternatively, the semiconductor device 100 may further include a dielectric layer 1008 disposed under the 2D material layer 1000, as illustrated in FIG. 3H. Particularly, the dielectric layer 1008 is interposed between the first channel layer (the fin structure 103 above the isolation feature 106) and the second channel layer (the 2D material layer 1000). The dielectric layer 1008 may include silicon oxide, other suitable dielectric material or a combination thereof. The semiconductor device 100 with the inserted dielectric layer 1008 in FIG. 3H can be formed by any suitable method. In some embodiments, the first method 200 is modified to form the semiconductor device 100 of FIG. 3H, as described below. The block 204 includes epitaxially growing a silicon germanium layer on the substrate; a silicon layer on the silicon germanium layer; and then the 2D material layer 1000 on the silicon layer. The block 210 includes patterning the fin structure 103 to form trenches in the source/drain regions 104SD; performing a selective etching process to remove the silicon germanium layer through the trenches; depositing a dielectric layer (such as silicon oxide) in the trenches; and thereafter performing epitaxial growth to form source and drain features 108. The selective etching process may further includes selectively oxidizing the silicon germanium layer and selectively etching oxidized silicon germanium layer. In alternative embodiments, the block 210 includes patterning the fin structure 103 to form trenches in the source/drain regions 104SD; performing a selective oxidization process to oxidize the silicon germanium layer through the trenches, thereby forming silicon germanium oxide as the dielectric layer 1008; and thereafter performing epitaxial growth to form source and drain features 108. In some embodiments, the dielectric layer 1008 may be formed by another method, such as one described in the method 930, particularly block 934 of FIG. 18. In the present embodiment, the dielectric layer 1008 provides an operation mode wherein only the 2D material layer 1000 functions as single channel to the corresponding transistor. In furtherance of the embodiment, only single 2D-channel on insulator provides device behavior similar to silicon on insulator (SOI) device. The dielectric layer 1008 is a buried dielectric layer, such as silicon oxide or other suitable dielectric material, with a proper thickness functioning to suppress turning-on the bottom silicon planer device (or the second channel) since its strong short-channel-effect (SCE) and unsuitable for scaled MOSFET devices, such as for FET with gate length less than 15 nm. Accordingly, the corresponding device has reduced or eliminated short-channel issue, especially for scaled field-effect transistors with gate length less than 15 nm. In some embodiments, the dielectric layer 1008 includes a thickness ranging between 10 nm and 20 nm. In some embodiments where the transistor has only 2D material layer 1000 as a single channel layer, the fin structure underlying the 2D material layer 1000 is a dielectric fin to function as an isolation feature to eliminate the second channel and therefore eliminate the short-channel issue.

In some embodiments, the dielectric layer 1008 provides multiple operation modes wherein only the 2D material layer 1000 functions as single channel during a low operation voltage and dual-channel during a high operation voltage, depending on the thickness of the dielectric layer 1008 and the magnitude of the high voltage.

Figure 4:
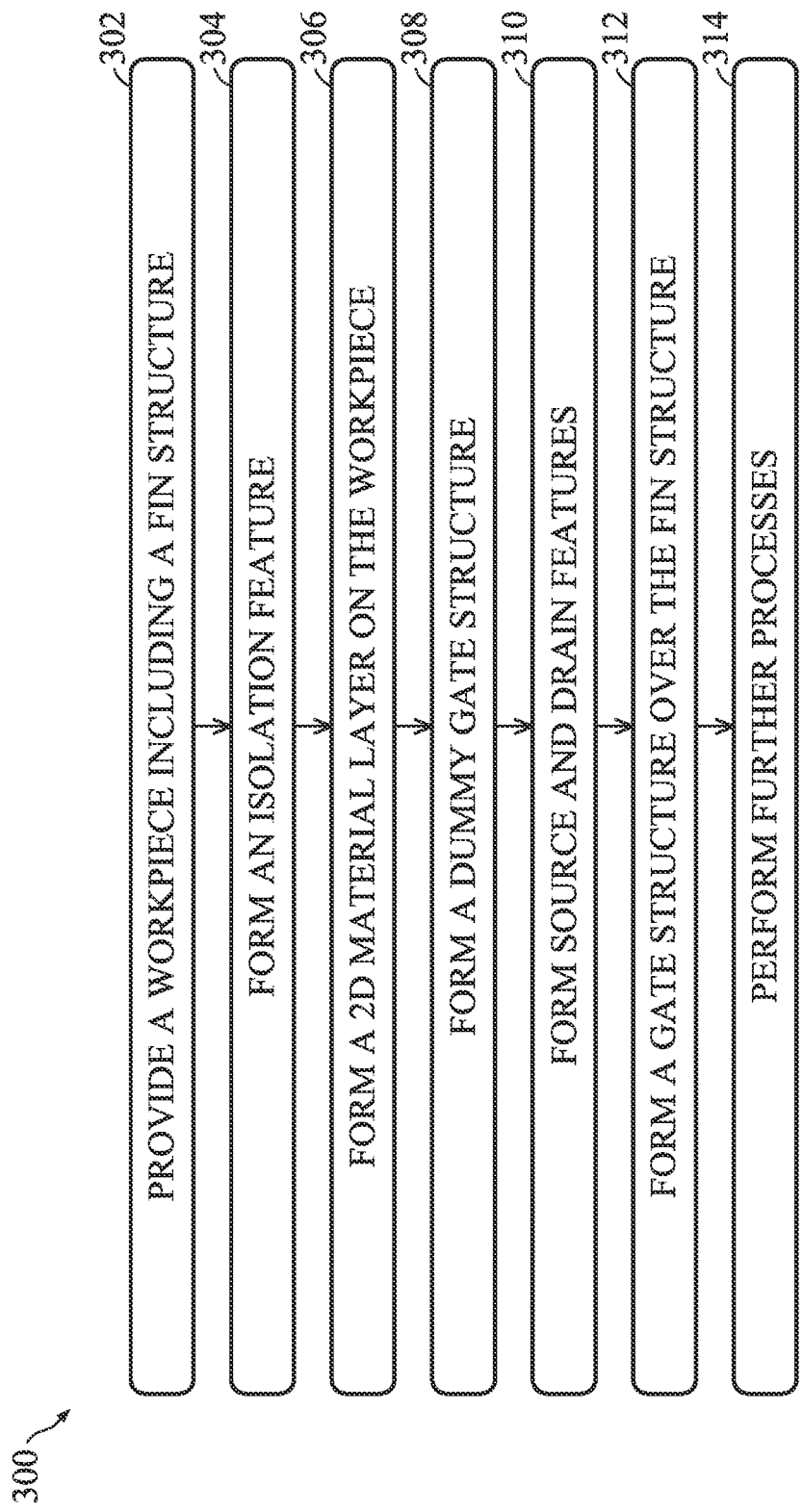
FIG. 4 illustrates a flowchart of a second method of fabricating a semiconductor device, according to one or more aspects of the present disclosure.
Figure 5A:
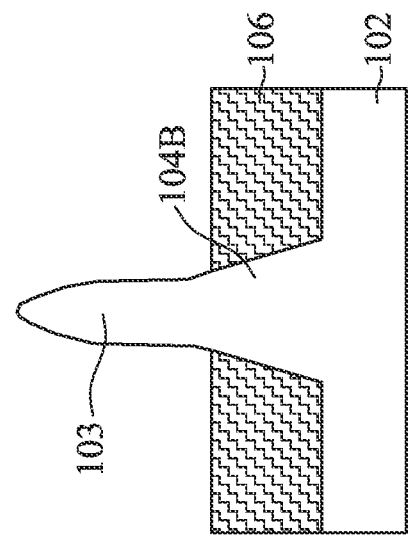
FIGS. 5A-5H illustrate fragmentary cross-sectional views of a workpiece at various fabrication stages of the second method in FIG. 4, according to one or more aspects of the present disclosure.

The semiconductor device 100 may also be formed using a method like the second method 300 shown in FIG. 4. Referring to FIGS. 4 and 5A, the second method 300 includes a block 302 where a workpiece 100 is provided. As the workpiece 100 has been described above with respect to the first method 200, details of the workpiece 100 is omitted here for brevity.

Figure 5B:
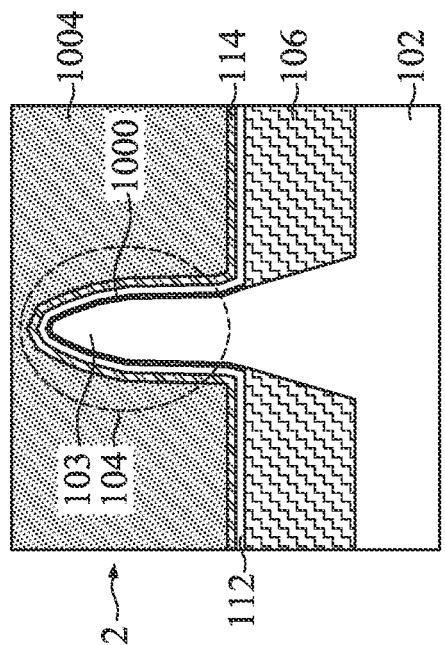

Referring to FIGS. 4 and 5B, the second method 300 includes a block 304 where an isolation feature 106 is formed. Operations at block 304 is similar to those at block 206 in the first method 200, except that the isolation feature 106 is formed before the deposition of the 2D material layer 1000. Detailed descriptions of the composition and formation of the isolation feature 106 is omitted here for brevity. As shown in FIG. 5B, the isolation feature 106 is in direct contact with sidewalls of the base portion 104B and top surface of the substrate 102. No 2D material layer 1000 is disposed between the substrate 102 and the isolation feature 106.

Figure 5C:
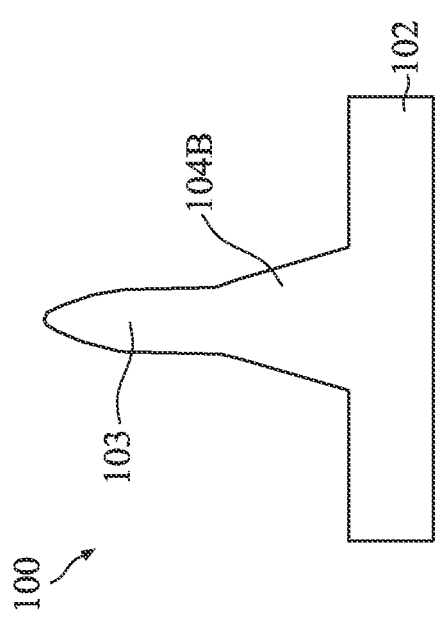

Referring to FIGS. 4 and 5C, the second method 300 includes a block 306 where the 2D material layer 1000 is selectively deposited on the fin structure 103. Different from the operations at block 204 of the first method 200, deposition of the 2D material layer 1000 at block 306 is selective to the fin structure 103 and the 2D material layer 1000 does not substantially form over the isolation feature 106. In some implementations, the selective deposition may take place at a process temperature at which the 2D material layer 1000 does not deposit on the isolation feature 106 that has a greater lattice mismatch with the 2D material layer 1000. Rather, the 2D material layer 1000 is selectively deposited on the fin structure 103 that has a smaller lattice mismatch with the 2D material layer 1000. In some embodiments, the 2D material layer 1000 may include graphene, tungsten sulfide ($WS_2$), tungsten telluride ($WTe_2$), tungsten selenide ($WSe_2$), molybdenum sulfide ($MoS_2$), molybdenum telluride ($MoTe_2$), molybdenum selenide ($MoSe_2$), black phosphorus, or a suitable 2D material that has substantial band alignment with the semiconductor material of the fin structure 103. The 2D material layer 1000 may be doped with a dopant, such as sulfur (S), selenium (Se), tellurium (Te), zirconium (Zr), hafnium (Hf), tungsten (W), molybdenum (Mo), boron (B), oxygen (O), nitrogen (N), carbon (C), silicon (Si), or tin (Sn). At block 306, the 2D material layer 1000 may be deposited using epitaxial growth or ALD. In FIG. 3C, the 2D material layer 1000 and the fin structure 103 that are not covered by the isolation feature 106 may be collectively referred to as a channel member 104. In this case, the 2D material layer 1000 is patterned to be aligned with the dummy gate stack during the formation of the dummy gate structure at later stage.

In some embodiments, the 2D material layer 1000 is formed in the channel region 104C by other suitable process. A patterned mask is formed on the workpiece 100 by a lithography process and etching. The patterned mask includes an opening aligned to the channel region 104C. Then an etching process is applied to the fin structure 103 through the opening of the patterned mask using the patterned mask as an etch mask, thereby forming a recess on the fin structure within the channel region 104C. Thereafter, the 2D material layer 1000 is deposited in the recess such that the top surface of the 2D material layer 1000 is substantially coplanar with the top surface of the fin structure 103.

Figure 5D:
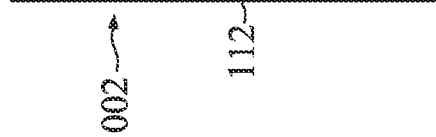
Figure 5E:
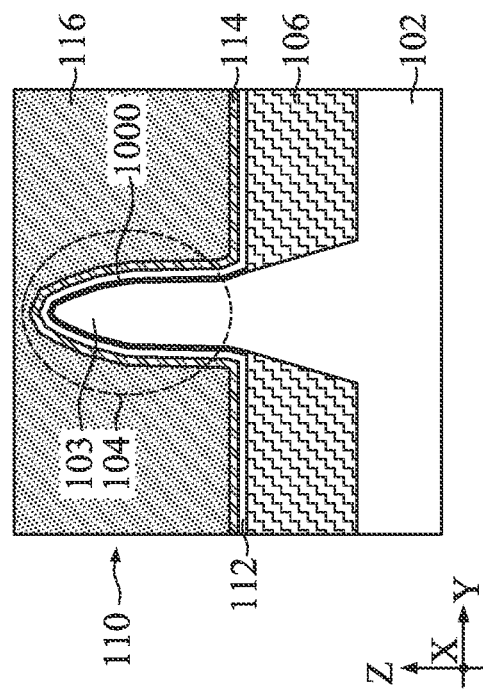

Referring to FIGS. 4 and 5D, the second method 300 includes a block 308 to form a dummy gate structure. Although not explicitly shown, the formation of the dummy gate structure may be performed between the formation of the 2D material layer 1000 at block 306 and the formation of the source and drain features 108 at block 310 (to be described below). In some embodiments, the dummy gate structure includes a dummy gate stack 1002 and a gate spacer layer 118. The formation of the dummy gate structure includes forming a dummy gate stack 1002 over the channel member 104, which further include deposition of dummy gate material, and patterning the dummy gate material to form the dummy gate stack 1002 by a procedure that includes a lithography process and etch and may further include using a hard mask as an etch mask. Particularly, the patterning of the dummy gate material includes continuing the corresponding etching process to pattern the 2D material layer 1000 so that the 2D material layer 1000 is aligned with the dummy gate stack 1002. In this case, the etching process may include multiple etching steps with different etchants to etch respective material layers including the dummy gate material and the 2D material layer 1000. In some embodiments, after the patterning process to form the dummy gate stack 1002 and the 2D material layer 1000 patterned to be aligned with the dummy gate stack 1002, an epitaxial growth is applied to selectively deposit a semiconductor material layer 1012 such that the semiconductor material layer 1012 is selectively grown on the surface of the fin structure 103. The selective epitaxial growth is controlled to grow the semiconductor material layer 1012 to a level that substantially matches to the top surface of the 2D material layer 1000, as illustrated in FIG. 5E. In the present embodiment, the semiconductor material layer 1012 includes a semiconductor material same to that of the substrate 102, such as silicon.

In some embodiments where a gate-last process (in which gate electrode is formed to replace the dummy gate electrode of the dummy gate stack) is adopted, the dummy gate stack 1002 may include the interfacial layer 112, a high-k dielectric layer 114, and a dummy gate electrode 1004, such as a polysilicon layer, as illustrated in FIG. 5D. In some embodiments where a high-k-last process (in which both gate electrode and gate dielectric layer are formed to replace the dummy gate stack) is adopted, the dummy gate stack 1002 may include a dielectric layer, such as silicon oxide, and a dummy gate electrode 1004, such as a polysilicon layer.

The block 308 may further include forming LDD features 1010 in the semiconductor material layer 1012 by a suitable method, such as ion implantation. In the depicted embodiment, the formation of the LDD features 1010 is implemented after the formation of the dummy gate electrode 1004 and before the formation of the gate spacer layer 118 (to be described below).

The block 308 may further include forming a gate spacer layer 118 on the sidewalls of the dummy gate stack 1002 by depositing the gate spacer layer 118 and etching back of the gate spacer layer 118 by an anisotropic etching, such as plasma etching, as illustrated in FIG. 5E.

Referring to FIGS. 4 and 5E, the second method 300 includes a block 310 to form the source/drain features 108. The formation of the source/drain features 108 may include recessing of the source/drain region 104SD, and epitaxial growth of the source/drain features 108. Especially, the source/drain features 108 include one or more semiconductor materials to provide better integration with the LDD features 1010 and the channel member 104 (particularly, the 2D material layer 1000) with reduced contact resistance to the channel member 104. This is because the 2D material layer 1000 has a limited thickness and reduced contact area with the source/drain feature. In some embodiments, the source/drain features 108 include silicon doped with phosphorous or arsenic for n-type FETs or silicon germanium doped with boron for p-type FETs.

Figure 5F:
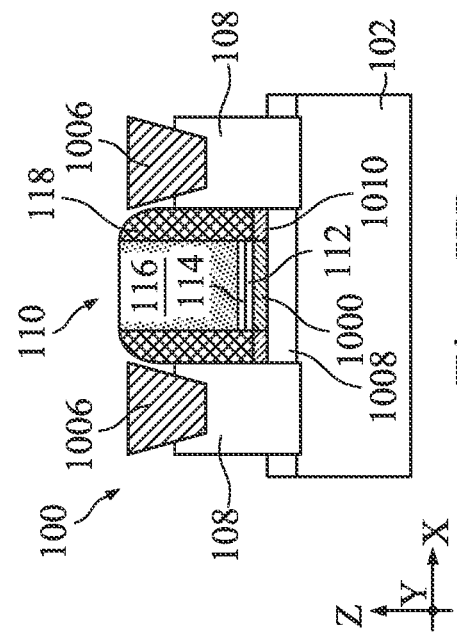

Referring to FIGS. 4 and 5F, the second method 300 includes a block 312 where the gate stack 110 is formed over the channel member 104. As the composition and formation of the gate stack 110 has been described above with respect to block 212 of the first method 200 above, detailed description of the gate stack 110 is omitted here for brevity. Similar to the semiconductor device 100 shown in FIG. 3F, the gate stack 110 in FIG. 5F is disposed over the channel member 104 that includes the 2D material layer 1000 and the fin structure 103. The fin structure 103 and the 2D material layer 1000 provide two independent channels that may be simultaneously activated by the same gate stack 110. For similar reasons, the semiconductor device 100 in FIG. 5F is a DCFET. Because current is allowed to flow in the channel formed in the fin structure 103 and the channel formed in the 2D material layer 1000, the effective channel width may be increased by a factor between about 1.8 and 2 and the On-state current may also be increased by a factor between about 1.8 and 2, compared to a similar semiconductor device that does not have the 2D material layer 1000 in the channel region.

Figure 5G:
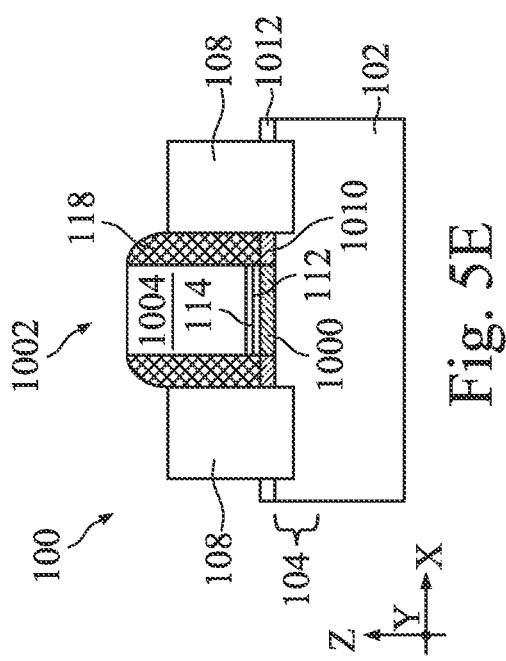

Referring now to FIGS. 4 and 5G, the second method 300 includes a block 314 where further processes are performed. In some embodiments, such further processes may include formation of source/drain contacts 1006, formation of gate contacts, formation of a further ILD layer, formation of source/drain contact vias, and formation of further interconnect structures.

In other embodiments, the 2D material layer 1000 is formed at block 312. The block 312 includes removing the dummy gate stack 1002, resulting in the gate trench; recessing the fin structure 103 in the gate trench by etching; selectively depositing the 2D material layer in the gate trench; depositing gate materials to form the gate stack 110; and performing a CMP process.

Figure 5H:
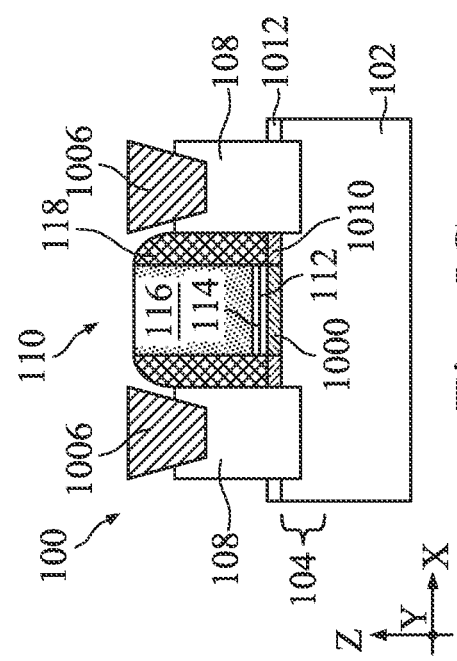

Alternatively, the semiconductor device 100 may further include a dielectric layer 1008 disposed under the 2D material layer 1000, as illustrated in FIG. 5H. Particularly, the dielectric layer 1008 is interposed between the first channel layer (the fin structure 103 above the isolation feature 106) and the second channel layer (the 2D material layer 1000). The dielectric layer 1008 may include silicon oxide, other suitable dielectric material or a combination thereof. The semiconductor device 100 with the inserted dielectric layer 1008 in FIG. 5H can be formed by any suitable method. In some embodiments, the second method 300 is modified to form the semiconductor device 100 of FIG. 5H, as described below. The block 306 is modified to include epitaxially growing a silicon germanium layer on the substrate; and then depositing the 2D material layer 1000 on the silicon germanium layer. The block 310 includes patterning the fin structure 103 to form trenches in the source/drain regions 104SD; performing a selective etching process to remove the silicon germanium layer through the trenches; depositing a dielectric layer (such as silicon oxide) in the trenches; and thereafter performing epitaxial growth to form source and drain features 108. The selective etching process may further includes selectively oxidizing the silicon germanium layer and selectively etching oxidized silicon germanium layer. In alternative embodiments, the block 310 includes patterning the fin structure 103 to form trenches in the source/drain regions 104SD; performing a selective oxidization process to oxidize the silicon germanium layer through the trenches, thereby forming silicon germanium oxide as the dielectric layer 1008; and thereafter performing epitaxial growth to form source and drain features 108. In some embodiments, the dielectric layer 1008 may be formed by another method, such as one described in the method 930, particularly block 934 of FIG. 18. As described above with FIG. 3H, when the dielectric layer 1008 is present and thick enough, the channel member 104 includes only the 2D material layer 1000 as a single channel while bulk semiconductor underlying the dielectric layer 1008 is suppressed and not turned on.

Figure 6:
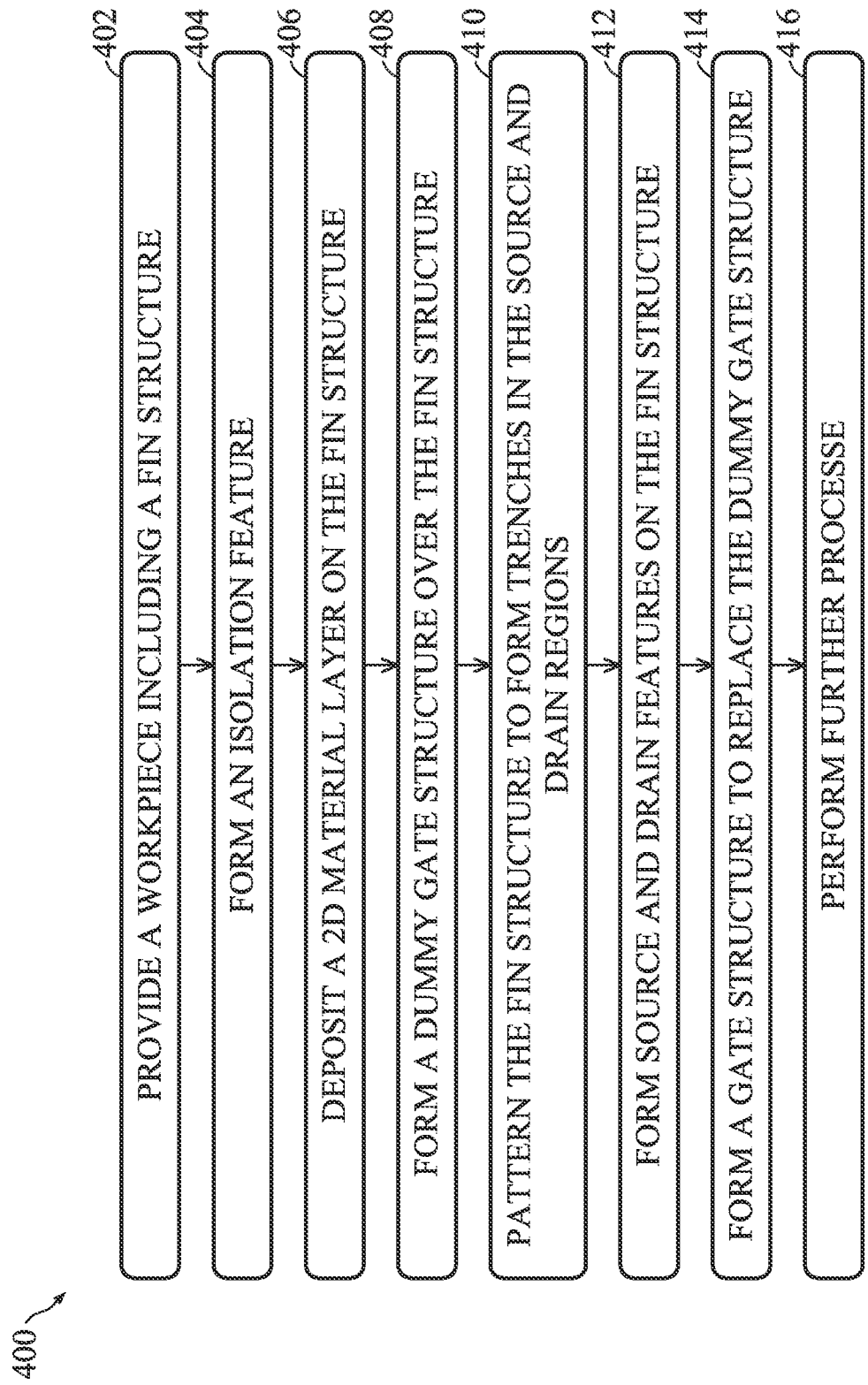
FIG. 6 illustrates a flowchart of a third method of fabricating a semiconductor device, according to one or more aspects of the present disclosure.
Figure 7A:
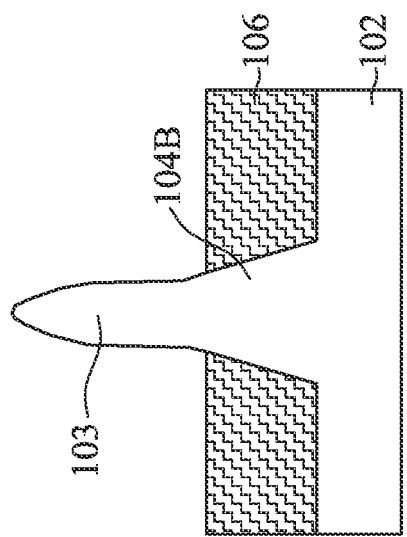
FIGS. 7A-7O illustrate fragmentary cross-sectional views of a workpiece at various fabrication stages of the third method in FIG. 6, according to one or more aspects of the present disclosure.

The semiconductor device 100 may also be formed using a method like the third method 400 shown in FIG. 6. Referring to FIGS. 6, 7A and 7E, the third method 400 includes a block 402 where a workpiece 100 is provided. As the workpiece 100 has been described above with respect to the first method 200, details of the workpiece 100 is omitted here for brevity.

Figure 7B:
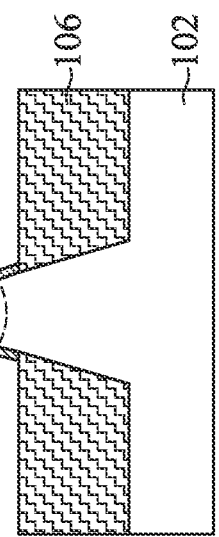
Figure 7C:
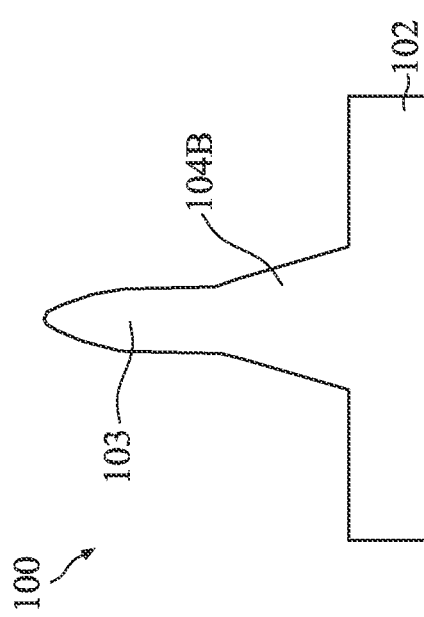

Referring to FIGS. 6 and 7B, the third method 400 includes a block 404 where an isolation feature 106 is formed. Operations at block 404 is similar to those at block 304 in the second method 300. Detailed descriptions of the composition and formation of the isolation feature 106 is omitted here for brevity. As shown in FIG. 7B, the isolation feature 106 is in direct contact with sidewalls of the base portion 104B and top surface of the substrate 102. No 2D material layer 1000 is disposed between the substrate 102 and the isolation feature 106.

Figure 7D:
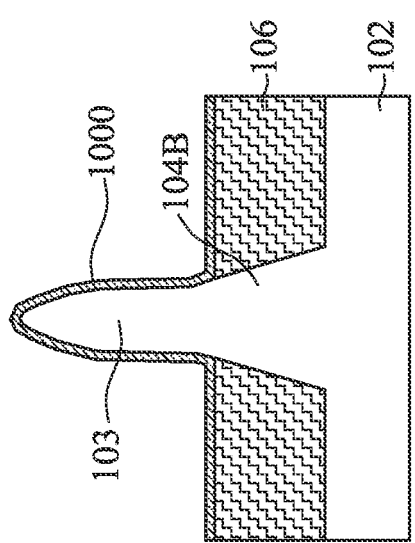
Figures 7E, 7F, 7G, 7H:
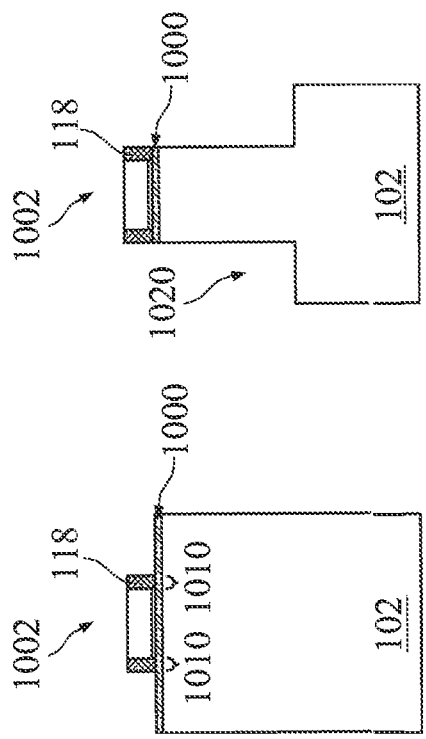

Referring to FIGS. 6, 7C, 7D and 7F, the third method 400 includes a block 406 where a 2D material layer 1000 is deposited on the fin structure 103 and the isolation feature 106. In some embodiments, the deposition at block 406 is not selective to the fin structure 103 and blanketly deposits the 2D material layer 1000 on the fin structure 103 and the top surface of the isolation feature 106. In some embodiments, the 2D material layer 1000 may include graphene, tungsten sulfide ($WS_2$), tungsten telluride ($WTe_2$), tungsten selenide ($WSe_2$), molybdenum sulfide ($MoS_2$), molybdenum telluride ($MoTe_2$), molybdenum selenide ($MoSe_2$), black phosphorus, or a suitable 2D material that has substantial band alignment with the semiconductor material of the fin structure 103. The 2D material layer 1000 may be doped with a dopant, such as sulfur (S), selenium (Se), tellurium (Te), zirconium (Zr), hafnium (Hf), tungsten (W), molybdenum (Mo), boron (B), oxygen (O), nitrogen (N), carbon (C), silicon (Si), or tin (Sn). At block 406, the 2D material layer 1000 may be deposited using epitaxial growth, CVD or ALD. In furtherance of the embodiments, the 2D material layer 1000 may be further patterned such that the portions of the 2D material layer 1000 disposed on the isolation feature 106 are removed, as illustrated in FIG. 7D. The patterning process includes lithography process and etching.

In some embodiments, the deposition at block 406 is selective deposition that selectively deposits the 2D material layer 1000 on the fin structure 103 as illustrated in FIG. 7D. In this case, the operations at block 406 are similar to those at block 306. Detailed descriptions of the composition and formation of the 2D material layer 1000 is omitted here for brevity.

Referring to FIGS. 6 and 7G, the third method 400 includes a block 408 to form a dummy gate structure. In some embodiments, the dummy gate structure includes a dummy gate stack 1002 and a gate spacer layer 118. The formation of the dummy gate structure includes forming a dummy gate stack 1002 over the channel member 104, which further include deposition of dummy gate material, and patterning the dummy gate material to form the dummy gate stack 1002 by a procedure that includes a lithography process and etch and may further include using a hard mask as an etch mask. In some embodiments where a gate-last process is adopted, the dummy gate stack 1002 may include the interfacial layer 112, a high-k dielectric layer 114, and a dummy gate electrode 1004, such as a polysilicon layer. In some embodiments where a high-k-last process is adopted, the dummy gate stack 1102 may include a dielectric layer, such as silicon oxide, and a dummy gate electrode 1004, such as a polysilicon layer.

The block 408 may further include forming LDD features 1010 in the 2D material layer 1000 by a suitable method, such as ion implantation. In the depicted embodiment, the formation of the LDD features 1010 is implemented between the formation of the dummy gate stack 1002 and the formation of the gate spacer layer 118 (to be described below). Like the fin structure 103, the 2D material layer may be doped with a dopant, such as sulfur (S), selenium (Se), tellurium (Te), zirconium (Zr), hafnium (Hf), tungsten (W), molybdenum (Mo), boron (B), oxygen (O), nitrogen (N), carbon (C), silicon (Si), or tin (Sn).

The block 408 may further include forming a gate spacer layer 118 on the sidewalls of the dummy gate stack 1002 by depositing the gate spacer layer 118 and etching back of the gate spacer layer 118 by an anisotropic etching, such as plasma etching, as illustrated in FIG. 7G. The formation of the gate spacer layer 118 is performed after the formation of the LDD features 1010.

Referring to FIGS. 6 and 7H, the third method 400 includes a block 410 to pattern the fin structure 103 to form trenches 1020 within the source/drain regions 104SD. The patterning process applied to the fin structure at block 410 includes a lithography process and etching and may use a patterned mask as an etch mask. The dummy gate structure also functions as an etch mask during the patterning process such that the trenches 1020 are aligned to the edges of the gate spacer layer 118.

Figures 7I, 7J, 7K, 7L:
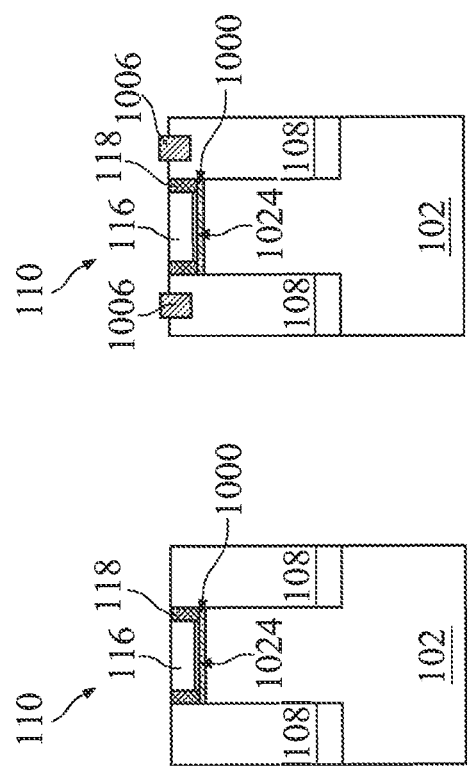

Referring to FIGS. 6 and 7I, the third method 400 includes a block 412 to form the source/drain features 108, such as by epitaxial growth. Especially, the source/drain features 108 include one or more semiconductor materials to provide better integration with the LDD features 1010 and the channel member 104 (particularly, the 2D material layer 1000) with reduced contact resistance to the channel member 104. This is because the 2D material layer 1000 has a limited thickness and reduced contact area with the source/drain feature. In some embodiments, the source/drain features 108 include silicon doped with phosphorous or arsenic for n-type FETs or silicon germanium doped with boron for p-type FETs. In the depicted embodiment, the epitaxial growth is controlled such that the source and drain features 108 are formed with a top surface substantially matching the top surface of the dummy gate stack 1002, as illustrated in FIG. 7I.

Referring to FIGS. 6, 7J and 7K, the third method 400 includes a block 414 where the gate stack 110 is formed over the channel member 104. As the composition and formation of the gate stack 110 has been described above with respect to block 212 of the first method 200 above, detailed description of the gate stack 110 is omitted here for brevity. Similar to the semiconductor device 100 shown in FIG. 3F, the gate stack 110 in FIG. 7K is disposed over the channel member 104 that includes the 2D material layer 1000 and the fin structure 103. The fin structure 103 and the 2D material layer 1000 provide two independent channels that may be simultaneously activated by the same gate stack 110. For similar reasons, the semiconductor device 100 in FIG. 7K is a DCFET. Because current is allowed to flow in the channel formed in the fin structure 103 and the channel formed in the 2D material layer 1000, the effective channel width may be increased by a factor between about 1.8 and 2 and the On-state current may also be increased by a factor between about 1.8 and 2, compared to a similar semiconductor device that does not have the 2D material layer 1000 in the channel region.

The operations at block 414 includes removing the dummy gate stack 1002, resulting in a gate trench 1022 as illustrated in FIG. 7J; and the formation of the gate structure 116 as illustrated in FIG. 7K. Particularly, the gate trench 1022 is defined by the sidewalls of the gate spacer layer 118 and the source and drain features 108 as the source and drain features 108 are extended up to the top surface of the dummy gate stack 1002. The formation of the gate stack 110 includes depositing the gate dielectric 1024 and the gate electrode 116; and performing a CMP process that removes excessive gate materials disposed on the gate spacer layer 118 and the source and drain features 108 and planarizes the top surface. In some embodiments, the gate dielectric 1024 includes an interfacial layer 112 and a high-k dielectric layer 114, and the gate electrode 116 includes multiple conductive materials, such as a work function metal layer and a fill metal layer. Accordingly, the source and drain features 108 have a top surface being coplanar with the top surface of the gate stack 110.

Referring now to FIGS. 6 and 7L, the third method 400 includes a block 416 where further processes are performed. In some embodiments, such further processes may include formation of source/drain contacts 1006, formation of gate contacts, formation of a further ILD layer, formation of source/drain contact vias, and formation of further interconnect structures.

Figure 7O:
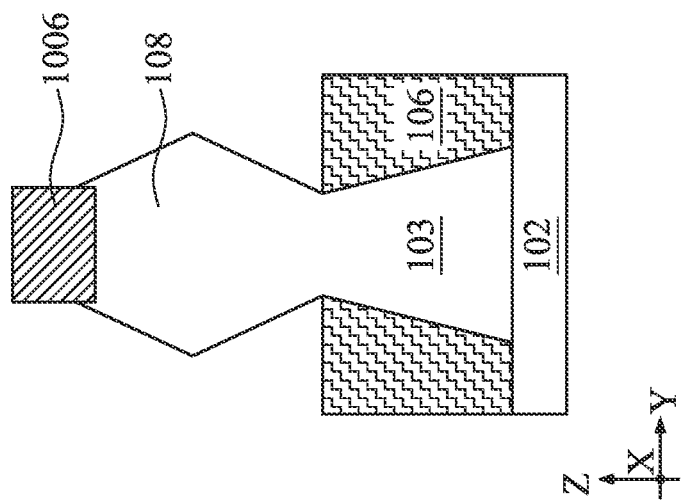
Figure 7N:
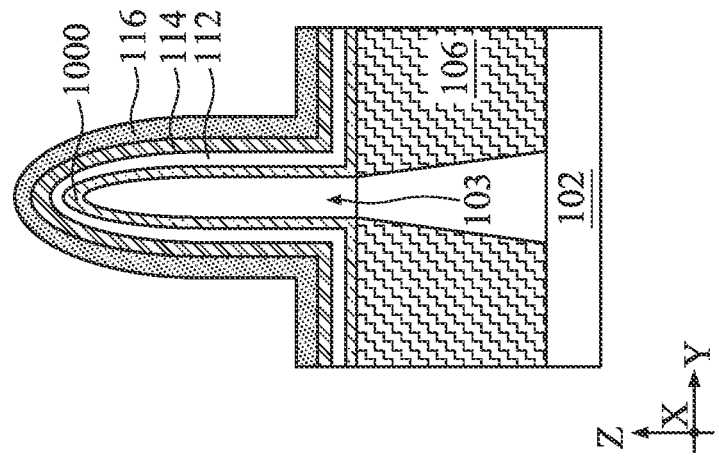
Figure 7M:
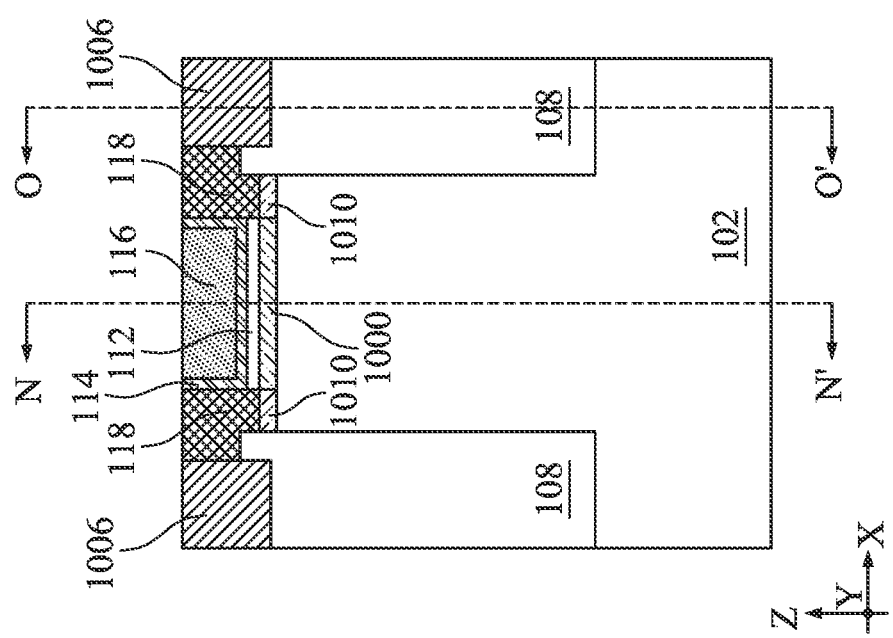

The semiconductor device 100 of FIG. 7L is further illustrated in FIGS. 7M, 7N and 7O. FIG. 7M is a sectional view of the semiconductor device 100, 7N is a sectional view of the semiconductor device 100 in FIG. 7L along the dashed line NN'; and FIG. 7O is a sectional view of the semiconductor device 100 in FIG. 7L along the dashed line OO'. Particularly, the gate dielectric layer 1024 includes an interfacial layer 112 and a high-k dielectric layer 114. The high-k dielectric layer 114 is U-shaped to wrap the gate electrode 116.

Figure 8:
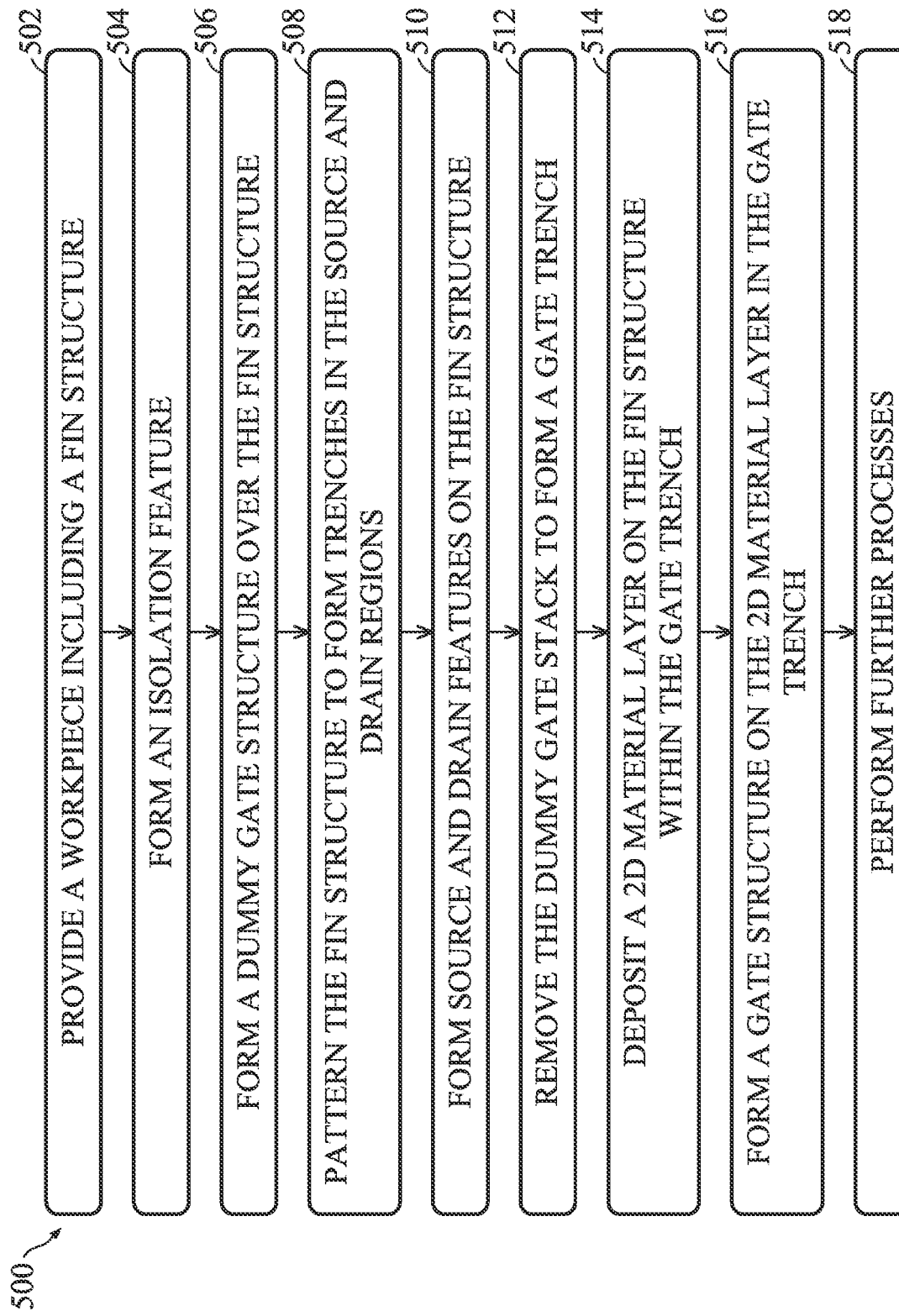
FIG. 8 illustrates a flowchart of a fourth method of fabricating a semiconductor device, according to one or more aspects of the present disclosure.

The semiconductor device 100 in FIG. 1 may also be formed using a method like the fourth method 500 shown in FIG. 8. Referring to FIGS. 8, 9A and 9C, the fourth method 500 includes a block 502 where a workpiece 100 is provided. As the workpiece 100 has been described above with respect to the first method 200, details of the workpiece 100 is omitted here for brevity.

Figure 9B:
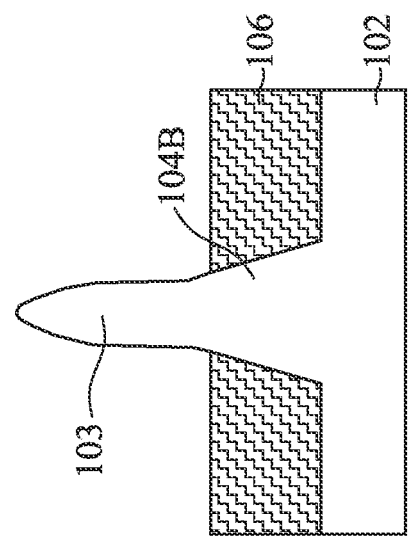
FIGS. 9A-9N illustrate fragmentary cross-sectional views of a workpiece at various fabrication stages of the fourth method in FIG. 8, according to one or more aspects of the present disclosure.
Figure 9A:
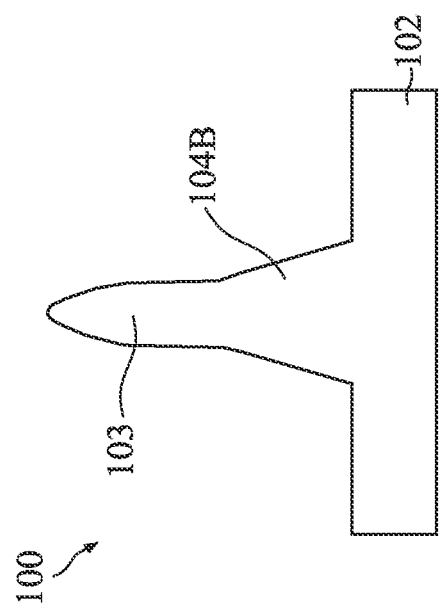
Figure 9C:
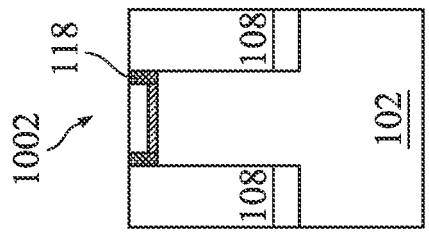

Referring to FIGS. 8 and 9B, the fourth method 500 includes a block 504 where an isolation feature 106 is formed. Operations at block 504 is similar to those at block 304 in the second method 300. Detailed descriptions of the composition and formation of the isolation feature 106 is omitted here for brevity. As shown in FIG. 9B, the isolation feature 106 is in direct contact with sidewalls of the base portion 104B and top surface of the substrate 102. No 2D material layer 1000 is disposed between the substrate 102 and the isolation feature 106.

Figure 9D:
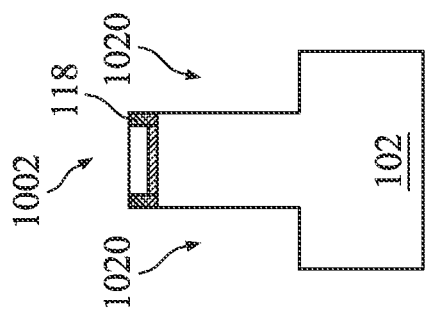

Referring to FIGS. 8 and 9D, the fourth method 500 includes a block 506 to form a dummy gate structure. In some embodiments, the dummy gate structure includes a dummy gate stack 1002 and a gate spacer layer 118. The formation of the dummy gate structure includes forming a dummy gate stack 1002 over the fin structure 103, which further include deposition of dummy gate material, and patterning the dummy gate material to form the dummy gate stack 1002 by a procedure that includes a lithography process and etch and may further include using a hard mask as an etch mask. In some embodiments where a gate-last process is adopted, the dummy gate stack 1002 may include the interfacial layer 112, a high-k dielectric layer 114, and a dummy gate electrode 1004, such as a polysilicon layer. In some embodiments where a high-k-last process is adopted, the dummy gate stack 1102 may include a dielectric layer, such as silicon oxide, and a dummy gate electrode 1004, such as a polysilicon layer.

The block 506 also includes forming a gate spacer layer 118 on the sidewalls of the dummy gate stack 1002 by depositing the gate spacer layer 118 and etching back of the gate spacer layer 118 by an anisotropic etching, such as plasma etching, as illustrated in FIG. 9D. The dummy gate stack 1002 and the gate spacer layer 118 are disposed on and directly contact the fin structure 103.

Figure 9E:
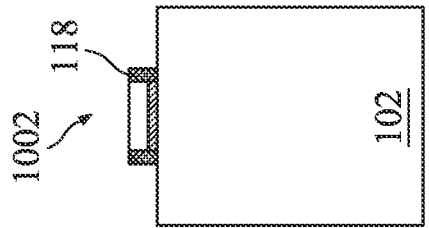

Referring to FIGS. 8 and 9E, the fourth method 500 includes a block 508 to pattern the fin structure 103 to form trenches (recesses) 1020 within the source/drain regions 104SD. The patterning process applied to the fin structure at block 410 includes a lithography process and etching and may use a patterned mask as an etch mask. The dummy gate structure also functions as an etch mask during the patterning process such that the trenches 1020 are aligned to the edges of the gate spacer layer 118.

Figure 9F:

Referring to FIGS. 8 and 9F, the fourth method 500 includes a block 510 to form the source/drain features 108, such as by epitaxial growth. Especially, the source/drain features 108 include one or more semiconductor materials. In some embodiments, the source/drain features 108 include silicon doped with phosphorous or arsenic for n-type FETs or silicon germanium doped with boron for p-type FETs. In the depicted embodiment, the epitaxial growth is controlled such that the source and drain features 108 are formed with a top surface substantially matching the top surface of the dummy gate stack 1002, as illustrated in FIG. 9F.

Figure 9G:
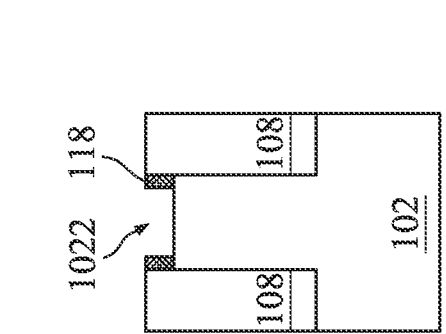

Referring to FIGS. 8 and 9G, the fourth method 500 includes a block 512 where the dummy gate stack 1002 is removed by an etching process, resulting in a gate trench 1022. The gate trench 1022 is defined by the gate spacer layer 118 and the source and drain features 108.

Figure 9H:
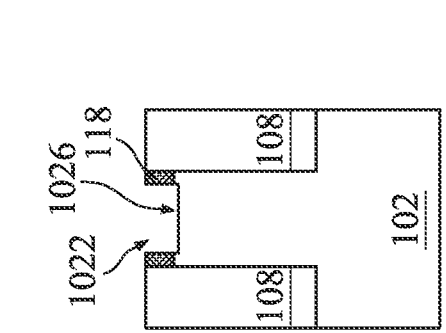
Figure 9I:
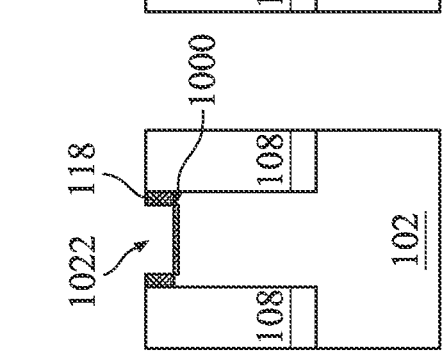

Referring to FIGS. 8, 9H and 9I, the fourth method 500 includes a block 514 where a 2D material layer 1000 is deposited on the fin structure 103 with the gate trench 1022. In some embodiments, the operations at block 514 include further recessing the fin structure 103 within the gate trench 1022 by a suitable etching process. For example, KOH solution may be used to recess the fin structure 103 where the top portion of the fin structure 103 is silicon, thereby forming a recess 1026 of the fin structure in the gate trench 1022, as illustrated in FIG. 9H.

Figure 9J:
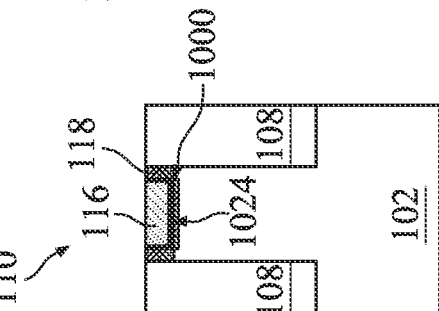

The operations at block 514 also include depositing the 2D material layer 1000 in the recess 1026 of the fin structure 103 by a suitable method, such as a selective deposition. The selective deposition deposits the 2D material layer 1000 selectively on the surface of the fin structure 103 but no deposition on other materials (including the gate spacer layer 118). In some embodiments where the 2D material layer 1000 may be additionally deposited on the top surfaces of the source and drain features 108 since the source and drain features 108 and the fin structure 103 may include similar or same material (such as silicon). Those portions of the 2D material layer 1000 on the source and drain features 108 can be removed by a anisotropic but is removed at later stage, such as by a CMP process during the operations to form the gate stack 110 (to be described later). The epitaxial growth may be controlled such that the 2D material layer 1000 substantially fills in the recess 1026 and reaches substantially the same height of the fin structure 103 before the recessing process, as illustrated in FIG. 9J. In some embodiments, the 2D material layer 1000 may include graphene, tungsten sulfide ($WS_2$), tungsten telluride ($WTe_2$), tungsten selenide ($WSe_2$), molybdenum sulfide ($MoS_2$), molybdenum telluride ($MoTe_2$), molybdenum selenide ($MoSe_2$), black phosphorus, or a suitable 2D material that has substantial band alignment with the semiconductor material of the fin structure 103. The 2D material layer 1000 may be doped with a dopant, such as sulfur (S), selenium (Se), tellurium (Te), zirconium (Zr), hafnium (Hf), tungsten (W), molybdenum (Mo), boron (B), oxygen (O), nitrogen (N), carbon (C), silicon (Si), or tin (Sn). At block 508, the 2D material layer 1000 may be deposited using epitaxial growth, CVD or ALD.

Referring to FIGS. 8 and 9J, the fourth method 500 includes a block 516 where the gate stack 110 is formed over the channel member 104. Particularly, the gate stack including the gate dielectric 1024 and the gate electrode 116 is formed in the gate trench 1022 by depositions. In the depicted embodiment, the gate electrode 116 and the gate dielectric 1024 are aligned with the 2D material layer 1000. Each of the gate electrode 116, the gate dielectric 1024 and the 2D material layer 1000 spans between the inner edges of the gate spacer layer 118 along X direction. Furthermore, the top surface of the 2D material layer 1000 is coplanar with the bottom surface of the gate spacer layer 118 according to the depicted embodiment. As the gate dielectric 1024 is deposited in the gate trench 1022 and is disposed on the bottom surface and sidewalls of the gate trench 1022, the gate dielectric layer 1024 may be U-shaped conformal to the profile of the gate trench 1022.

Figure 9K:
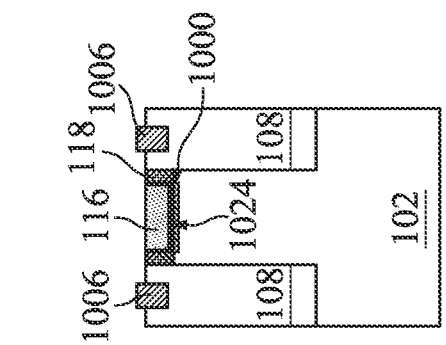

The gate trench 1022 is defined by the sidewalls of the gate spacer layer 118 and the source and drain features 108 as the source and drain features 108 are extended up to the top surface of the gate spacer layer 118. The formation of the gate stack 110 includes depositing the gate dielectric 1024 and the gate electrode 116; and performing a CMP process that removes excessive gate materials disposed on the source and drain features 108 and planarizes the top surface. The CMP process may also remove the 2D material layer 1000 if it is disposed on the source and drain features 108. In some embodiments, the gate dielectric 1024 includes an interfacial layer 112 and a high-k dielectric layer 114, and the gate electrode 116 includes multiple conductive materials, such as a work function metal layer and a fill metal layer. Accordingly, the source and drain features 108 have a top surface being coplanar with the top surface of the gate stack 110. As the composition and formation of the gate stack 110 has been described above with respect to block 212 of the first method 200 above, detailed description of the gate stack 110 is omitted here for brevity. Similar to the semiconductor device 100 shown in FIG. 3F, the gate stack 110 in FIG. 9K is disposed over the channel member 104 that includes the 2D material layer 1000 and the fin structure 103. The fin structure 103 and the 2D material layer 1000 provide two independent channels that may be simultaneously activated by the same gate stack 110. For similar reasons, the semiconductor device 100 in FIG. 9K is a DCFET. Because current is allowed to flow in the channel formed in the fin structure 103 and the channel formed in the 2D material layer 1000, the effective channel width may be increased by a factor between about 1.8 and 2 and the On-state current may also be increased by a factor between about 1.8 and 2, compared to a similar semiconductor device that does not have the 2D material layer 1000 in the channel region.

Referring now to FIGS. 8 and 9K, the fourth method 500 includes a block 518 where further processes are performed. In some embodiments, such further processes may include formation of source/drain contacts 1006, formation of gate contacts, formation of a further ILD layer, formation of source/drain contact vias, and formation of further interconnect structures.

Figure 9N:
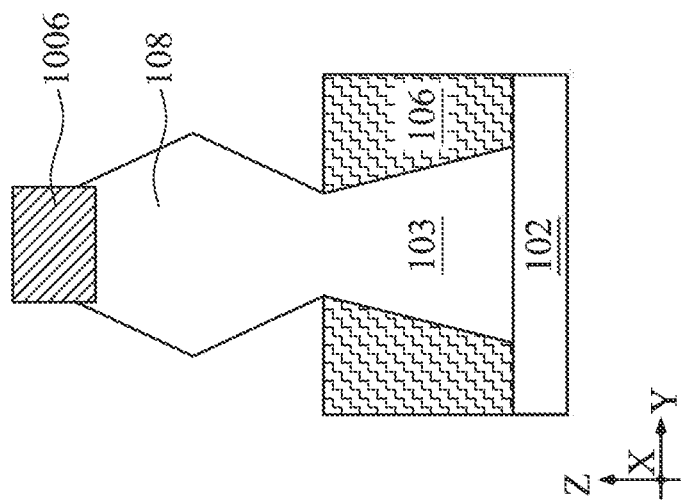
Figure 9M:
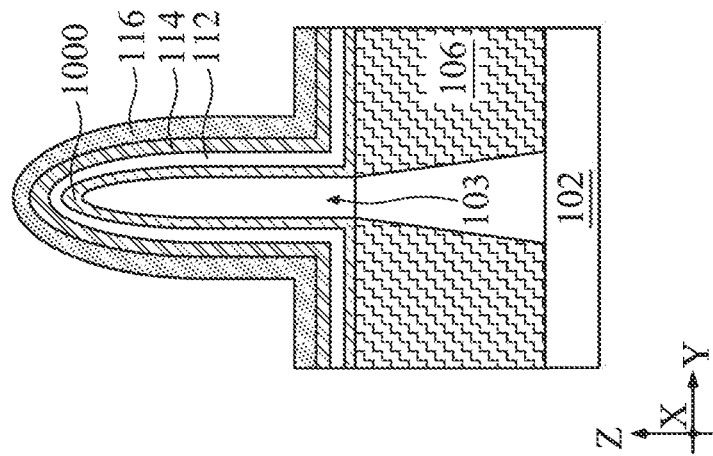
Figure 9L:
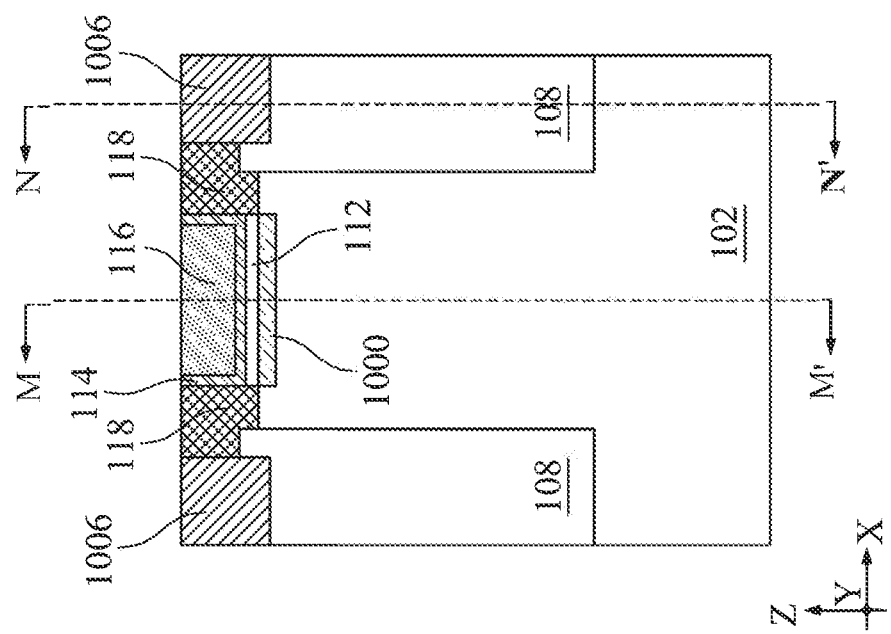

The semiconductor device 100 of FIG. 9K is further illustrated in FIGS. 9L, 9M and 9N. FIG. 9L is a sectional view of the semiconductor device 100; 9M is a sectional view of the semiconductor device 100 in FIG. 9L along the dashed line MM'; and FIG. 9N is a sectional view of the semiconductor device 100 in FIG. 9L along the dashed line NN'. Particularly, the gate dielectric layer 1024 includes an interfacial layer 112 and a high-k dielectric layer 114. The high-k dielectric layer 114 is U-shaped to wrap the gate electrode 116.

Figure 10:
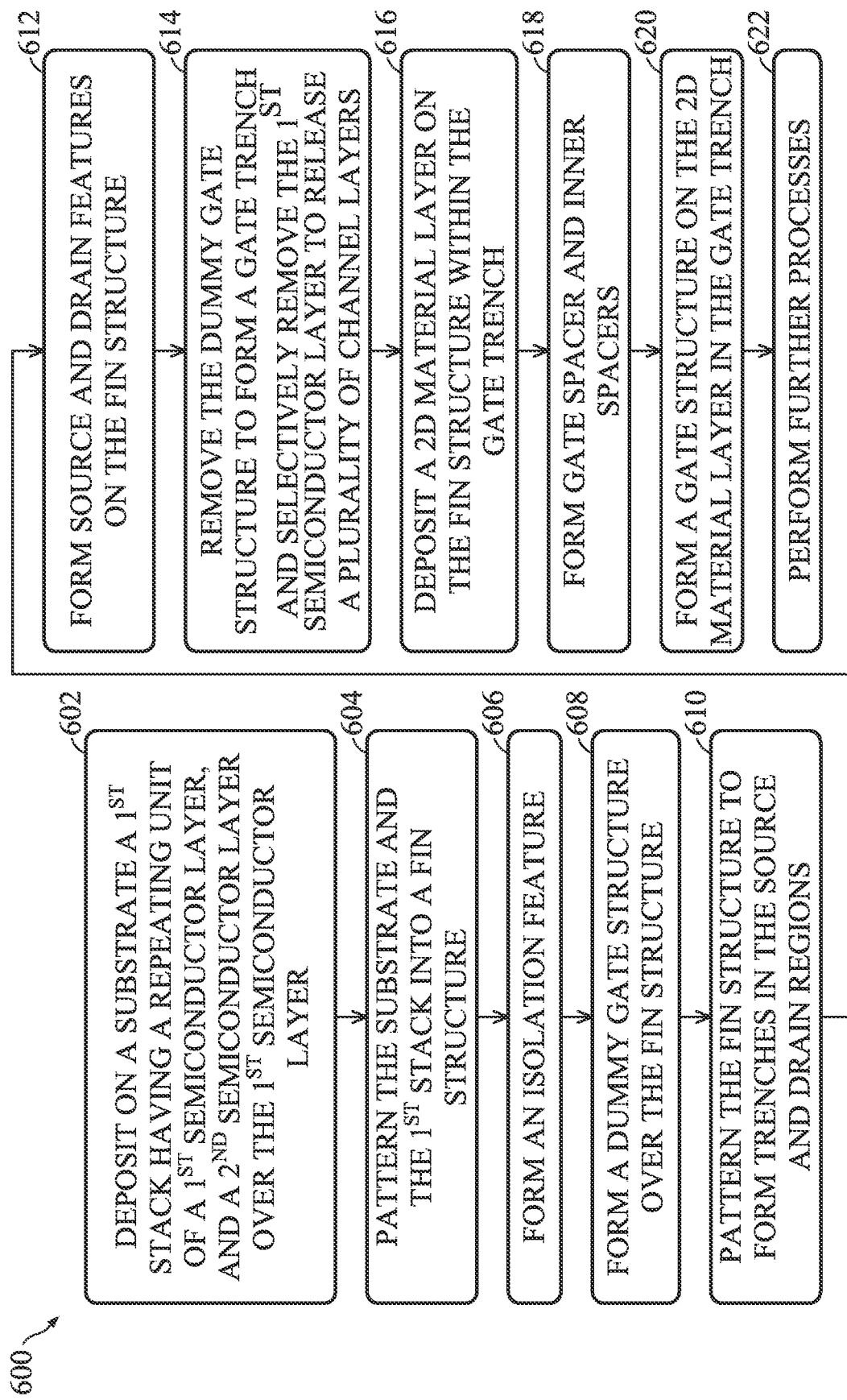
FIG. 10 illustrates a flowchart of a fifth method of fabricating a semiconductor device, according to one or more aspects of the present disclosure.

When the semiconductor device 100 in FIG. 1 is an MBC transistor, the semiconductor device 100 may also be formed using a method like the fifth method 600 shown in FIG. 10. Referring to FIGS. 10, 11A and 11D, the fifth method 600 includes a block 602 where a first stack 1100 is deposited on a substrate 102. As shown in FIG. 11A, the first stack 1100 includes a plurality of repeating units, each of which includes a first semiconductor layer 124, and a second semiconductor layer 126. In the embodiments represented in FIG. 11A, the first stack 1100 includes three repeating units each having a first semiconductor layer 124 and a second semiconductor layer 126. In some embodiments, the first semiconductor layer 124 may be referred to as a sacrificial layer 124 and may include silicon germanium (SiGe). In some embodiments, the second semiconductor layer 126 may be referred to a channel layer 126 and may include silicon (Si). At block 602, the first semiconductor layer 124 and the second semiconductor layer 126 may be deposited using epitaxial growth.

Referring to FIGS. 10 and 11B, the fifth method 600 includes a block 604 where the substrate 102 and the first stack 1100 are patterned into a first fin-like structure 1040. As shown in FIG. 11B, the first fin-like structure 1040 includes the base portion 104B and a top portion formed from the first stack 1100. The first fin-like structure 1040 extends lengthwise along the X direction. The top portion therefore includes the sacrificial layers 124, and the channel layers 126. In some embodiments, the patterning at block 604 may include an anisotropic etching process, such as a reactive-ion etching (RIE) process. An example RIE process may use a fluorocarbon such as carbon tetrafluoride ($CF_4$), trifluoromethane ($CHF_3$), octafluoropropane ($C_3H_8$), or sulfur hexafluoride ($SF_6$).

Referring to FIGS. 10 and 11C, the fifth method 600 includes a block 606 where an isolation feature 106 is formed. In some embodiments, the isolation feature 106 may include a dielectric material such as silicon oxide, silicon nitride, silicon oxynitride, fluorine-doped silicate glass (FSG), a low-k dielectric, combinations thereof, and/or other suitable materials. In an example process, the dielectric material of the isolation feature 106 is first blanketly deposited over the workpiece 100, including the first fin-like structure 1040, by spin-on coating, CVD or other suitable deposition method. Thereafter, the blanketly deposited dielectric material is planarized in a planarization process, such as a chemical mechanical polishing (CMP) process. The planarized dielectric material is then selectively recessed or etched back such only the base portion 104B is disposed in the isolation feature 106, as shown in FIG. 11C. The isolation feature 106 is in direct contact with sidewalls of base portion 104B and the top surface of the substrate 102.

Referring to FIGS. 10 and 11E, the fifth method 600 includes a block 608 to form a dummy gate structure. In some embodiments, the dummy gate structure includes a dummy gate stack 1002 and a gate spacer layer 118. The formation of the dummy gate structure includes forming a dummy gate stack 1002 over the fin structure 103, which further include deposition of dummy gate material, and patterning the dummy gate material to form the dummy gate stack 1002 by a procedure that includes a lithography process and etch and may further include using a hard mask as an etch mask. In some embodiments where a gate-last process is adopted, the dummy gate stack 1002 may include the interfacial layer 112, a high-k dielectric layer 114, and a dummy gate electrode 1004, such as a polysilicon layer. In some embodiments where a high-k-last process is adopted, the dummy gate stack 1102 may include a dielectric layer, such as silicon oxide, and a dummy gate electrode 1004, such as a polysilicon layer.

The block 608 also includes forming a gate spacer layer 118 on the sidewalls of the dummy gate stack 1002 by depositing the gate spacer layer 118 and etching back of the gate spacer layer 118 by an anisotropic etching, such as plasma etching, as illustrated in FIG. 11E. The dummy gate stack 1002 and the gate spacer layer 118 are disposed on and directly contact the first stack 1100.

Referring to FIGS. 10 and 11F, the fifth method 600 includes a block 610 to pattern the first stack 1100 to form trenches 1020 within the source/drain regions 104SD. The patterning process applied to the first stack 1100 at block 610 includes a lithography process and etching, and additionally may use a patterned mask as an etch mask. The dummy gate structure also functions as an etch mask during the patterning process such that the trenches 1020 are aligned to the edges of the gate spacer layer 118.

Referring to FIGS. 10 and 11G, the fifth method 600 includes a block 612 to form the source/drain features 108, such as by epitaxial growth. Especially, the source/drain features 108 include one or more semiconductor materials. In some embodiments, the source/drain features 108 include silicon doped with phosphorous or arsenic for n-type FETs or silicon germanium doped with boron for p-type FETs. In the depicted embodiment, the epitaxial growth is controlled such that the source and drain features 108 are formed with a top surface higher than the top surface of the first stack 1100 so that the source and drain features 108 are connected to all second semiconductor layers 126, as illustrated in FIG. 11G.

Referring to FIGS. 10 and 11H, the fifth method 600 includes a block 614 where the dummy gate structure is removed by an etching process, resulting in a gate trench 1022. Particularly, both the dummy gate stack 1002 and the gate spacer layer 118 are removed at block 614 by one or more etching steps. The gate trench 1022 is defined by and spans between the source and drain features 108.

At block 614, the first semiconductor layers 124 are selectively removed from the gate trench 1022 to release the plurality of second semiconductor layers 126. In embodiments where the first semiconductor layer 124 is formed of silicon germanium and the second semiconductor layer 126 is formed of silicon, the selective removal of the first semiconductor layers 124 may include a SiGe oxidation process followed by a SiGe oxide removal. In those embodiments, the SiGe oxidation process may include use of ozone. In some implementations, the selective removal of the first semiconductor layer 124 may include use of a selective isotropic etching process (e.g., a selective dry etching process or a selective wet etching process). In some embodiments, the selective dry etching process may include use of one or more fluorine-based etchants, such as fluorine gas or hydrofluorocarbons. In some embodiments, the selective wet etching process may include a hydro fluoride (HF) or NH$_4$OH etchant. As shown in FIG. 11D, due to the arrangement of the repeating unit in the first stack 1100, the removal of the first semiconductor layers 124 (i.e., sacrificial layers 124) releases a plurality of channel members 104. Each of the channel members 104 includes a second semiconductor layer 126 (i.e., a channel layer 126).

Referring to FIGS. 10 and 11I, the fifth method 600 includes a block 616 where 2D material layers 1000 are formed on the surfaces of the second semiconductor layers 126 through the gate trench 1022 by a suitable method, such as selective deposition. As the composition and formation of the 2D material layer 1000 has been described above with respect to block 514 of the fourth method 500 above, detailed description of the 2D material layers 1000 is omitted here for brevity. Particularly, the 2D material layers 1000 are formed on top surface and bottom surface of each of the second semiconductor layers 126. Thus, each of the channel members 104 includes a second semiconductor layer 126 (i.e., a channel layer 126) and 2D material layers 1000 disposed on top surface and the bottom surface of the corresponding second semiconductor layer 126.

Referring to FIGS. 10, 11J and 11K, the fifth method 600 includes a block 618 where a spacer layer 128 is formed on the sidewalls of the source and drain features 108 through the gate trench 1022. The spacer layer 128 includes one or more dielectric material, such as silicon oxide, silicon nitride, silicon oxynitride, other suitable dielectric material or a combination thereof. The formation of the spacer layer 128 includes deposition of the spacer layer 128 to fill the gate trench 1022, as illustrated in FIG. 11J; and patterning the spacer layer 128 to form various spacers, as illustrated in FIG. 11K. In some embodiments, after the deposition of the spacer layer 128, a CMP process may be additionally applied to the spacer layer 128 to planarize the top surface. The patterning process includes a lithography process and etching, and additionally may use a patterned mask layer. Accordingly, the width of the spacers can be properly controlled. In some embodiments, the patterning of the spacer layer 128 may include an anisotropic etching process applied to the spacer layer 128. Thus, the spacer layer 128 are substantially removed from the 2D material layers 1000 except for the portions on the sidewalls of the source and drain features 108. Accordingly, the patterned spacer layer 128 functions as inner spacers (portions between the second semiconductor layers 126) and gate spacer (portions above the top one of the second semiconductor layer 126).

Referring to FIGS. 10 and 11L, the fifth method 600 includes a block 620 where a gate stack 110 is formed over and around each of the plurality of channel members 104. As described above, the gate stack 110 includes a gate dielectric layer 1024 and a gate electrode 116 over the gate dielectric layer 1024. In the depicted embodiment, the gate dielectric layer 1024 may include an interfacial layer 112, and a high-k dielectric layer 114 over the interfacial layer 112. As the compositions of the interfacial layer 112, the high-k dielectric layer 114, and the gate electrode 116 have been described above respect to block 210 of the first method 200, detailed description of the interfacial layer 112, the high-k dielectric layer 114, and the gate electrode 116 are omitted here for brevity. As shown in FIG. 11L, the gate dielectric layer 1024 including the interfacial layer 112, the high-k dielectric layer 114 may be sequentially deposited around the channel members 104 using CVD or ALD. Then, as shown in FIG. 11L, the gate electrode 116 may be deposited using PVD, CVD, ALD, or electroless plating. Due to the 2D properties of the 2D material layer 1000 described above, the channel layer 126 in each of the channel members 104 functions as a first channel layer and the 2D material layer 1000 in each of the channel members 104 functions as a second channel layer. The first channel layer and the second channel layer may be simultaneously and independently turned on due to substantial band alignment. For similar reasons, the semiconductor device 100 in FIG. 11L is a DCFET. Because current is allowed to flow in the channel formed in the channel layers 126 and the channel formed in the 2D material layer 1000, the effective channel width of each of the channel members 104 may be increased by a factor between about 1.2 and 1.5 and the On-state current may also be increased by a factor between about 1.2 and 1.5, compared to a similar semiconductor device that does not have the 2D material layer 1000 in the channel region.

Referring now to FIGS. 10 and 11M, the fifth method 600 includes a block 622 where further processes are performed. In some embodiments, such further processes may include formation of source/drain contacts 1006, formation of gate contacts, formation of a further ILD layer, formation of source/drain contact vias, and formation of further interconnect structures.

Figure 11P:
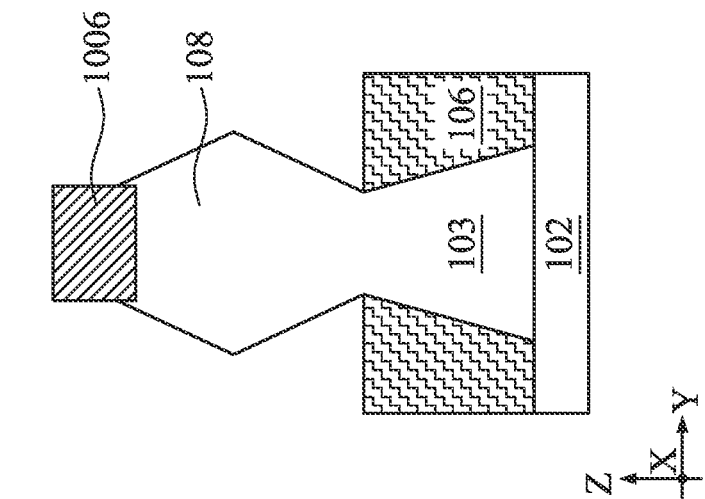
FIGS. 11A-11P illustrate fragmentary cross-sectional views of a workpiece at various fabrication stages of the fifth method in FIG. 10, according to one or more aspects of the present disclosure.
Figure 11O:
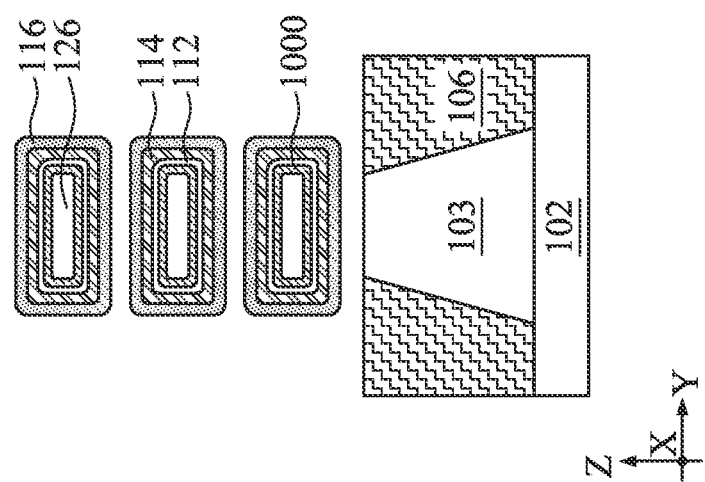
Figure 11N:
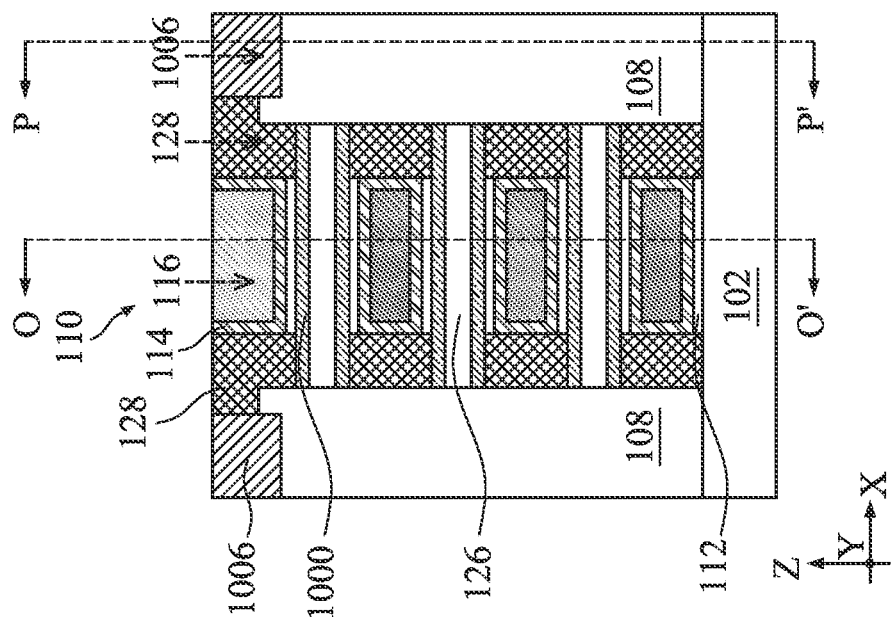

The semiconductor device 100 of FIG. 11M is further illustrated in FIGS. 11N, 11O and 11P. FIG. 11N is a sectional view of the semiconductor device 100; 11O is a sectional view of the semiconductor device 100 in FIG. 11N along the dashed line OO'; and FIG. 11P is a sectional view of the semiconductor device 100 in FIG. 11N along the dashed line PP'. Particularly, the gate dielectric layer 1024 includes an interfacial layer 112 and a high-k dielectric layer 114. The high-k dielectric layer 114 is U-shaped to wrap the gate electrode 116.

Figure 12:
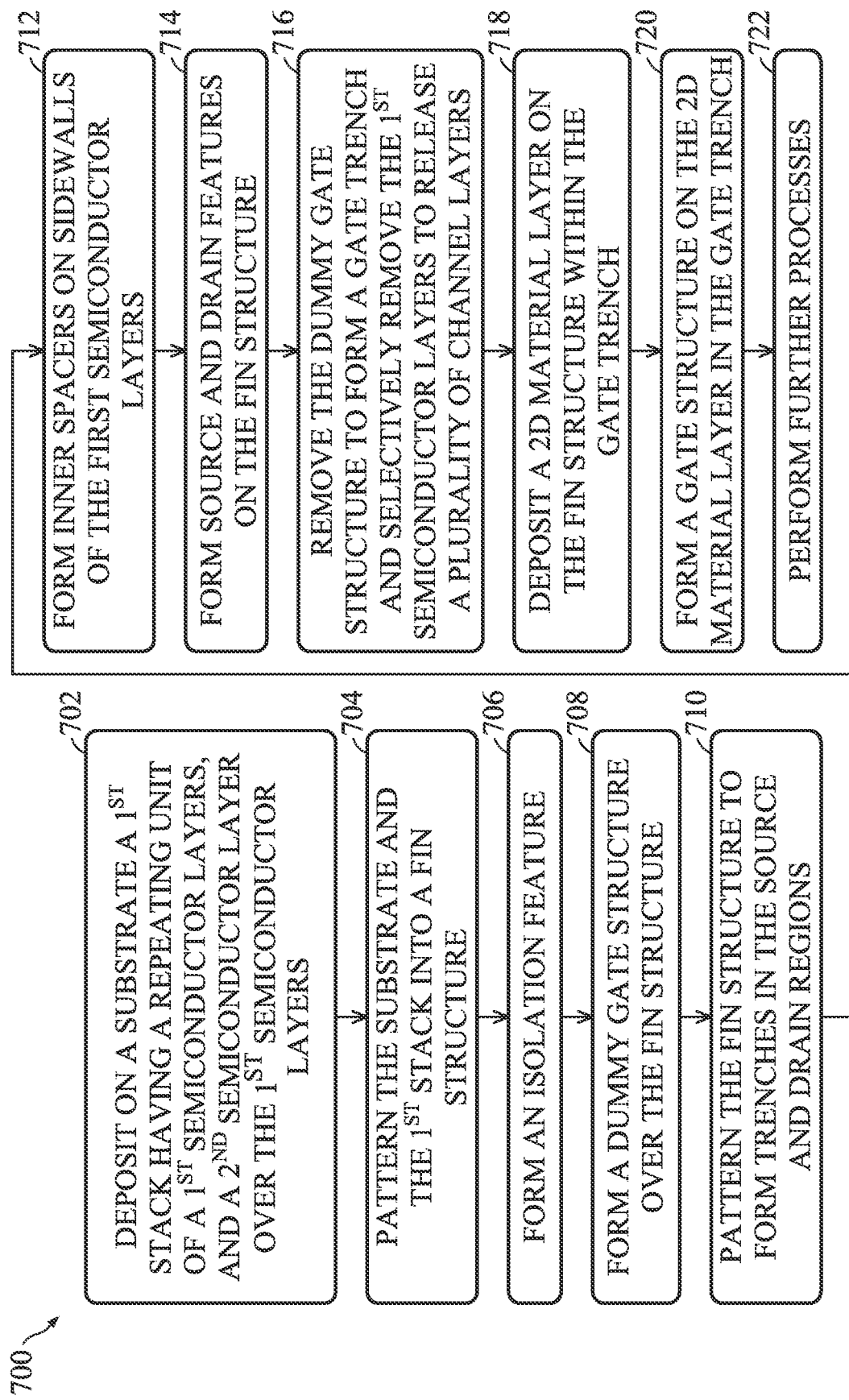
FIG. 12 illustrates a flowchart of a sixth method of fabricating a semiconductor device, according to one or more aspects of the present disclosure.

The semiconductor device 100 may also be formed using a method like the sixth method 700 shown in FIG. 12. Referring to FIGS. 12, 13A and 13D, the sixth method 700 includes a block 702 where a first stack 1100 is deposited on a substrate 102. As shown in FIG. 13A, the first stack 1100 includes a plurality of repeating units, each of which includes a first semiconductor layer 124, and a second semiconductor layer 126. In the embodiments represented in FIG. 13A, the first stack 1100 includes three repeating units each having a first semiconductor layer 124 and a second semiconductor layer 126. In some embodiments, the first semiconductor layer 124 may be referred to as a sacrificial layer 124 and may include silicon germanium (SiGe). In some embodiments, the second semiconductor layer 126 may be referred to a channel layer 126 and may include silicon (Si). At block 702, the first semiconductor layer 124 and the second semiconductor layer 126 may be deposited using epitaxial growth.

Referring to FIGS. 12 and 13B, the sixth method 700 includes a block 704 where the substrate 102 and the first stack 1100 are patterned into a first fin-like structure 1040. As shown in FIG. 13B, the first fin-like structure 1040 includes the base portion 104B and a top portion formed from the first stack 1100. The first fin-like structure 1040 extends lengthwise along the X direction. The top portion therefore includes the sacrificial layers 124, and the channel layers 126. In some embodiments, the patterning at block 604 may include an anisotropic etching process, such as a reactive-ion etching (RIE) process. An example RIE process may use a fluorocarbon such as carbon tetrafluoride ($CF_4$), trifluoromethane ($CHF_3$), octafluoropropane ($C_3H_8$), or sulfur hexafluoride ($SF_6$).

Referring to FIGS. 12 and 13C, the sixth method 700 includes a block 706 where an isolation feature 106 is formed. In some embodiments, the isolation feature 106 may include a dielectric material such as silicon oxide, silicon nitride, silicon oxynitride, fluorine-doped silicate glass (FSG), a low-k dielectric, combinations thereof, and/or other suitable materials. In an example process, the dielectric material of the isolation feature 106 is first blanketly deposited over the workpiece 100, including the first fin-like structure 1040, by spin-on coating, CVD or other suitable deposition method. Thereafter, the blanketly deposited dielectric material is planarized in a planarization process, such as a chemical mechanical polishing (CMP) process. The planarized dielectric material is then selectively recessed or etched back such only the base portion 104B is disposed in the isolation feature 106, as shown in FIG. 13C. The isolation feature 106 is in direct contact with sidewalls of base portion 104B and the top surface of the substrate 102.

Referring to FIGS. 12 and 13E, the sixth method 700 includes a block 708 to form a dummy gate structure. In some embodiments, the dummy gate structure includes a dummy gate stack 1002 and a gate spacer layer 118. The formation of the dummy gate structure includes forming a dummy gate stack 1002 over the fin structure 103, which further include deposition of dummy gate material, and patterning the dummy gate material to form the dummy gate stack 1002 by a procedure that includes a lithography process and etch and may further include using a hard mask as an etch mask. In some embodiments where a gate-last process is adopted, the dummy gate stack 1002 may include the interfacial layer 112, a high-k dielectric layer 114, and a dummy gate electrode 1004, such as a polysilicon layer. In some embodiments where a high-k-last process is adopted, the dummy gate stack 1002 may include a dielectric layer, such as silicon oxide, and a dummy gate electrode 1004, such as a polysilicon layer. The block 708 also includes forming a gate spacer layer 118 on the sidewalls of the dummy gate stack 1002 by depositing the gate spacer layer 118 and etching back of the gate spacer layer 118 by an anisotropic etching, such as plasma etching, as illustrated in FIG. 13D. The dummy gate stack 1002 and the gate spacer layer 118 are disposed on and directly contact the first stack 1100.

Referring to FIGS. 12 and 13F, the sixth method 700 includes a block 710 to pattern the first stack 1100 to form trenches 1020 within the source/drain regions 104SD. The patterning process applied to the first stack 1100 at block 710 includes a lithography process and etching, and additionally may use a patterned mask as an etch mask. The dummy gate structure also functions as an etch mask during the patterning process such that the trenches 1020 are aligned to the edges of the gate spacer layer 118.

Referring to FIGS. 12 and 13G, the sixth method 700 includes a block 712 to form inner spacers 130 on sides of the first semiconductor layers 124. The formation of the inner spacer 130 may include performing a selective etching process to the first semiconductor layers 124 such that the first semiconductor layers 124 are laterally recessed to form undercuts underlying the gate spacer layer 118. Thereafter, one or more suitable dielectric material layer is deposited in the undercuts, and an anisotropic etching process (such as plasma etching) is performed thereafter to remove excessive spacer material deposited on sidewalls of the second semiconductor layers 126. Accordingly, outer edges of the inner spacers 130 are substantially aligned with edges of the second semiconductor layers 126. The inner spacer layer 130 includes one or more dielectric material, such as silicon oxide, silicon nitride, silicon oxynitride, other suitable dielectric material or a combination thereof.

Referring to FIGS. 12 and 13H, the sixth method 700 includes a block 714 to form the source/drain features 108, such as by epitaxial growth. Especially, the source/drain features 108 include one or more semiconductor materials. In some embodiments, the source/drain features 108 include silicon doped with phosphorous or arsenic for n-type FETs or silicon germanium doped with boron for p-type FETs. In the depicted embodiment, the epitaxial growth is controlled such that the source and drain features 108 are formed with a top surface higher than the top surface of the first stack 1100 so that the source and drain features 108 are connected to all second semiconductor layers 126 and are separated from the first semiconductor layers 124 by the inner spacers 130, as illustrated in FIG. 13H.

Referring to FIGS. 12 and 13I, the sixth method 700 includes a block 716 where the dummy gate stack 1002 is removed by an etching process, resulting in a gate trench 1022. Particularly, only the dummy gate stack 1002 is removed at block 716 and the gate spacer layer 118 remains. The gate trench 1022 is defined by and spans between the gate spacer layer 118.

At block 716, the first semiconductor layers 124 are selectively removed from the gate trench 1022 to release the plurality of second semiconductor layers 126. In embodiments where the first semiconductor layer 124 is formed of silicon germanium and the second semiconductor layer 126 is formed of silicon, the selective removal of the first semiconductor layers 124 may include a SiGe oxidation process followed by a SiGe oxide removal. In those embodiments, the SiGe oxidation process may include use of ozone. In some implementations, the selective removal of the first semiconductor layer 124 may include use of a selective isotropic etching process (e.g., a selective dry etching process or a selective wet etching process). In some embodiments, the selective dry etching process may include use of one or more fluorine-based etchants, such as fluorine gas or hydrofluorocarbons. In some embodiments, the selective wet etching process may include a hydro fluoride (HF) or NH$_4$OH etchant. As shown in FIG. 13D, due to the arrangement of the repeating unit in the first stack 1100, the removal of the first semiconductor layers 124 (i.e., sacrificial layers 124) releases a plurality of channel members 104. Each of the channel members 104 includes a second semiconductor layer 126 (i.e., a channel layer 126).

Referring to FIGS. 12 and 13J, the sixth method 700 includes a block 718 where 2D material layers 1000 are formed on the surfaces of the second semiconductor layers 126 through the gate trench 1022 by a suitable method, such as selective deposition. As the composition and formation of the 2D material layer 1000 has been described above with respect to block 514 of the fourth method 500 above, detailed description of the 2D material layers 1000 is omitted here for brevity. Particularly, the 2D material layers 1000 are formed on top surface and bottom surface of each of the second semiconductor layers 126. Thus, each of the channel members 104 includes a second semiconductor layer 126 (i.e., a channel layer 126) and 2D material layers 1000 disposed on top surface and the bottom surface of the corresponding second semiconductor layer 126. Different from the 2D material layers 1000 in FIG. 11I, the 2D material layers 1000 in FIG. 13J span between the inner spacers 130 along X direction and are not extended into the interface between the inner spacer 130 and the second semiconductor layers 126.

Referring to FIGS. 12O and 13K, the sixth method 700 includes a block 720 where a gate stack 110 is formed over and around each of the plurality of channel members 104. As described above, the gate stack 110 includes a gate dielectric layer 1024 and a gate electrode 116 over the gate dielectric layer 1024. In the depicted embodiment, the gate dielectric layer 1024 may include an interfacial layer 112, and a high-k dielectric layer 114 over the interfacial layer 112. As the compositions of the interfacial layer 112, the high-k dielectric layer 114, and the gate electrode 116 have been described above respect to block 210 of the first method 200, detailed description of the interfacial layer 112, the high-k dielectric layer 114, and the gate electrode 116 are omitted here for brevity. The gate dielectric layer 1024 including the interfacial layer 112, the high-k dielectric layer 114 may be sequentially deposited around the channel members 104 using CVD or ALD. Then, as shown in FIG. 13K, the gate electrode 116 may be deposited using PVD, CVD, ALD, or electroless plating. Due to the 2D properties of the 2D material layer 1000 described above, the channel layer 126 in each of the channel members 104 functions as a first channel layer and the 2D material layer 1000 in each of the channel members 104 functions as a second channel layer. The first channel layer and the second channel layer may be simultaneously and independently turned on due to substantial band alignment. For similar reasons, the semiconductor device 100 in FIG. 13K is a DCFET. Because current is allowed to flow in the channel formed in the channel layers 126 and the channel formed in the 2D material layer 1000, the effective channel width of each of the channel members 104 may be increased by a factor between about 1.2 and 1.5 and the On-state current may also be increased by a factor between about 1.2 and 1.5, compared to a similar semiconductor device that does not have the 2D material layer 1000 in the channel region.

Referring now to FIGS. 12 and 13L, the sixth method 700 includes a block 722 where further processes are performed. In some embodiments, such further processes may include formation of source/drain contacts 1006, formation of gate contacts, formation of a further ILD layer, formation of source/drain contact vias, and formation of further interconnect structures. As the operations at block 722 is similar to those at block 622, detailed description of operations at block 722 is omitted for brevity.

The semiconductor device 100 of FIG. 13L is further illustrated in FIGS. 13M, 13N and 13O. FIG. 13M is a sectional view of the semiconductor device 100; 13N is a sectional view of the semiconductor device 100 in FIG. 13M along the dashed line NN'; and FIG. 13O is a sectional view of the semiconductor device 100 in FIG. 13M along the dashed line OO'. Particularly, the gate dielectric layer 1024 includes an interfacial layer 112 and a high-k dielectric layer 114. The high-k dielectric layer 114 is U-shaped to wrap the gate electrode 116.

Figure 14:
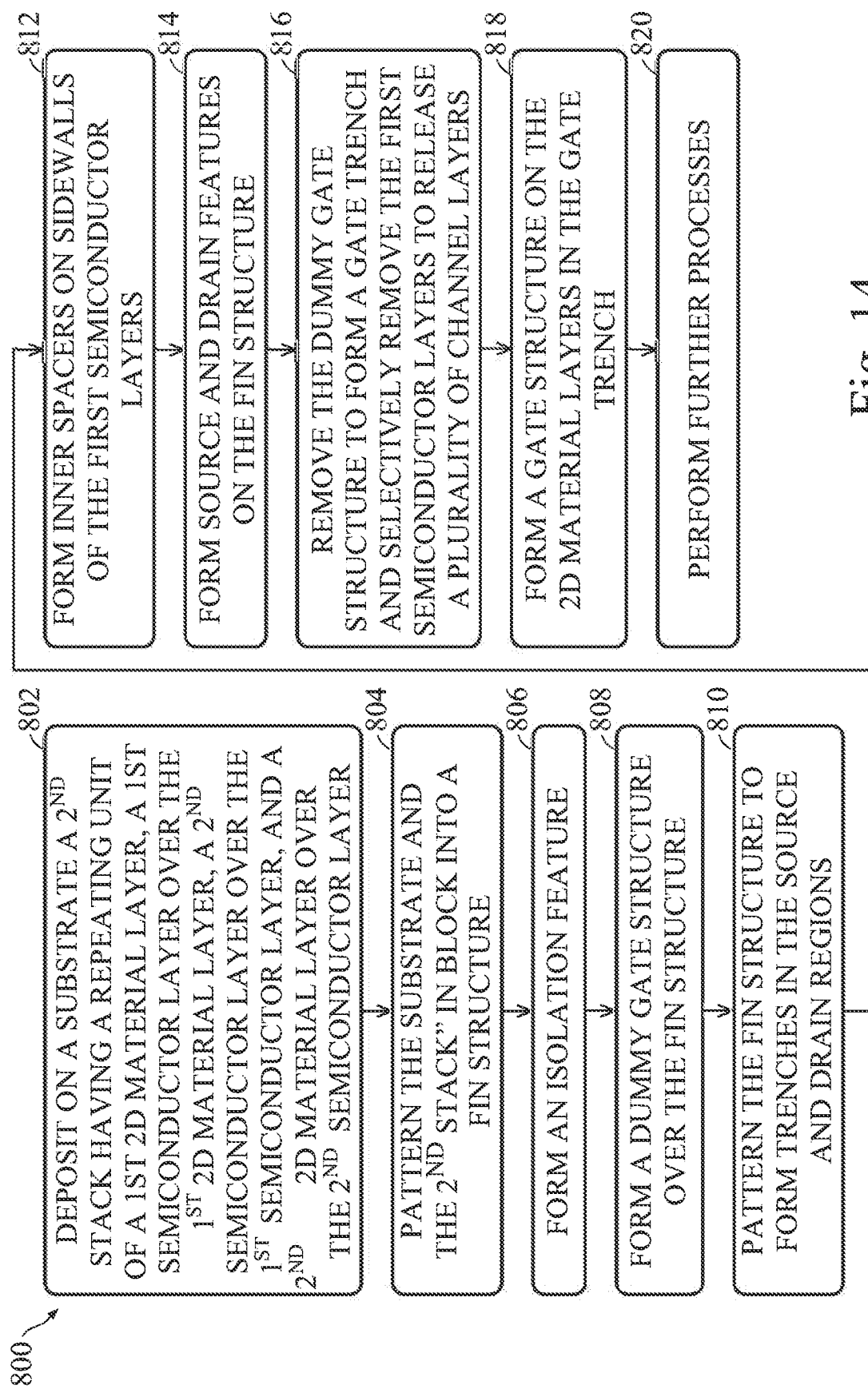
FIG. 14 illustrates a flowchart of a seventh method of fabricating a semiconductor device, according to one or more aspects of the present disclosure.
Figures 15A, 15B, 15C:
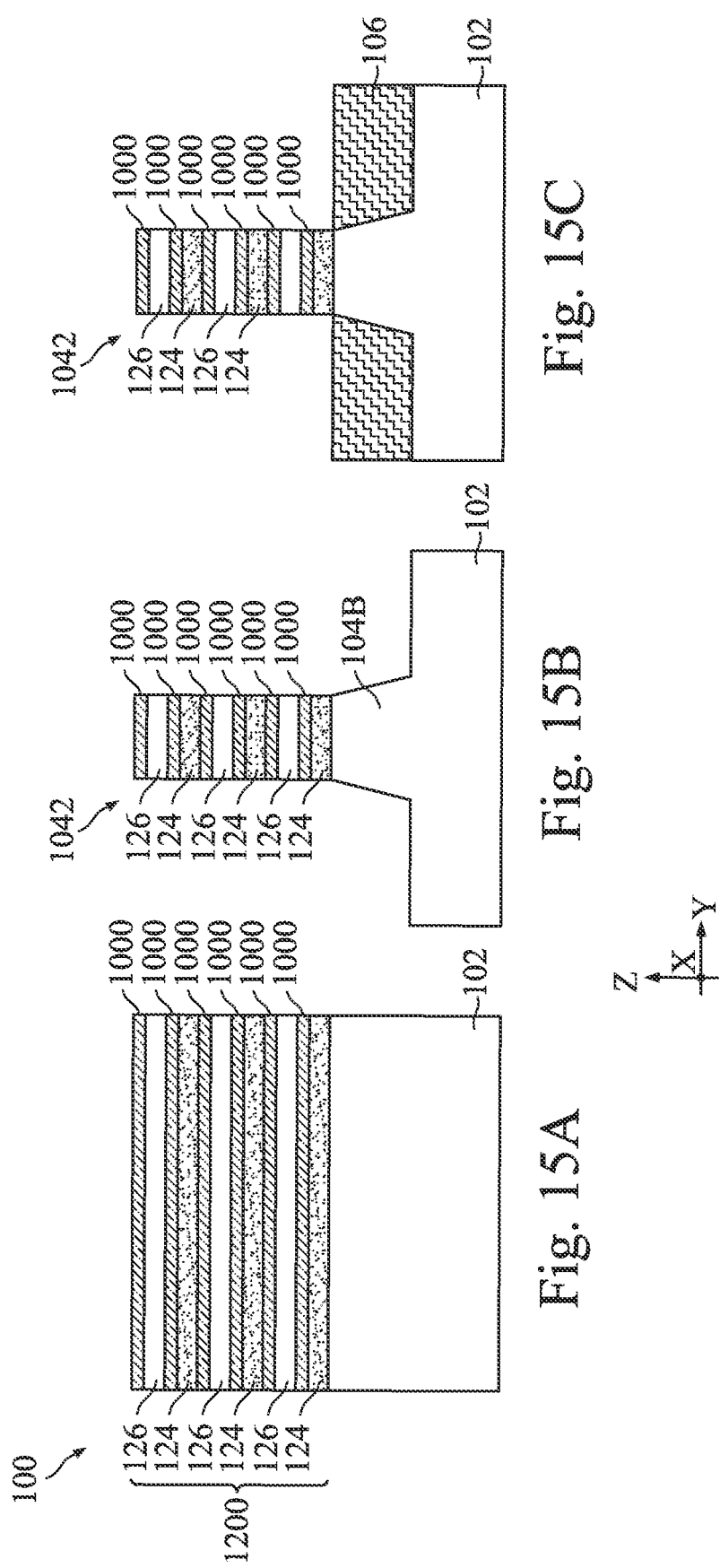

The semiconductor device 100 may also be formed using a method like the seventh method 800 shown in FIG. 14. In method 800, the 2D material layers 1000 are deposited and incorporated in the semiconductor stack. Referring to FIGS. 14, 15A and 15D, the seventh method 800 includes a block 802 where a second stack 1200 is deposited on a substrate 102. As shown in FIGS. 15A and 15D, the second stack 1200 includes a plurality of repeating units, each of which includes a first semiconductor layer 124, a 2D material layer 1000 over the first semiconductor layer, a second semiconductor layer 126 over the 2D material layer 1000, and another 2D material layer 1000 over the second semiconductor layer 126. Put differently, each of the second semiconductor layers 126 is directly sandwiched between two 2D material layers. In the embodiments represented in FIG. 15A, the second stack 1200 includes three repeating units each having a second semiconductor layer 126 sandwiched between two 2D material layers 1000 and adjacent 2D material layers 1000 are spaced apart by a first semiconductor layer 124. In some embodiments, the first semiconductor layer 124 may be referred to as a sacrificial layer 124 and may include silicon germanium (SiGe) and the second semiconductor layer 126 may be referred to a channel layer 126 and may include silicon (Si). In some implementations, the 2D material layer 1000 may include graphene, tungsten sulfide (WS$_2$), tungsten telluride (WTe$_2$), tungsten selenide (WSe$_2$), molybdenum sulfide (MoS$_2$), molybdenum telluride (MoTe$_2$), molybdenum selenide (MoSe$_2$), black phosphorus, or a suitable 2D material that has substantial band alignment with the semiconductor material of the second semiconductor layer 126. The 2D material layer 1000 may be doped with a dopant, such as sulfur (S), selenium (Se), tellurium (Te), zirconium (Zr), hafnium (Hf), tungsten (W), molybdenum (Mo), boron (B), oxygen (O), nitrogen (N), carbon (C), silicon (Si), or tin (Sn). At block 702, the first semiconductor layer 124, the second semiconductor layer 126, and the 2D material layer 1000 may be deposited using epitaxial growth.

Referring to FIGS. 14 and 15B, the seventh method 800 includes a block 804 where the substrate 102 and the second stack 1200 are patterned into a second fin-like structure 1042. As shown in FIG. 15B, the second fin-like structure 1042 includes the base portion 104B and a top portion formed from the second stack 1200. The second fin-like structure 1042 extends lengthwise along the X direction. The top portion therefore includes the sacrificial layers 124, the channel layers 126, and 2D material layers 1000 sandwiching the channel layers 126. In some embodiments, the patterning at block 804 may include an anisotropic etching process, such as a reactive-ion etching (RIE) process. An example RIE process may use a fluorocarbon such as carbon tetrafluoride (CF$_4$), trifluoromethane (CHF$_3$), octafluoropropane (C$_3$H$_8$), or sulfur hexafluoride (SF$_6$).

Referring to FIGS. 14 and 15C, the seventh method 800 includes a block 806 where an isolation feature 106 is formed. As the operations at block 806 is similar to those at block 706, detailed description of operations at block 806 is omitted for brevity.

Referring to FIGS. 14 and 15E, the seventh method 800 includes a block 808 to form a dummy gate structure. In some embodiments, the dummy gate structure includes a dummy gate stack 1002 and a gate spacer layer 118. The formation of the dummy gate structure includes forming a dummy gate stack 1002 over the fin structure 103, which further include deposition of dummy gate material, and patterning the dummy gate material to form the dummy gate stack 1002. In some embodiments where a gate-last process is adopted, the dummy gate stack 1002 may include the interfacial layer 112, a high-k dielectric layer 114, and a dummy gate electrode 1004, such as a polysilicon layer. In some embodiments where a high-k-last process is adopted, the dummy gate stack 1102 may include a dielectric layer, such as silicon oxide, and a dummy gate electrode 1004, such as a polysilicon layer. The block 808 also includes forming a gate spacer layer 118 on the sidewalls of the dummy gate stack 1002 by depositing the gate spacer layer 118 and etching back of the gate spacer layer 118 by an anisotropic etching, such as plasma etching, as illustrated in FIG. 15E. The dummy gate stack 1002 and the gate spacer layer 118 are disposed on and directly contact the second stack 1200.

Referring to FIGS. 14 and 15F, the seventh method 800 includes a block 810 to pattern the second stack 1200 to form trenches 1020 within the source/drain regions 104SD. The dummy gate structure also functions as an etch mask during the patterning process such that the trenches 1020 are aligned to the edges of the gate spacer layer 118.

Referring to FIGS. 14 and 15G, the seventh method 800 includes a block 812 to form inner spacers 130 on sides of the first semiconductor layers 124. The formation of the inner spacer 130 may include performing a selective etching process to the first semiconductor layers 124 such that the first semiconductor layers 124 are laterally recessed to form undercuts underlying the gate spacer layer 118. Thereafter, one or more suitable dielectric material layer is deposited in the undercuts, and an anisotropic etching process (such as plasma etching) is performed thereafter to remove excessive spacer material deposited on sidewalls of the second semiconductor layers 126. Accordingly, outer edges of the inner spacers 130 are substantially aligned with edges of the second semiconductor layers 126. The inner spacer layer 130 includes one or more dielectric material, such as silicon oxide, silicon nitride, silicon oxynitride, other suitable dielectric material or a combination thereof.

Referring to FIGS. 14 and 15H, the seventh method 800 includes a block 814 to form the source/drain features 108, such as by epitaxial growth. Especially, the source/drain features 108 include one or more semiconductor materials. In some embodiments, the source/drain features 108 include silicon doped with phosphorous or arsenic for n-type FETs or silicon germanium doped with boron for p-type FETs. In the depicted embodiment, the epitaxial growth is controlled such that the source and drain features 108 are formed with a top surface higher than the top surface of the second stack 1200 so that the source and drain features 108 are connected to the second semiconductor layers 126 and are separated from the first semiconductor layers 124 by the inner spacers 130, as illustrated in FIG. 15H.

Referring to FIGS. 14 and 15I, the seventh method 800 includes a block 816 where the dummy gate stack 1002 is removed by an etching process, resulting in a gate trench 1022. Particularly, only the dummy gate stack 1002 is removed at block 816 and the gate spacer layer 118 remains. The gate trench 1022 is defined by and spans between the gate spacer layer 118.

At block 816, the first semiconductor layers 124 are selectively removed from the gate trench 1022 to release the plurality of second semiconductor layers 126. In embodiments where the first semiconductor layer 124 is formed of silicon germanium and the second semiconductor layer 126 is formed of silicon, the selective removal of the first semiconductor layers 124 may include a SiGe oxidation process followed by a SiGe oxide removal. In those embodiments, the SiGe oxidation process may include use of ozone. In some implementations, the selective removal of the first semiconductor layer 124 may include use of a selective isotropic etching process (e.g., a selective dry etching process or a selective wet etching process). In some embodiments, the selective dry etching process may include use of one or more fluorine-based etchants, such as fluorine gas or hydrofluorocarbons. In some embodiments, the selective wet etching process may include a hydro fluoride (HF) or NH$_4$OH etchant. As shown in FIG. 15D, due to the arrangement of the repeating unit in the second stack 1200, the removal of the first semiconductor layers 124 (i.e., sacrificial layers 124) releases a plurality of channel members 104. Each of the channel members 104 includes a second semiconductor layer 126 (i.e., a channel layer 126).

Referring to FIGS. 14 and 15J, the seventh method 800 includes a block 818 where a gate stack 110 is formed over and around each of the plurality of channel members 104. As described above, the gate stack 110 includes a gate dielectric layer 1024 and a gate electrode 116 over the gate dielectric layer 1024. In the depicted embodiment, the gate dielectric layer 1024 may include an interfacial layer 112, and a high-k dielectric layer 114 over the interfacial layer 112. As the compositions of the interfacial layer 112, the high-k dielectric layer 114, and the gate electrode 116 have been described above respect to block 210 of the first method 200, detailed description of the interfacial layer 112, the high-k dielectric layer 114, and the gate electrode 116 are omitted here for brevity. The gate dielectric layer 1024 including the interfacial layer 112, the high-k dielectric layer 114 may be sequentially deposited around the channel members 104 using CVD or ALD. Then, as shown in FIG. 15J, the gate electrode 116 may be deposited using PVD, CVD, ALD, or electroless plating. Due to the 2D properties of the 2D material layer 1000 described above, the channel layer 126 in each of the channel members 104 functions as a first channel layer and the 2D material layers 1000 in each of the channel members 104 functions as second channel layers. The first channel layer and the second channel layer may be simultaneously and independently turned on due to substantial band alignment. For similar reasons, the semiconductor device 100 in FIG. 15K is a DCFET. Because current is allowed to flow in the channel formed in the channel layers 126 and the channel formed in the 2D material layer 1000, the effective channel width of each of the channel members 104 may be increased by a factor between about 1.2 and 1.5 and the On-state current may also be increased by a factor between about 1.2 and 1.5, compared to a similar semiconductor device that does not have the 2D material layer 1000 in the channel region.

Referring now to FIGS. 14 and 15K, the seventh method 800 includes a block 820 where further processes are performed. In some embodiments, such further processes may include formation of source/drain contacts 1006, formation of gate contacts, formation of a further ILD layer, formation of source/drain contact vias, and formation of further interconnect structures. As the operations at block 820 is similar to those at block 622, detailed description of operations at block 820 is omitted for brevity.

The semiconductor device 100 of FIG. 15K is further illustrated in FIGS. 15L, 15M and 15N. FIG. 15L is a sectional view of the semiconductor device 100; 15M is a sectional view of the semiconductor device 100 in FIG. 15L along the dashed line MM'; and FIG. 15N is a sectional view of the semiconductor device 100 in FIG. 15L along the dashed line NN'. Particularly, the gate dielectric layer 1024 includes an interfacial layer 112 and a high-k dielectric layer 114. The high-k dielectric layer 114 is U-shaped to wrap the gate electrode 116.

Figure 16:
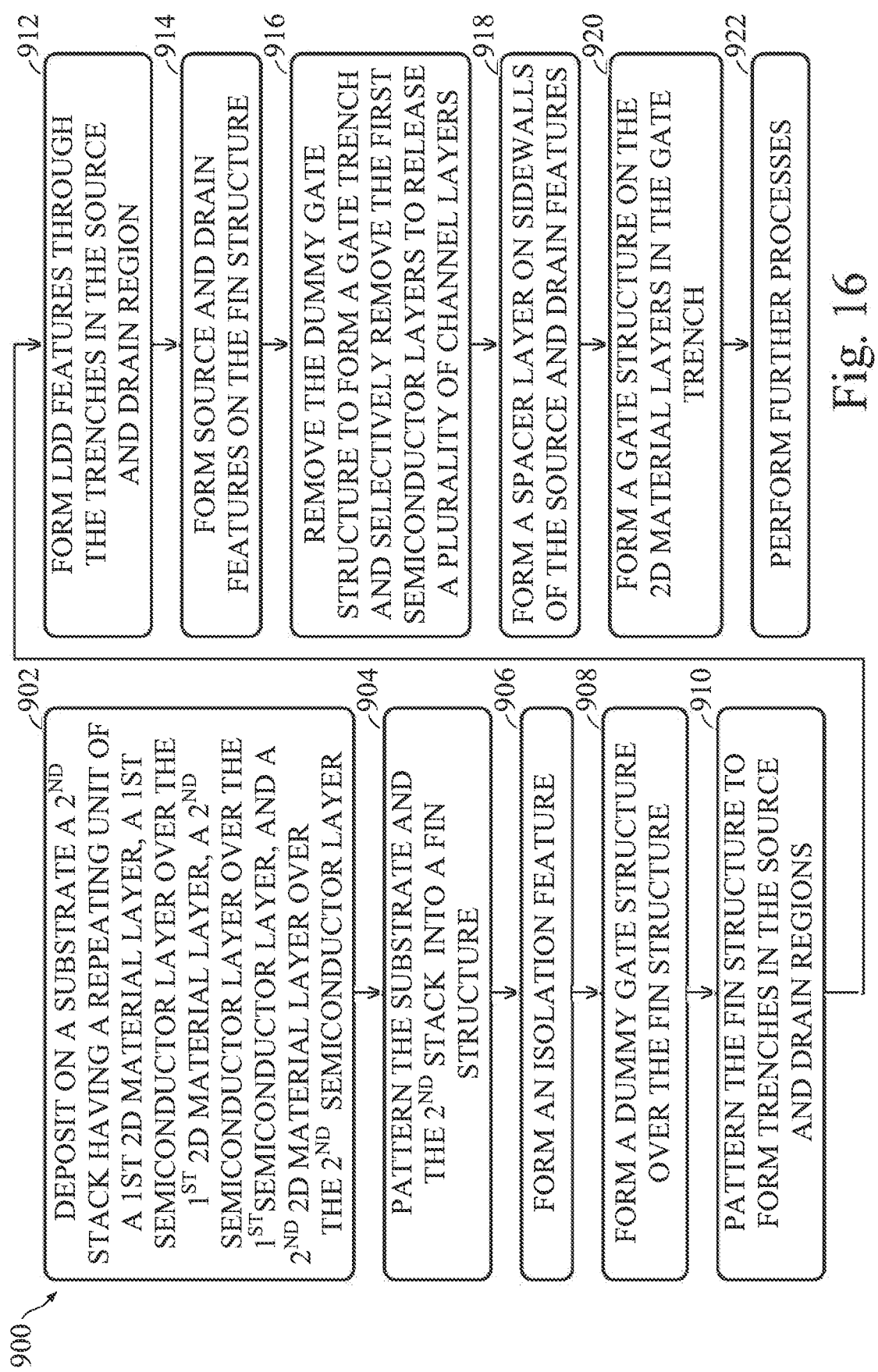
FIG. 16 illustrates a flowchart of an eighth method of fabricating a semiconductor device, according to one or more aspects of the present disclosure.

The semiconductor device 100 may also be formed using a method like the eighth method 900 shown in FIG. 16. In method 900, the inner spacers are formed by different method and with different sequence. Referring to FIGS. 16, 17A and 17D, the eighth method 900 includes a block 902 where a second stack 1200 is deposited on a substrate 102. As shown in FIGS. 17A and 17D, the second stack 1200 includes a plurality of repeating units, each of which includes a first semiconductor layer 124, a 2D material layer 1000 over the first semiconductor layer, a second semiconductor layer 126 over the 2D material layer 1000, and another 2D material layer 1000 over the second semiconductor layer 126. Put differently, each of the second semiconductor layers 126 is directly sandwiched between two 2D material layers. In the embodiments represented in FIG. 17A, the second stack 1200 includes three repeating units each having a second semiconductor layer 126 sandwiched between two 2D material layers 1000 and adjacent 2D material layers 1000 are spaced apart by a first semiconductor layer 124. In some embodiments, the first semiconductor layer 124 may be referred to as a sacrificial layer 124 and may include silicon germanium (SiGe) and the second semiconductor layer 126 may be referred to a channel layer 126 and may include silicon (Si). In some implementations, the 2D material layer 1000 may include graphene, tungsten sulfide ($WS_2$), tungsten telluride ($WTe_2$), tungsten selenide ($WSe_2$), molybdenum sulfide ($MoS_2$), molybdenum telluride ($MoTe_2$), molybdenum selenide ($MoSe_2$), black phosphorus, or a suitable 2D material that has substantial band alignment with the semiconductor material of the second semiconductor layer 126. The 2D material layer 1000 may be doped with a dopant, such as sulfur (S), selenium (Se), tellurium (Te), zirconium (Zr), hafnium (Hf), tungsten (W), molybdenum (Mo), boron (B), oxygen (O), nitrogen (N), carbon (C), silicon (Si), or tin (Sn). At block 902, the first semiconductor layer 124, the second semiconductor layer 126, and the 2D material layer 1000 may be deposited using epitaxial growth.

Referring to FIGS. 16 and 17B, the eighth method 900 includes a block 904 where the substrate 102 and the second stack 1200 are patterned into a second fin-like structure 1042. As shown in FIG. 17B, the second fin-like structure 1042 includes the base portion 104B and a top portion formed from the second stack 1200. The second fin-like structure 1042 extends lengthwise along the X direction. The top portion therefore includes the sacrificial layers 124, the channel layers 126, and 2D material layers 1000 sandwiching the channel layers 126. In some embodiments, the patterning at block 904 may include an anisotropic etching process, such as a reactive-ion etching (RIE) process. An example RIE process may use a fluorocarbon such as carbon tetrafluoride ($CF_4$), trifluoromethane ($CHF_3$), octafluoropropane ($C_3H_8$), or sulfur hexafluoride ($SF_6$).

Referring to FIGS. 16 and 17C, the eighth method 900 includes a block 906 where an isolation feature 106 is formed. As the operations at block 906 is similar to those at block 706, detailed description of operations at block 906 is omitted for brevity.

Referring to FIGS. 16 and 17E, the eighth method 900 includes a block 908 to form a dummy gate structure. In some embodiments, the dummy gate structure includes a dummy gate stack 1002 and a gate spacer layer 118. The formation of the dummy gate structure includes forming a dummy gate stack 1002 over the fin structure 103, which further include deposition of dummy gate material, and patterning the dummy gate material to form the dummy gate stack 1002. In some embodiments where a gate-last process is adopted, the dummy gate stack 1002 may include the interfacial layer 112, a high-k dielectric layer 114, and a dummy gate electrode 1004, such as a polysilicon layer. In some embodiments where a high-k-last process is adopted, the dummy gate stack 1102 may include a dielectric layer, such as silicon oxide, and a dummy gate electrode 1004, such as a polysilicon layer. The block 908 also includes forming a gate spacer layer 118 on the sidewalls of the dummy gate stack 1002 by depositing the gate spacer layer 118 and etching back of the gate spacer layer 118 by an anisotropic etching, such as plasma etching, as illustrated in FIG. 17E. The dummy gate stack 1002 and the gate spacer layer 118 are disposed on and directly contact the second stack 1200.

Referring to FIGS. 16 and 17F, the eighth method 900 includes a block 910 to pattern the second stack 1200 to form trenches 1020 within the source/drain regions 104SD. The dummy gate structure also functions as an etch mask during the patterning process such that the trenches 1020 are aligned to the edges of the gate spacer layer 118.

Referring to FIGS. 16, 17G and 17H, the eighth method 900 includes a block 912 to form LDD features 1010 through the trenches 1020 in the source/drain regions 104SD. The formation of the LDD features 1010 includes perform an etching process to laterally recessing the channel members including the second semiconductor layers 126 and the 2D material layers 1000, thereby forming undercuts underlying the gate spacer layer 118, as illustrated in FIG. 17G. the etching process uses an etchant to selectively etch the second semiconductor layers 126 and the 2D material layers 1000. Note that the lateral recessing is designed to laterally recesses the channel member 104 instead of the sacrificial layer (the first semiconductor layer 124). The block 912 also includes depositing a semiconductor material to fill in the undercuts, thereby forming LDD features 1010, as illustrated in FIG. 17H. In the depicted embodiment, the semiconductor material includes silicon. The deposition includes selective epitaxial growth with in-site doping to form the LDD features 1010 with proper dopant (such as phosphorous for nFETs or boron for pFETs) and doping dosage. For example, the epitaxial growth uses a precursor that includes silicon-containing gas and dopant-containing gas with certain partial pressures to achieve the expected doping concentration of the LDD features 1010, which is less than the doping concentration of the source and drain features 108 (to be formed at later stage). Alternatively, the epitaxial growth is not selective to the first semiconductor layer 124 and may form the semiconductor material on the first semiconductor layers 124. In this case, an anisotropic etching process, such as a plasma etch, may be applied thereafter to remove excessive semiconductor material deposited on the sidewalls of the first semiconductor layer 124.

Referring to FIGS. 16 and 17I, the eighth method 900 includes a block 914 to form the source/drain features 108, such as by epitaxial growth. Especially, the source/drain features 108 include one or more semiconductor materials. In some embodiments, the source/drain features 108 include silicon doped with phosphorous or arsenic for n-type FETs or silicon germanium doped with boron for p-type FETs. In the depicted embodiment, the epitaxial growth is controlled such that the source and drain features 108 are formed with a top surface higher than the top surface of the second stack 1200 so that the source and drain features 108 are connected to all second semiconductor layers 126 and are separated from the first semiconductor layers 124 by the inner spacers 130, as illustrated in FIG. 17I.

Referring to FIGS. 16 and 17J, the eighth method 900 includes a block 916 where the dummy gate structure is removed by an etching process, resulting in a gate trench 1022. Particularly, both the dummy gate stack 1002 and the gate spacer layer 118 are removed at block 916. The gate trench 1022 is defined by and spans between the source and drain features 108.

At block 916, the first semiconductor layers 124 are selectively removed from the gate trench 1022 to release the plurality of second semiconductor layers 126. In embodiments where the first semiconductor layer 124 is formed of silicon germanium and the second semiconductor layer 126 is formed of silicon, the selective removal of the first semiconductor layers 124 may include a SiGe oxidation process followed by a SiGe oxide removal. In those embodiments, the SiGe oxidation process may include use of ozone. In some implementations, the selective removal of the first semiconductor layer 124 may include use of a selective isotropic etching process (e.g., a selective dry etching process or a selective wet etching process). In some embodiments, the selective dry etching process may include use of one or more fluorine-based etchants, such as fluorine gas or hydrofluorocarbons. In some embodiments, the selective wet etching process may include a hydro fluoride (HF) or NH$_4$OH etchant. As shown in FIG. 17D, due to the arrangement of the repeating unit in the second stack 1200, the removal of the first semiconductor layers 124 (i.e., sacrificial layers 124) releases a plurality of channel members 104. Each of the channel members 104 includes a second semiconductor layer 126 (i.e., a channel layer 126).

Referring to FIGS. 16 and 17K, the eighth method 900 includes a block 918 to form a spacer layer 132 on sidewalls of the source and drain features 108. The portions of the spacer layer 132 between the channel members 104 are referred to as inner spacers and the portions above the second stack 1200 are referred to as gate spacer. The formation of the spacer layer 132 may include depositing a dielectric layer in the gate trench; and performing an anisotropic etching process to the spacer layer 132 so that only portions on the sidewalls of the source and drain features 108 are left. The spacer layer 132 includes one or more dielectric material, such as silicon oxide, silicon nitride, silicon oxynitride, other suitable dielectric material or a combination thereof.

Referring to FIGS. 16 and 17L, the eighth method 900 includes a block 920 where a gate stack 110 is formed over and around each of the plurality of channel members 104. As described above, the gate stack 110 includes a gate dielectric layer 1024 and a gate electrode 116 over the gate dielectric layer 1024. In the depicted embodiment, the gate dielectric layer 1024 may include an interfacial layer 112, and a high-k dielectric layer 114 over the interfacial layer 112. As the compositions of the interfacial layer 112, the high-k dielectric layer 114, and the gate electrode 116 have been described above respect to block 210 of the first method 200, detailed description of the interfacial layer 112, the high-k dielectric layer 114, and the gate electrode 116 are omitted here for brevity. The gate dielectric layer 1024 including the interfacial layer 112, the high-k dielectric layer 114 may be sequentially deposited around the channel members 104 using CVD or ALD. Then, as shown in FIG. 17L, the gate electrode 116 may be deposited using PVD, CVD, ALD, or electroless plating. Due to the 2D properties of the 2D material layer 1000 described above, the channel layer 126 in each of the channel members 104 functions as a first channel layer and the 2D material layers 1000 in each of the channel members 104 functions as second channel layers. The first channel layer and the second channel layer may be simultaneously and independently turned on due to substantial band alignment. For similar reasons, the semiconductor device 100 in FIG. 17L is a DCFET. Because current is allowed to flow in the channel formed in the channel layers 126 and the channel formed in the 2D material layer 1000, the effective channel width of each of the channel members 104 may be increased by a factor between about 1.2 and 1.5 and the On-state current may also be increased by a factor between about 1.2 and 1.5, compared to a similar semiconductor device that does not have the 2D material layer 1000 in the channel region.

Referring now to FIGS. 16 and 17M, the eighth method 900 includes a block 922 where further processes are performed. In some embodiments, such further processes may include formation of source/drain contacts 1006, formation of gate contacts, formation of a further ILD layer, formation of source/drain contact vias, and formation of further interconnect structures. As the operations at block 922 is similar to those at block 622, detailed description of operations at block 922 is omitted for brevity.

The semiconductor device 100 of FIG. 17M is further illustrated in FIGS. 17N, 17O and 17P. FIG. 17N is a sectional view of the semiconductor device 100; 17O is a sectional view of the semiconductor device 100 in FIG. 17N along the dashed line OO'; and FIG. 17P is a sectional view of the semiconductor device 100 in FIG. 17N along the dashed line PP'. Particularly, the gate dielectric layer 1024 includes an interfacial layer 112 and a high-k dielectric layer 114. The high-k dielectric layer 114 is U-shaped to wrap the gate electrode 116.

Figure 18:
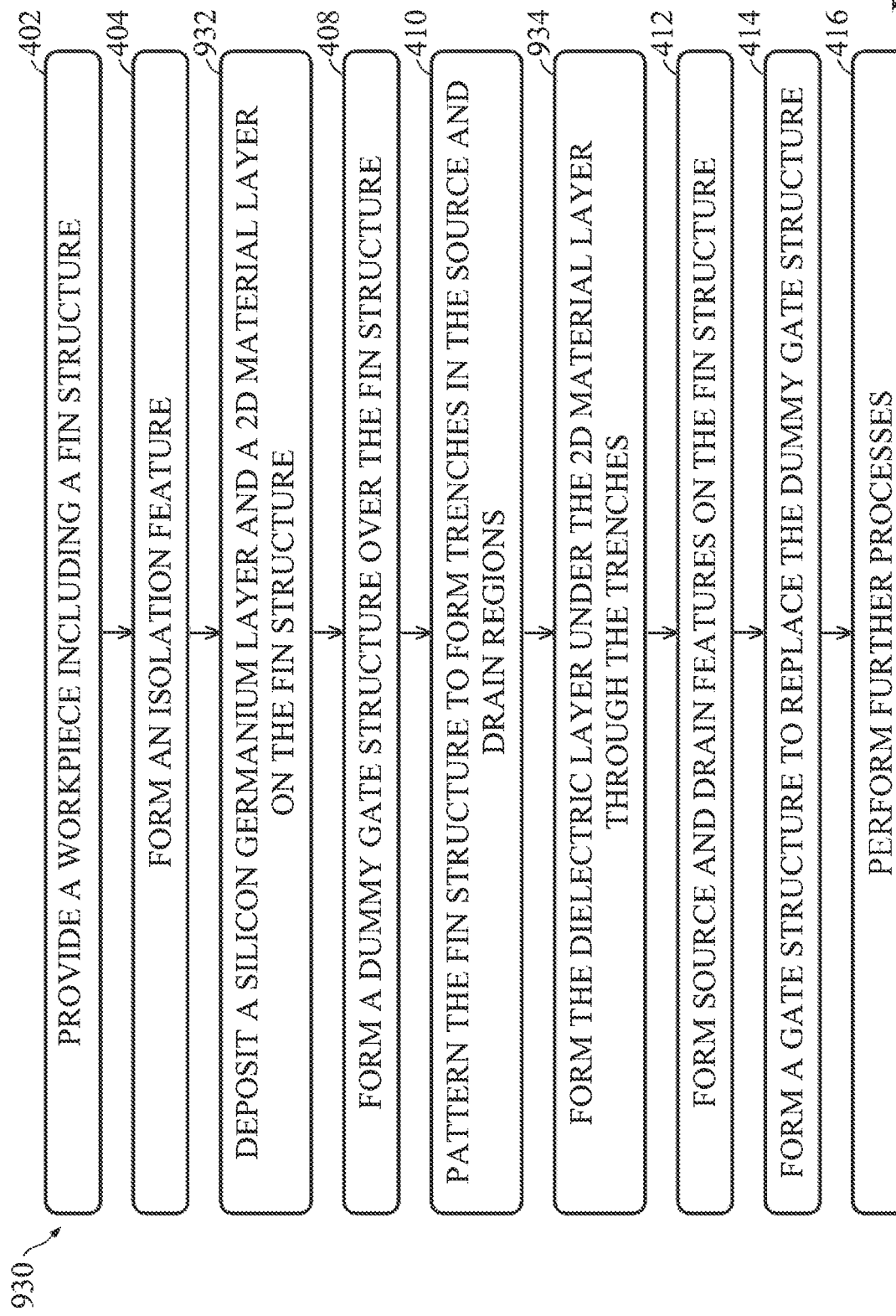
FIG. 18 illustrates a flowchart of a ninth method of fabricating a semiconductor device, according to one or more aspects of the present disclosure.

The semiconductor device 100 may also be formed using a method like the ninth method 930 shown in FIG. 18. The method 930 is similar to the third method 400 includes a block 402. As various operations have been described above with respect to the third method 400, details of those operations in the third method 400 are omitted here for brevity. Only different operations are described below. Particularly, the block 402 is modified to the block 932, which includes depositing a sacrificial layer and a 2D material layer 1000 on the sacrificial layer. In the depicted embodiment, the sacrificial layer is a silicon germanium layer 124 deposited by selective epitaxial growth. The ninth method 930 also includes a block 934 implemented between patterning the fin structure to form trenches in the source/drain regions 104SD at the blocks 410 and forming the source and drain features 108 at block 412. At block 934, a dielectric layer 1008 is formed as illustrated in FIG. 19H. The formation of the dielectric layer 1008 may include selective etching the silicon germanium layer 124, depositing the dielectric layer 1008; laterally recessing the dielectric layer by selective etching; and epitaxially growing silicon to fill the recesses.

Figure 20:
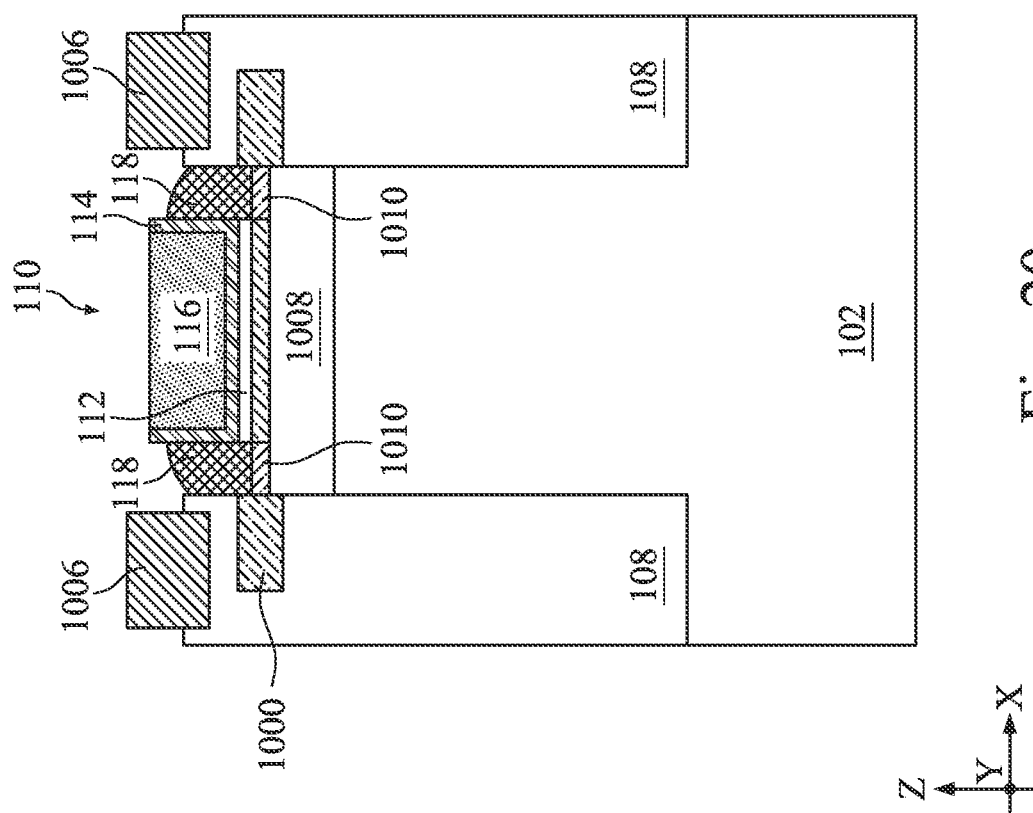
FIG. 20 illustrates a sectional view of a semiconductor device, according to one or more aspects of the present disclosure.

In some embodiments, the semiconductor device 100 have a structure illustrated in FIG. 20, which is similar to the structure of the semiconductor device 100 in FIG. 19L. However, the 2D material layer 1000 extended into the source and drain features 108 and may further include portions 1010 as LDD features. In the present structure, the 2D material layer 1000 increases contact areas to the source/drain features 108 and reduces contact resistance due to improved current spreading (less current crowding) from the S/D features to the channel of the 2D material layer 1000, which may include a single 2D film or multiple 2D films. Furthermore, the band-gap of the 2D material layer 1000 can be modulated by number of 2D films, which can be used for better Ec/Ev band-alignment with the S/D features. In some embodiments, the structure of the semiconductor device 100 is formed in a similar method as illustrated in FIGS. 8 and 9A through 9K. Especially, at block 514, the operations include recessing the fin structure 103 within the gate trench 1022 by a suitable etching process, thereby forming a recess 1026; performing a suitable lateral etching process to extend the recess into the source/drain regions; and depositing the 2D material layer 1000.

The present disclosure is directed to a semiconductor device. The semiconductor device includes a channel member having a first channel layer and a second channel layer over the first channel layer, and a gate structure over the channel member. The first channel layer includes silicon, germanium, a III-V semiconductor, or a II-VI semiconductor and the second channel layer includes a two-dimensional material. In some embodiments, a dielectric layer is disposed underlying the 2D material layer to provide isolation between the device and the substrate. Furthermore, the source and drain features are formed with semiconductor material by epitaxial growth, which provides better integration to the 2D channel layer and reduces contact resistance.

In one example aspect, the present disclosure provides a method of semiconductor fabrication. The method includes providing a workpiece comprising a semiconductor structure; depositing a two-dimensional (2D) material layer over the semiconductor structure; forming a source feature and a drain feature electrically connected to the semiconductor structure and the 2D material layer, wherein the source feature and drain feature include a semiconductor material; and forming a gate structure over the two-dimensional material layer and interposed between the source feature and the drain feature. The gate structure, the source feature, the drain feature, the semiconductor structure and the 2D material layer are configured to form a field-effect transistor. The semiconductor structure and the 2D material layer function, respectively, as a first channel and a second channel between the source feature and the drain feature.

In one example aspect, the present disclosure provides a method of semiconductor fabrication. The method includes forming a semiconductor stack that includes first semiconductor layers and second semiconductor layers alternatively configured. wherein the first and second semiconductor layers are different in composition; depositing a two-dimensional (2D) material layer on the second semiconductor layers; forming a source feature and a drain feature electrically connected to the second semiconductor layers and the 2D material layer, wherein the source feature and drain feature include a semiconductor material; selectively removing the first semiconductor layers; and forming a gate structure over the two-dimensional material layer and extending to wrap around each of the second semiconductor layers.

In one example aspect, the present disclosure provides a semiconductor structure. The semiconductor device includes a channel member including a first channel layer and a second channel layer over the first channel layer; a gate structure over the channel member; and a source feature and a drain feature of a semiconductor material. The first channel layer includes silicon, germanium, a III-V semiconductor, or a II-VI semiconductor. The two-dimensional material includes graphene, tungsten sulfide ($WS_2$), tungsten telluride ($WTe_2$), tungsten selenide ($WSe_2$), molybdenum sulfide ($MoS_2$), molybdenum telluride ($MoTe_2$), black phosphorus, or molybdenum selenide ($WSe_2$). The second channel layer includes a two-dimensional material. The semiconductor material of the source and drain features electrically connects to the first and second channel layers.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a channel member including a first channel layer and a second channel layer over the first channel layer;
   a dielectric feature inserted between the second channel layer and the first channel layer;
   a gate structure over the channel member; and
   a source feature and a drain feature of a semiconductor material,
   wherein the second channel layer includes a two-dimensional material, and wherein the semiconductor material of the source and drain features electrically connects to the first and second channel layers.

2. The semiconductor device of claim 1, wherein the first channel layer includes silicon, germanium, a III-V semiconductor, or a II-VI semiconductor.

3. The semiconductor device of claim 2, wherein the two-dimensional material includes graphene, tungsten sulfide ($WS_2$), tungsten telluride ($WTe_2$), tungsten selenide ($WSe_2$), molybdenum sulfide ($MoS_2$), molybdenum telluride ($MoTe_2$), black phosphorus, or molybdenum selenide ($MoSe_2$).

4. The semiconductor device of claim 2, wherein
   the gate structure includes a gate stack and a gate spacer layer having a first spacer and a second spacer disposed on opposite sidewalls of the gate stack; and
   the second channel layer spans between the first spacer and the second spacer of the gate spacer layer.

5. A semiconductor device, comprising:
   a plurality of semiconductor layers disposed on a substrate, vertically stacked and distanced from each other;
   a plurality of two-dimensional (2D) material layers disposed on a top surface and a bottom surface of each of the plurality of semiconductor layers, respectively;
   a source feature and a drain feature electrically connected to the each of the plurality of semiconductor layers and each of the plurality of 2D material layers, wherein the source feature and drain feature include a semiconductor material; and a gate structure over the substrate and extending to wrap around the each of the plurality of semiconductor layers and the each of the plurality of 2D material layers.

6. The semiconductor device of claim 5, wherein
the plurality of 2D material layers include portions wrapping around the each of the plurality of semiconductor layers; and
the gate structure wraps each of the portions of the 2D material layer.

7. The semiconductor device of claim 5, wherein
the plurality of 2D material layers include one of graphene, tungsten sulfide ($WS_2$), tungsten telluride ($WTe_2$), tungsten selenide ($WSe_2$), molybdenum sulfide ($MoS_2$), molybdenum telluride ($MoTe_2$), black phosphorus, and molybdenum selenide ($MoSe_2$); and
the plurality of semiconductor layers include one of silicon, germanium, a III-V semiconductor, and a II-VI semiconductor.

8. The semiconductor device of claim 5, wherein the gate structure includes a gate stack and a first and second gate spacers disposed on two sidewalls of the gate stack, wherein the gate stack spans between the first and second gate spacers, and wherein the gate first and second spacers contact a topmost one of the plurality of 2D material layers.

9. The semiconductor device of claim 8, further comprising inner spacers disposed between the source feature and the gate stack, wherein
the inner spacers are underlying the first and second gate spacers and are vertically aligned with the first and second gate spacers, respectively, and
each of the inner spacers vertically spans between adjacent two of the plurality of 2D material layers.

10. A method, comprising:
providing a workpiece having a semiconductor structure;
depositing a two-dimensional (2D) material layer over the semiconductor structure;
patterning the semiconductor structure to form trenches in source/drain regions;
epitaxially growing a semiconductor material to fill in the trenches, thereby forming a source feature and a drain feature, wherein the source feature and the drain feature are electrically connected to the semiconductor structure and the 2D material layer, and wherein the source feature and drain feature include a semiconductor material; and
forming a gate structure over the two-dimensional material layer and interposed between the source feature and the drain feature, wherein the gate structure, the source feature, the drain feature, the semiconductor structure and the 2D material layer are configured to form a field-effect transistor, and wherein the semiconductor structure and the 2D material layer function, respectively, as a first channel and a second channel between the source feature and the drain feature.

11. The method of claim 10, wherein
the semiconductor structure comprises silicon, germanium, a III-V semiconductor, or a II-VI semiconductor; and
the 2D material layer includes one of graphene, tungsten sulfide ($WS_2$), tungsten telluride ($WTe_2$), tungsten selenide ($WSe_2$), molybdenum sulfide ($MoS_2$), molybdenum telluride ($MoTe_2$), black phosphorus, and molybdenum selenide ($MoSe_2$).

12. The method of claim 10, wherein
the patterning of the semiconductor structure further includes patterning the 2D material layer; and
the epitaxially growing of the semiconductor material includes epitaxially growing the semiconductor material in direct contact with edges of the 2D material layer.

13. The method of claim 12, wherein
the gate structure includes a gate stack and a gate spacer layer having a first spacer and a second spacer disposed on opposite sidewalls of the gate stack; and
the patterning of the 2D material layer includes patterning the 2D material layer such that the patterned 2D material layer spans between the first spacer and the second spacer of the gate spacer layer.

14. The method of claim 13, wherein the patterning of the 2D material layer includes patterning the 2D material layer such that opposite edges of the patterned 2D material layer are aligned with outer sides of the first and second spacers, respectively.

15. The method of claim 10, further comprising forming a dielectric feature inserted between the 2D material layer and the semiconductor structure.

16. The method of claim 15, wherein the forming a dielectric feature includes
forming a sacrificial semiconductor layer on the semiconductor structure before the depositing of the 2D material layer; and
replacing the sacrificial semiconductor layer with a dielectric layer through the trenches after the patterning of the semiconductor structure to form the trenches in source/drain regions.

17. The method of claim 16, wherein the replacing the sacrificial semiconductor layer with a dielectric layer includes performing a selective oxidization process to oxidize the sacrificial semiconductor layer to form a semiconductor oxide layer.

18. The method of claim 16, wherein the sacrificial semiconductor layer is a silicon germanium layer.

19. The method of claim 10, wherein the depositing of the 2D material layer includes
forming a dummy gate stack over the semiconductor structure and a gate spacer layer having a first spacer and a second spacer disposed on opposite sidewalls of the dummy gate stack;
removing the dummy gate stack after the forming of the source feature and the drain feature, resulting in a gate trench defined by the first and second spacers, the semiconductor structure is exposed within the gate trench; and
selectively depositing the 2D material layer on the semiconductor structure exposed within the gate trench such that the 2D material layer spans between inner sides of the first and second spacers, respectively.

20. The method of claim 19, wherein the forming of the gate structure includes forming the gate structure on the 2D material layer within the gate trench.

* * * * *